(12) United States Patent
Jang et al.

(10) Patent No.: US 11,514,859 B2
(45) Date of Patent: Nov. 29, 2022

(54) DISPLAY APPARATUS AND MULTI-SCREEN DISPLAY APPARATUS INCLUDING THE SAME

(71) Applicant: LG DISPLAY CO., LTD., Seoul (KR)

(72) Inventors: Youngin Jang, Paju-si (KR); Kyungmin Kim, Paju-si (KR); Hyundong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 42 days.

(21) Appl. No.: 17/138,013

(22) Filed: Dec. 30, 2020

(65) Prior Publication Data
US 2021/0201818 A1 Jul. 1, 2021

(30) Foreign Application Priority Data
Dec. 31, 2019 (KR) .................. 10-2019-0180149

(51) Int. Cl.
*G09G 3/3266* (2016.01)
*H01L 27/12* (2006.01)
*G09G 3/3233* (2016.01)

(52) U.S. Cl.
CPC ......... *G09G 3/3266* (2013.01); *H01L 27/124* (2013.01); *G09G 3/3233* (2013.01); *G09G 2300/026* (2013.01); *G09G 2300/0408* (2013.01); *G09G 2310/0291* (2013.01); *G09G 2330/08* (2013.01)

(58) Field of Classification Search
CPC .... G09F 9/3026; G06F 3/1446; G06F 1/1641; G06F 1/1647; H01L 27/3293; H01L 27/124; G09G 3/3266; G09G 3/2088; G09G 3/3233; G09G 2300/026; G09G 2300/0408; G09G 2300/0426; G09G 2310/0286; G09G 2310/0291; G09G 2330/08

See application file for complete search history.

(56) References Cited

U.S. PATENT DOCUMENTS

| | | | |
|---|---|---|---|
| 2010/0001941 A1* | 1/2010 | Shin ............... | G09G 3/3677 345/98 |
| 2013/0147773 A1* | 6/2013 | Jin ................. | G09G 3/3266 345/204 |
| 2017/0117341 A1* | 4/2017 | Chen ............... | G11C 19/184 |
| 2018/0323180 A1* | 11/2018 | Cok ................ | H01L 23/5386 |
| 2021/0217353 A1* | 7/2021 | Zhao ............... | H01L 27/0296 |

FOREIGN PATENT DOCUMENTS

| | | |
|---|---|---|
| KR | 10-2013-0030598 A | 3/2013 |
| KR | 10-2013-0060476 A | 6/2013 |
| KR | 10-2016-0093179 A | 8/2016 |
| KR | 10-2017-0054654 A | 5/2017 |
| KR | 10-2018-0002099 A | 1/2018 |

* cited by examiner

*Primary Examiner* — Nitin Patel
*Assistant Examiner* — Amen W Bogale
(74) *Attorney, Agent, or Firm* — Birch, Stewart, Kolasch & Birch, LLP

(57) ABSTRACT

A display apparatus and a multi-screen display apparatus including the display apparatus are provided. The display apparatus includes a substrate including a display portion, a plurality of pixels connected to a gate line and a data line disposed in the display portion, and a gate driving circuit disposed in the display portion to drive the gate line. The gate driving circuit includes a stage circuit unit including a plurality of stage circuits respectively disposed in a plurality of division regions defined in the display portion, and a circuit repair portion configured to repair at least one of the plurality of stage circuits.

22 Claims, 19 Drawing Sheets

170: 170e, 170f, 170g

170: 170e, 170f, 170g

DISPLAY APPARATUS AND MULTI-SCREEN DISPLAY APPARATUS INCLUDING THE SAME

CROSS-REFERENCE TO RELATED APPLICATIONS

This application claims the priority benefit of the Korean Patent Application No. 10-2019-0180149 filed on Dec. 31, 2019 in the Republic of Korea, the entire contents of which are hereby expressly incorporated by reference as if fully set forth herein into the present application.

BACKGROUND

Field of the Invention

The present disclosure relates to a display apparatus and a multi-screen display apparatus including the same.

Discussion of the Related Art

Display apparatuses are equipped in home appliances or electronic devices such as televisions (TVs), monitors, notebook computers, smartphones, tablet personal computers (PCs), electronic pads, wearable devices, watch phones, portable information devices, navigation devices, and vehicle control display apparatus, and are used as a screen for displaying an image.

Display apparatuses include a display panel which includes a plurality of pixels each including a thin film transistor (TFT) connected to a data line and a gate line, a data driving circuit which supplies a data voltage to the data line, and a gate driving circuit which supplies a gate signal to the gate line.

Recently, display apparatuses having a gate-in panel (GIP) structure are being used where a gate driving circuit is embedded into a non-display area of a display panel simultaneously with a process of manufacturing a TFT of each pixel, for simplifying a configuration of a circuit element, decreasing the manufacturing cost, and reducing a bezel width.

A gate driving circuit having the GIP structure includes a plurality of stages for supplying a gate signal to a plurality of gate lines. The stages operate dependently on the basis of signals supplied through a plurality of gate shift clock lines and a gate start signal line provided in the display panel.

Because the gate driving circuit having the GIP structure is implemented simultaneously with the process of manufacturing the TFT of each pixel, the gate driving circuit can abnormally operate or may not be driven due to an error or particles occurring in a manufacturing process. Thus, a method of repairing the abnormal operation or non-driving of the gate driving circuit needs to be developed.

Further, multi-screen display apparatuses have been commercialized where a large screen is implemented by arranging a plurality of display apparatuses as a lattice type.

However, in a multi-screen display apparatus of the related art, a boundary portion such as a seam is formed between adjacent display apparatuses due to a bezel area or a bezel of each of a plurality of display apparatuses. The boundary portion can cause a sense of discontinuity (or discontinuity) of an image when one image is being displayed on a total screen of the multi-screen display apparatus, and due to this, the immersion of a viewer watching the image can be reduced.

SUMMARY

Accordingly, the present disclosure is directed to providing a display apparatus and a multi-screen display apparatus including the same that substantially obviate one or more problems due to limitations and disadvantages of the related art.

An aspect of the present disclosure is directed to providing a display apparatus and a multi-screen display apparatus including the same, in which a gate driving circuit provided in a display panel is repaired.

Another aspect of the present disclosure is directed to providing a display apparatus having a thin bezel width and a multi-screen display apparatus including the same.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display portion, a plurality of pixels connected to a gate line and a data line disposed in the display portion, and a gate driving circuit disposed in the display portion to drive the gate line, wherein the gate driving circuit includes a stage circuit unit including a plurality of stage circuits respectively disposed in a plurality of division regions defined in the display portion, and a circuit repair portion configured to repair at least one of the plurality of stage circuits.

In another aspect of the present disclosure, there is provided a multi-screen display apparatus including a plurality of display modules arranged in at least one direction of a first direction and a second direction intersecting with the first direction, wherein each of the plurality of display modules includes a substrate including a display portion, a plurality of pixels connected to a gate line and a data line disposed in the display portion, and a gate driving circuit disposed in the display portion to drive the gate line, wherein the gate driving circuit includes a stage circuit unit including a plurality of stage circuits respectively disposed in a plurality of division regions defined in the display portion, and a circuit repair portion repairing at least one of the plurality of stage circuits.

According to some embodiments of the present disclosure, a display apparatus where a gate driving circuit provided in a display panel is repaired can be provided, and a multi-screen display apparatus including the display apparatus can be provided.

According to some embodiments of the present disclosure, a display apparatus having no bezel and a multi-screen display apparatus including the same can be provided.

According to some embodiments of the present disclosure, a multi-screen display apparatus for displaying an image without a sense of discontinuity can be provided.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are

DETAILED DESCRIPTION OF THE EMBODIMENTS

Figure 1:
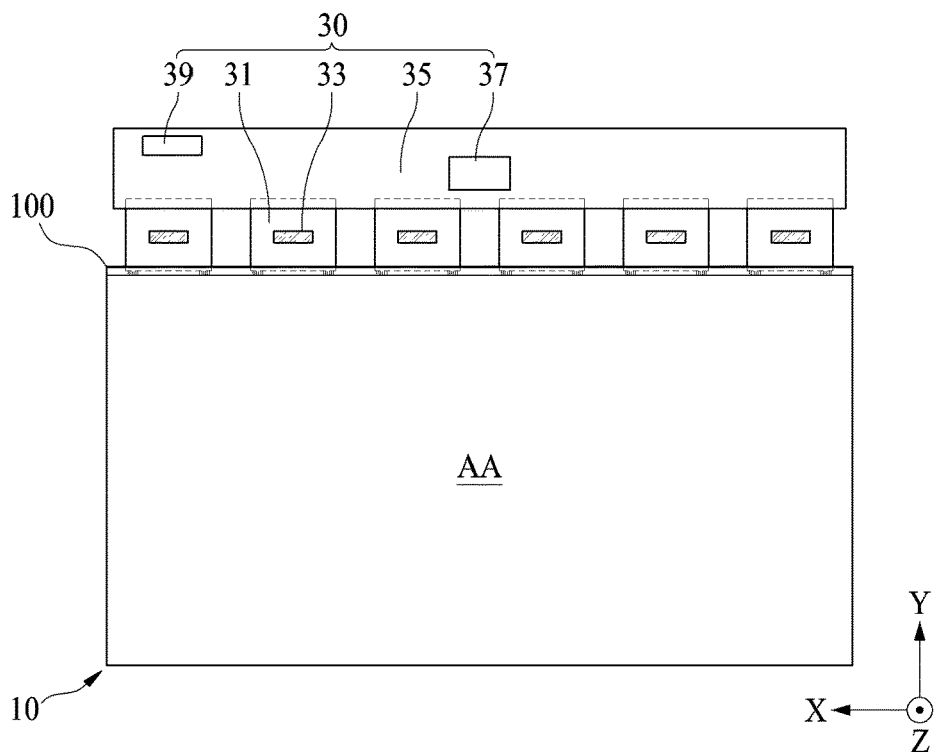
FIG. 1 is a diagram illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or may be brief. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-' and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

Figure 2:
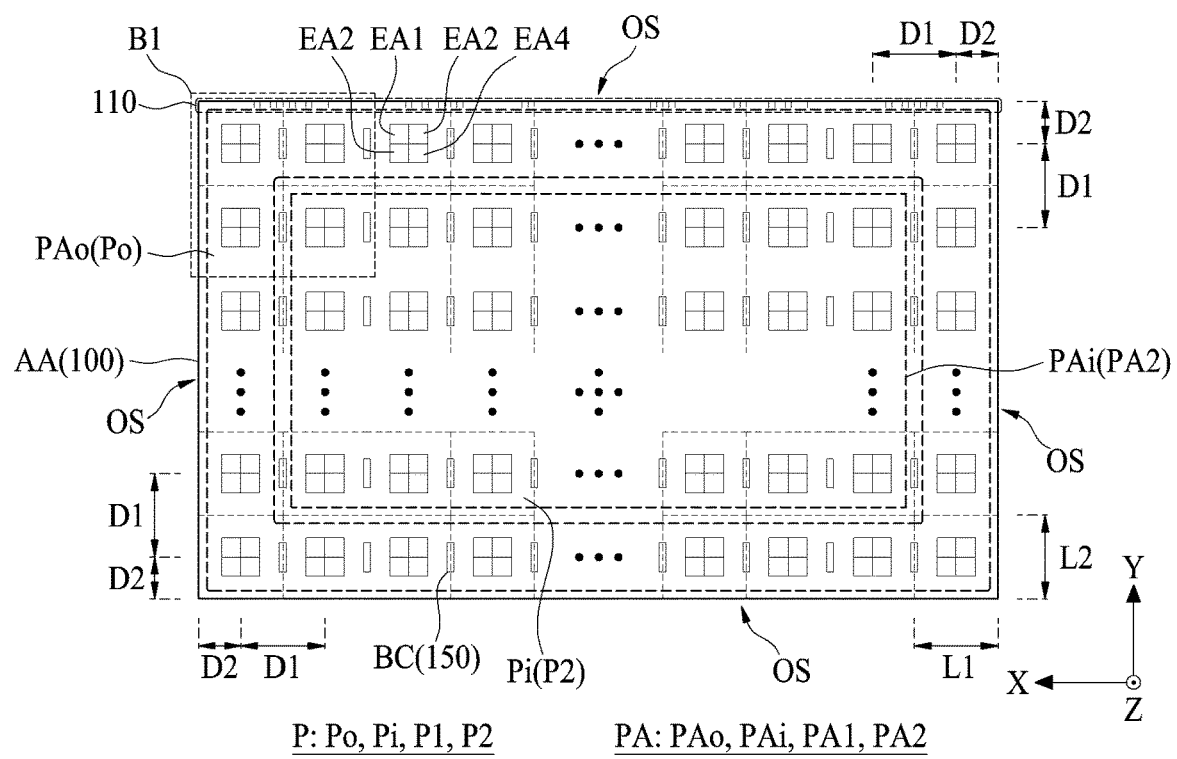
FIG. 2 is a diagram illustrating a display portion illustrated in FIG. 1.

FIG. 1 is a diagram illustrating a display apparatus according to an embodiment of the present disclosure, and FIG. 2 is a diagram illustrating a display portion illustrated in FIG. 1. All the components of the display apparatus according to all embodiments of the present disclosure are operatively coupled and configured.

Referring to FIGS. 1 and 2, the display apparatus according to the embodiment of the present disclosure can include a light emitting display panel 10 and a driving circuit unit 30.

The light emitting display panel 10 can include a substrate 100 including a display area (or active area) AA, a plurality of pixels P arranged at a first interval D1 on the display area AA of the substrate 100, and a gate driving circuit 150 disposed within the display area AA.

The substrate 100 can be referred to as a display substrate, a pixel array substrate, an upper substrate, a front substrate, or a base substrate. The substrate 100 can be a glass substrate, or can be a thin glass substrate or a plastic substrate which is bendable or flexible.

The substrate 100 can include a first surface, a second surface, and an outer surface OS. The first surface of the substrate 100 can be defined as a front surface, a top surface, or an upper surface facing a front surface (or a forward direction) of the display apparatus. The second surface of the substrate 100 can be defined as a back surface, a rear surface, a bottom surface, or a lower surface facing a back surface (or a rearward direction) of the display apparatus. The outer surface OS of the substrate 100 can be defined as a side surface, a lateral surface, or a sidewall, which extends to an outer periphery between the first surface and the second surface, faces the lateral surface (or the lateral direction) of the display apparatus, and is exposed to air. For example, when the substrate 100 has a hexahedral structure, the outer surface OS of the substrate 100 can include side surfaces of the hexahedral structure.

The outer surface OS of the substrate 100 can be formed in parallel with a thickness direction Z of the display apparatus. For example, the outer surface OS of the substrate 100 can include a first outer surface which is parallel to a first direction X, a second outer surface which is parallel to the first outer surface, a third outer surface which is parallel to a second direction Y transverse (or crossing) to the first direction X and is connected between one end of the first outer surface and one end of the second outer surface, and a fourth outer surface which is parallel to the third outer surface and is connected between the other end of the first outer surface and the other end of the second outer surface. The first direction X can be a first lengthwise direction (for example, a widthwise direction) of the substrate 100 or the display apparatus, and the second direction Y can be a second lengthwise direction (for example, a lengthwise direction) of the substrate 100 or the display apparatus.

The display area AA of the substrate 100 can be an area which displays an image and can be referred to as a display portion or an active portion. A size of the display area AA can be the same as or substantially the same as the substrate 100 (or the display apparatus). For example, a size of the display area AA can be the same as a total size of the first surface of the substrate 100. Therefore, the display area AA can be implemented (or disposed) on the whole front surface of the substrate 100, and thus, the substrate 100 may not include an opaque non-display area which is provided along an edge portion of the first surface to surround all of the display area AA. Accordingly, a whole front surface of the display apparatus can implement the display area AA.

An end (or an outermost portion) of the display area AA can overlap or can be substantially aligned with the outer surface OS of the substrate 100. For example, a lateral surface of the display portion AA can be substantially coplanar with the outer surface OS of the substrate 100. In other words, the lateral surface of the display portion AA and the outer surface OS of the substrate 100 can be aligned at substantially the same position. The lateral surface of the display portion AA may not be surrounded by a separate mechanism and can be surrounded by only air. As another example, the lateral surface of the display portion AA can overlap or can be substantially aligned with the outer surface OS of the substrate 100. For example, all lateral surfaces of the display portion AA can be provided in a structure which directly contacts air without being surrounded by a separate mechanism. Therefore, the outer surface OS of the substrate 100 corresponding to the end of the display area AA can be surrounded by air, and thus, the display apparatus according to the present disclosure can have an air-bezel structure or a non-bezel structure where the end of the display area AA (or the lateral surface of the display portion AA) is surrounded by air instead of an opaque non-display area.

The display area (or the display portion) AA according to an embodiment can include a plurality of pixel areas PA.

The plurality of pixel areas PA according to an embodiment can be arranged (or disposed) at the first interval D1 in the display area AA of the substrate 100. Two pixel areas PA adjacent to each other in the first direction X and the second direction Y of the substrate 100 can have the same first interval D1 without an error range of a manufacturing process. The first interval D1 can be a pitch (or a pixel pitch) between two adjacent pixel areas PA. For example, the first interval D1 can be a shortest distance (or a shortest length) between center portions of two adjacent pixel areas PA. Optionally, the pixel pitch can be a size between one end and the other end of a pixel area PA parallel to the first direction X. Also, as another example, the pixel pitch can be referred to as a size between one end and the other end of a pixel area PA parallel to the second direction Y.

Each of the plurality of pixel areas PA can have a first length L1 parallel to the first direction X and a second length L2 parallel to the second direction Y. Each of the first length L1 and the second length L2 can be the same as the first interval D1. For example, the first length L1 can be referred to as a first width, a widthwise length, or a widthwise width. The second length L2 can be referred to as a second width, a lengthwise length, or a lengthwise width. The first length L1 or the second length L2 of the pixel area PA can be referred to as a pixel pitch.

A second interval D2 between each of outermost pixel areas PAo of the plurality of pixel areas PA and the outer surface OS of the substrate 100 can be half or less of the first interval D1 so that the whole front surface of the substrate 100 (or the whole front surface of the display apparatus) is referred to as a display area AA. For example, the second interval D2 can be a shortest distance (or a shortest length) between a center portion of the outermost pixel area PAo and the outer surface OS of the substrate 100.

When the second interval D2 is greater than half of the first interval D1, the substrate 100 can have a greater size than that of the display area AA by an area between an end of the outermost pixel area PAo (or the end of the display area AA) and the outer surface OS of the substrate 100, and thus, an area between the end of the outermost pixel area PAo and the outer surface OS of the substrate 100 can be provided as a non-display area surrounding all of the display area AA. Therefore, the substrate 100 can necessarily include a bezel area based on a non-display area surrounding all of the display area AA. On the other hand, when the second interval D2 is half or less of the first interval D1, the end of the outermost pixel area PAo (or the end of the display area AA) can overlap the outer surface OS of the substrate 100 or can be disposed in a space outside the outer surface OS of the substrate 100, and thus, the display area AA can be implemented (or disposed) on the whole front surface of the substrate 100.

The display area (or the display portion) AA according to an embodiment can include the outermost pixel area PAo and an internal pixel area (or an inner pixel area) PAi.

The outermost pixel area PAo can be disposed along an edge portion (or a periphery portion) of the substrate 100 among the plurality of pixel areas PA. For example, the outermost pixel area PAo can be referred to as a first pixel area PA1.

The internal pixel area PAi can be a pixel area other than the outermost pixel area PAo among the plurality of pixel areas PA, or can be surrounded by the outermost pixel area PAo. The internal pixel area PAi can be referred to as a second pixel area PA2.

Each of a plurality of pixels P can be disposed in a corresponding pixel area PA of the plurality of pixel areas PA defined on the first surface of the substrate 100. For example, the display area AA can be a pixel array which includes the plurality of pixels P arranged on the substrate 100. The pixels P of the pixel array can be immediately adjacent to one another in the first direction X and the second direction Y. For example, the pixels P of the pixel array can be immediately adjacent to one another in the first direction X and the second direction Y without a separation space (or a spaced apart space). As another example, a plurality of outermost pixels Po of the pixel array can match to overlap one another on the outer surface of the substrate 100, or can be aligned on the same plane. For example, each pixel P of the pixel array can be arranged on the substrate 100 to have a pixel pitch D1 in the first direction X and the second direction Y, and an interval D2 between a center portion of each of the outermost pixels Po and the outer surface OS of the substrate 100 can be half or less of the pixel pitch D1.

The display area (or the display portion) AA according to an embodiment can include an outermost pixel Po and an internal pixel (or an inner pixel) Pi.

The outermost pixel Po can be disposed at the edge portion (or a periphery portion) of the substrate 100 among the plurality of pixel areas PA. For example, the outermost pixel Po can be referred to as a first pixel P1 disposed in the outermost pixel area PAo.

The internal pixel Pi can be a pixel other than the outermost pixel Po among the plurality of pixels P, or can be disposed to be surrounded by the outermost pixel Po. For example, the internal pixel Pi can be referred to as a second pixel P2. The internal pixel Pi (or the second pixel P2) can be implemented to have a configuration or a structure, which differs from the outermost pixel Po (or the first pixel P1).

The second interval D2 between each of the outermost pixels Po of the plurality of pixels P and the outermost surface OS of the substrate 100 can be half or less of the first interval D1 so that the whole front surface of the substrate 100 (or the whole front surface of the display apparatus) is referred to as the display area AA. The first interval D1 can be a shortest distance (or a shortest length) between center portions of two adjacent pixels P. The second interval D2 can be a shortest distance (or a shortest length) between a center portion of the outermost pixel P and the outermost surface OS of the substrate 100.

Each of the plurality of pixels P according to an embodiment can include first to fourth emission areas EA1 to EA4. For example, the first to fourth emission areas EA1 to EA4 can be immediately adjacent to one another in the first direction X and the second direction Y. For example, the first to fourth emission areas EA1 to EA4 can be directly contact to one another in the first direction X and the second direction Y without a separation space (or a spaced apart space).

The first to fourth emission areas EA1 to EA4 can each have a square shape and can be disposed in a 2×2 form or a quad form. According to another embodiment, the first to fourth emission areas EA1 to EA4 can each have a rectangular shape which includes a short side parallel to the first direction X and a long side parallel to the second direction Y, and for example, can be disposed a 1×4 form or a 1×4 stripe form.

The first emission area EA1 can be implemented to emit light of a first color, the second emission area EA2 can be implemented to emit light of a second color, the third emission area EA3 can be implemented to emit light of a third color, and the fourth emission area EA4 can be implemented to emit light of a fourth color. For example, each of the first to fourth colors can be different. For example, the first color can be red, the second color can be blue, the third color can be white, and the fourth color can be green. As another example, some of the first to fourth colors can be the same. For example, the first color can be red, the second color can be first green, the third color can be second green, and the fourth color can be blue.

Each of the first to fourth emission areas EA1 to EA4 according to an embodiment can be disposed close to a center portion of the pixel P to have a size which is less than that of each of four equal division regions of the pixel P. Each of the first to fourth emission areas EA1 to EA4 according to an embodiment can be disposed in all of four equal division regions having the same size as that of each of the four equal division regions of the pixel P.

Each of the plurality of pixels P according to another embodiment can include first to third emission areas EA1 to EA3. In this case, the first to third emission areas EA1 to EA3 can each have a rectangular shape which includes a short side parallel to the first direction X and a long side parallel to the second direction Y, and for example, can be disposed a 1×3 form or a 1×3 stripe form. For example, the first color can be red, the second color can be blue, and the third color can be green.

The gate driving circuit 150 can be disposed within the display area AA to supply a scan signal (or a gate signal) to the pixels P disposed on the substrate 100. The gate driving circuit 150 can simultaneously supply the scan signal to pixels P disposed in a horizontal line parallel to the first direction X. For example, the gate driving circuit 150 can supply at least one scan signal to pixels P disposed in one horizontal line through at least one gate line GL.

The gate driving circuit 150 according to an embodiment can be implemented with a shift register including a plurality of stage circuit units. For example, the display apparatus according to the present disclosure can include a shift register which is disposed within the display area AA of the substrate 100 to supply the scan signal to the pixel P.

Each of the plurality of stage circuit units can include a plurality of branch circuits BC which are disposed apart from one another in each horizontal line of the substrate 100 along the first direction X. The plurality of branch circuits BC can include at least one TFT (or a branch TFT) and can be disposed one by one between at least one pixels P (or pixel areas PA) within one horizontal line along the first direction X. Each of the plurality of stage circuit units can generate a scan signal according to driving of the plurality of branch circuits BC which responds to a gate control signal supplied from the driving circuit unit 30 through the gate control line group separately disposed (or distributedly disposed) between a plurality of pixels P in the display area AA and can supply the scan signal to pixels disposed in a corresponding horizontal line.

The light emitting display panel 10 according to an embodiment can further include a pad part 110 including a plurality of pads which are disposed in the display area AA of the substrate 100 and are connected to each of the plurality of pixels P and the gate control line group. For example, the pad part 110 can be a first pad part or a front pad part. The pad part 110 can receive a data signal, a gate control signal, a pixel driving power, and a pixel common power from the driving circuit unit 30.

The pad part 110 can be included in the outmost pixels Po disposed at a first edge portion of the first surface of the first substrate 100 parallel to the first direction X. For example, the outermost pixels Po disposed at the first edge portion of the substrate 100 can include at least one of the plurality of pads. Therefore, the plurality of pads can be disposed or included within the display area AA, and thus, a non-display area (or a bezel area) based on the pad part 110 may not be formed or may not be on the substrate 100. Therefore, the outermost pixel Po (or the first pixel P1) can include the pad part 110, and thus, can be implemented to have a configuration or a structure, which differs from the internal pixel Pi (or the second pixel P2) including no pad part 110.

For example, when the pad part 110 is not provided within the outermost pixels Po and is disposed between the outermost pixels Po and the outer surface OS of the substrate 100, the substrate 100 can include a non-display area (or a non-display portion) corresponding to an area where the pad part 110 is provided, and due to the non-display area, the second interval D2 between the outermost pixels Po and the outer surface OS of the substrate 100 can be greater than half of the first interval D1, all of the substrate 100 cannot be implemented as the display area AA, and a separate bezel (or a separate structure) for covering the non-display area can be needed. On the other hand, the pad part 110 according to the present disclosure can be disposed between the emission areas EA1 to EA4 of the outermost pixels Po and the outer surface OS of the substrate 100 and can be included within the outermost pixels Po, and thus, a non-display area (or a bezel area) based on the pad part 110 may not be formed or may not be between the outermost pixels Po and the outer surface OS of the substrate 100.

The driving circuit unit 30 can be connected to the pad part 110 which is disposed at one edge portion of the substrate 100 and can allow each pixel P to display an image corresponding to video data supplied from a display driving system.

The driving circuit unit 30 according to an embodiment can include a plurality of flexible circuit films 31, a plurality of driving integrated circuits (ICs) 33, a printed circuit board (PCB) 35, a timing controller 37, and a power circuit unit 39.

Each of the plurality of flexible circuit films 31 can be attached on the PCB 35 and the pad part 110 provided on the substrate 100. The flexible circuit film 31 according to an embodiment can be a tape carrier package (TCP) or a chip-on film (COF). For example, one edge portion (or an output bonding portion) of each of the plurality of flexible circuit films 31 can be attached on the pad part 110 provided on the substrate 100 by a film attachment process using an anisotropic conductive film. The other edge portion (or an input bonding portion) of each of the plurality of flexible circuit films 31 can be attached on the PCB 35 by a film attachment process using an anisotropic conductive film.

Each of the plurality of driving ICs 33 can be individually mounted on a corresponding flexible circuit film 31 of the plurality of flexible circuit films 31. Each of the plurality of driving ICs 33 can receive pixel data and a data control signal provided from the timing controller 37, convert the pixel data into a pixel-based analog data voltage according to a data control signal, and supply the analog data voltage to a corresponding pixel P. For example, each of the plurality of driving ICs 33 can generate a plurality of grayscale voltages by using a plurality of reference gamma voltages provided from the PCB 35 and can select, as a pixel-based data voltage, a grayscale voltage corresponding to pixel data from among the plurality of grayscale voltages to output the selected data voltage.

Additionally, each of the plurality of driving ICs 33 can generate a pixel common voltage (or a cathode voltage) and a pixel driving voltage (or an anode voltage) needed for driving (or light emitting) of the pixels P by using the plurality of reference gamma voltages. For example, each of the plurality of driving ICs 33 can select, as a pixel driving voltage and a pixel common voltage, a predetermined reference gamma voltage or a predetermined grayscale voltage from among the plurality of reference gamma voltages or the plurality of grayscale voltages to output the pixel driving voltage and the pixel common voltage.

Moreover, each of the plurality of driving ICs 33 can additionally generate and output a reference voltage on the basis of a driving (or operating) method of each pixel P. For example, each of the plurality of driving ICs 33 can select, as a reference voltage, a predetermined reference gamma voltage or a predetermined grayscale voltage from among the plurality of reference gamma voltages or the plurality of gray scale voltages to output the reference voltage. For example, the pixel driving voltage, the pixel common voltage, and the reference voltage can have different voltage levels.

Each of the plurality of driving ICs 33 can sequentially sense a characteristic value of a driving TFT included in the pixel P through the plurality of reference power lines disposed on the substrate 100, generate sensing raw data corresponding to a sensing value, and provide the sensing raw data to the timing controller 37.

The PCB 35 can be connected to the other edge portion of each of the plurality of flexible circuit films 31. The PCB 35 can transfer a signal and a voltage between elements of the driving circuit unit 30.

The timing controller 37 can be mounted on the PCB 35 and can receive image data and a timing synchronization signal provided from the display driving system through a user connector disposed on the PCB 35. Alternatively, the timing controller 37 may not be mounted on the PCB 35 and can be provided in the display driving system or can be mounted on a separate control board connected between the PCB 35 and the display driving system.

The timing controller 37 can align the video data on the basis of the timing synchronization signal so as to match a pixel arrangement structure disposed in the display area AA and can provide the generated pixel data to each of the plurality of driving ICs 33.

According to an embodiment, when the pixel P includes a white subpixel, the timing controller 37 can extract white pixel data on the basis of the digital video data (i.e., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to each of the driving ICs 33. For example, the timing controller 37 can convert red, green, and blue input data into four-color (for example, red, green, blue, and white) data on the basis of a data conversion method disclosed in Korean Patent Publication Nos. 10-2013-0060476 or 10-2013-0030598, all of these publications being incorporated by reference into the present application.

The timing controller 37 can generate each of the data control signal and the gate control signal on the basis of the timing synchronization signal, control a driving timing of each of the driving ICs 33 on the basis of the data control signal, and control a driving timing of the gate driving circuit 150 on the basis of the gate control signal. For example, the timing synchronization signal can include a vertical synchronization signal, a horizontal synchronization signal, a data enable signal, and a main clock (or a dot clock).

The data control signal according to an embodiment can include a source start pulse, a source shift clock, and a source output signal. The gate control signal according to an embodiment can include a gate start signal (or a gate start pulse) and a plurality of shift clocks.

The timing controller 37 can drive each of the driving ICs 33 and the gate driving circuit 150 on the basis of an external sensing mode during a predetermined external sensing period, generate compensation data for compensating for a characteristic variation of the driving TFT of each pixel P on the basis of the sensing raw data provided from the driving ICs 33, and modulate pixel data on the basis of the generated compensation data. For example, the timing controller 37 can drive each of the driving ICs 33 and the gate driving circuit 150 on the basis of the external sensing mode for each external sensing period corresponding to a blank period (or a vertical blank period) of the vertical synchronization signal. For example, the external sensing mode can be performed in a process of powering on the display apparatus, a process of powering off the display apparatus, a process of powering off the display apparatus after being driven for a long time, or a blank period of a frame which is set in real time or periodically.

The timing controller 37 according to an embodiment can store the sensing raw data of each subpixel, provided from the driving ICs 33, in a storage circuit on the basis of the external sensing mode. Also, in a display mode, the timing controller 37 can correct pixel data which is to be supplied to each subpixel, based on the sensing raw data stored in the storage circuit and can provide corrected pixel data to the driving ICs 33. Here, sensing raw data of each subpixel can include characteristic variation information about each of a driving TFT and a light emitting device, which are disposed in a corresponding subpixel. Therefore, in the external sensing mode, the timing controller 37 can sense a characteristic value (for example, a threshold voltage or mobility) of a driving TFT disposed in each subpixel and based thereon, can correct pixel data which is to be supplied to each subpixel, thereby minimizing or preventing the degradation in image quality caused by a characteristic value deviation of driving TFTs of a plurality of subpixels. The external sensing mode of a display apparatus can be technology known to those skilled in the art, and thus, its detailed description is omitted or may be brief. For example, the display apparatus according to the present disclosure can sense a characteristic value of the driving TFT disposed in each subpixel on the basis of a sensing mode disclosed in Korean Patent Publication Nos. 10-2016-0093179, 10-2017-0054654, or 10-2018-0002099, all of these publications being incorporated by reference into the present application.

The power circuit unit 39 can be mounted on the PCB 35 and can generate various source voltages needed for displaying an image on the pixels P by using an input power supplied from the outside to provide the generated source voltage to a corresponding circuit. For example, the power circuit unit 39 can generate and output a logic source voltage needed for driving of each of the timing controller 37 and the driving ICs 33, the plurality of reference gamma voltages provided to the driving ICs 33, and at least one gate driving power and at least one gate common power needed for driving of the gate driving circuit 150. The gate driving power and the gate common power can have different voltage levels.

Figure 3:
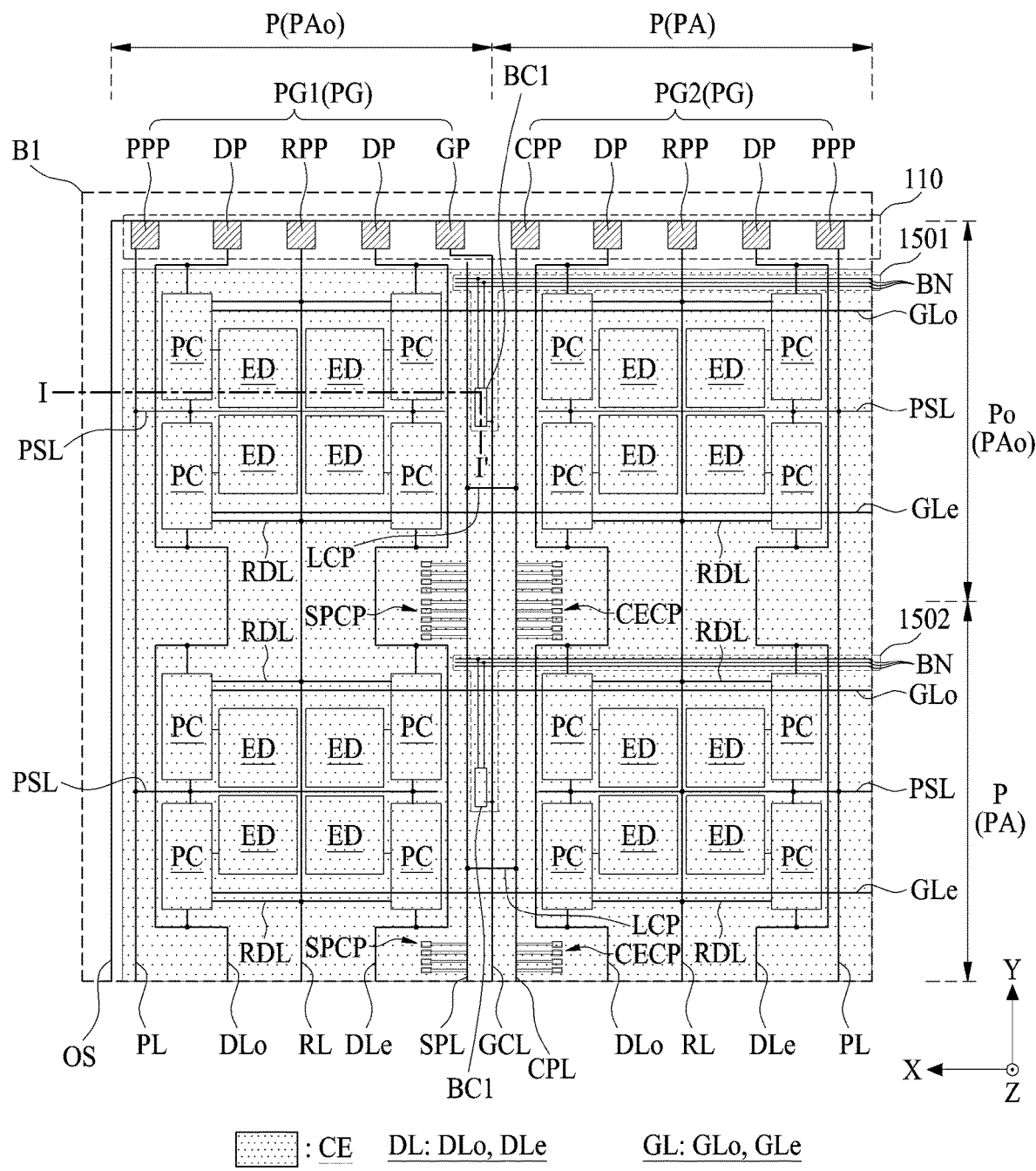
FIG. 3 is an enlarged view of a region 'B1' illustrated in FIG. 2.
Figure 4:
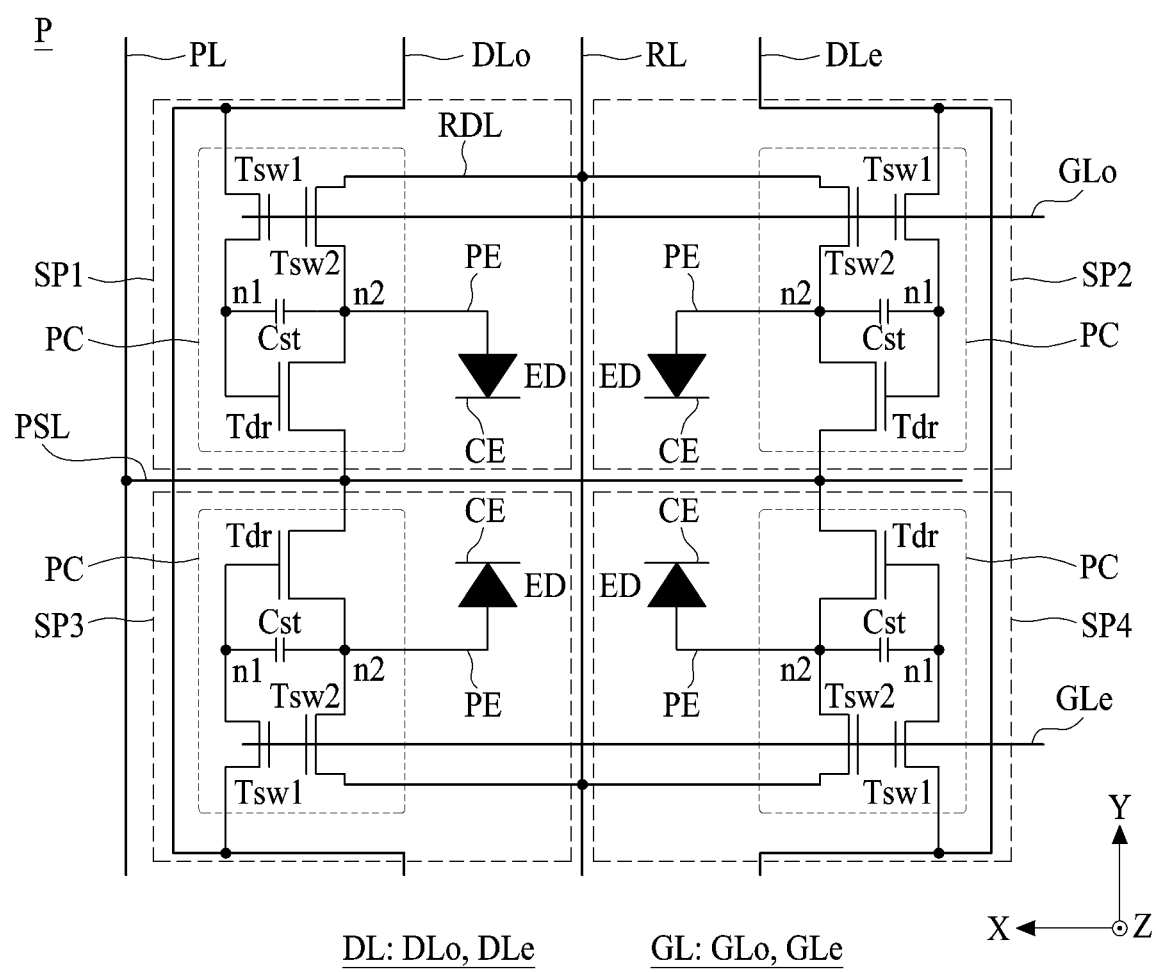
FIG. 4 is a circuit diagram illustrating an example of one pixel illustrated in FIG. 3.

FIG. 3 is an enlarged view of a region 'B1' illustrated in FIG. 2, and FIG. 4 is a circuit diagram illustrating one pixel illustrated in FIG. 3. FIGS. 3 and 4 are diagrams for describing pixels disposed on a substrate.

Referring to FIGS. 2 to 4, a substrate (or a display portion) 100 according to an embodiment of the present disclosure can include a plurality of gate lines GL, a plurality of data lines DL, a plurality of pixel driving power lines PL, a plurality of pixel common power lines CPL, a plurality of pixels P, a common electrode CE, a plurality of common electrode contact portions CECP, and a pad part 110.

The plurality of gate lines GL can extend long in the first direction X and can be disposed apart from one another by a predetermined interval in the display area AA of the substrate 100 along the second direction Y. For example, an odd-numbered gate line GLo among the plurality of gate lines GL can be disposed at a third edge portion of each of the plurality of pixel areas PA arranged on the substrate 100 along the first direction X. An even-numbered gate line GLe among the plurality of gate lines GL can be disposed at a fourth edge portion of each of the plurality of pixel areas PA arranged on the substrate 100 along the first direction X.

The plurality of data lines DL can extend long in a second direction Y and can be disposed apart from one another by a predetermined interval in a display area AA of the substrate 100 along the first direction X. For example, in the plurality of data lines DL, an odd-numbered data line DLo can be disposed at a first edge portion of each of a plurality of pixel areas PA arranged on the substrate 100 along the second direction Y, and an even-numbered data line DLe can be disposed at a second edge portion of each of the plurality of pixel areas PA arranged on the substrate 100 along the second direction Y.

The plurality of pixel driving power lines PL can extend long in the second direction Y and can be disposed apart from one another by a predetermined interval in the display area AA of the substrate 100 along the first direction X. For example, in the plurality of pixel driving power lines PL, an odd-numbered pixel driving power line PL can be disposed at a first edge portion of an odd-numbered pixel area PA with respect to the first direction X, and an even-numbered pixel driving power line PL can be disposed at a second edge portion of an even-numbered pixel area PA with respect to the first direction X.

Two adjacent pixel driving power lines PL among the plurality of pixel driving power lines PL can be connected to a plurality of power sharing lines PSL disposed in a plurality of pixel areas PA. For example, the plurality of pixel driving power lines PL can be electrically connected to one another by the plurality of power sharing lines PSL, and thus, can have a ladder structure or a mesh structure. The plurality of pixel driving power lines PL can have a ladder structure or a mesh structure, and thus, the voltage drop (IR drop) of the pixel driving power caused by a line resistance of each of the plurality of pixel driving power lines PL can be prevented or minimized. Accordingly, the display apparatus according to the present disclosure can prevent or minimize the degradation in image quality caused by a deviation of the pixel driving power supplied to each of the pixels P.

Each of the plurality of power sharing lines PSL can branch from an adjacent pixel driving power line PL in parallel with the first direction X and can be disposed in a middle region of each pixel area PA.

The plurality of pixel common power lines CPL can extend long in the second direction Y and can be disposed apart from one another by a predetermined interval in the display area AA of the substrate 100 along the first direction X. For example, each of the plurality of pixel common power lines CPL can be disposed at a first edge portion of an even-numbered pixel area PA with respect to the first direction X.

A plurality of pixels P can be respectively disposed in the plurality of pixel areas PA which is defined to have an equal size in the display area AA of the substrate 100.

Each of the plurality of pixels P can include at least three subpixels. For example, each of the plurality of pixels P can include first to fourth subpixels SP1 to SP4.

The first subpixel SP1 can be disposed in a first subpixel area of the pixel area PA, the second subpixel SP2 can be disposed in a second subpixel area of the pixel area PA, the third subpixel SP3 can be disposed in a third subpixel area of the pixel area PA, and the fourth subpixel SP4 can be disposed in a fourth subpixel area of the pixel area PA. For example, with respect to the central portion of the pixel P, the first subpixel SP1 can be a left upper area of the pixel area PA, the second subpixel SP2 can be a right upper area of the pixel area PA, the third subpixel SP3 can be a left lower area of the pixel area PA, and the fourth subpixel SP4 can be a right lower area of the pixel area PA.

Each of the first to fourth subpixels SP1 to SP4 can respectively include a plurality of emission areas EA1 to EA4 and a circuit area.

The emission areas EA1 to EA4 of each of the first to fourth subpixels SP1 to SP4 can have the same size in a corresponding pixel P or pixel area PA. For example, the emission areas EA1 to EA4 of each of the first to fourth subpixels SP1 to SP4 can have a uniform quad structure or a non-uniform stripe structure. For example, the emission areas EA1 to EA4 of each of the first to fourth subpixels SP1 to SP4 can be implemented to have the same size around (or near) the central portion of the pixel P.

Each of the first to fourth subpixels SP1 to SP4 can include a pixel circuit PC and a light emitting device ED.

The pixel circuit PC according to an embodiment can be disposed in a circuit area CA of the pixel area PA and can be connected to gate lines GLo and GLe adjacent thereto, data lines DLo and DLe adjacent thereto, and the pixel driving power line PL. For example, a pixel circuit PC disposed in a first subpixel SP1 can be connected to an odd-numbered data line DLo and an odd-numbered gate line GLo, a pixel circuit PC disposed in a second subpixel SP2 can be connected to an even-numbered data line DLe and an odd-numbered gate line GLo, a pixel circuit PC disposed in a third subpixel SP3 can be connected to an odd-numbered data line DLo and an even-numbered gate line GLe, and a pixel circuit PC disposed in a fourth subpixel SP4 can be connected to an even-numbered data line DLe and an even-numbered gate line GLe.

The pixel circuit PC of each of the first to fourth subpixels SP1 to SP4 can sample a data signal supplied from corresponding data lines DLo and DLe in response to a scan signal supplied from corresponding gate lines GLo and GLe and can control a current flowing from the pixel driving power line PL to the light emitting device ED on the basis of a sampled data signal.

The light emitting device ED can be disposed in an emission area EA of the pixel area PA, electrically connected to the pixel circuit PC, and electrically connected to the common electrode CE. The light emitting device ED can emit light with a current flowing from the pixel circuit PC to the common electrode CE.

The common electrode CE can be disposed in a display area AA of the substrate 100 and can be electrically connected to the light emitting device ED of each of the plurality of pixels P. For example, the common electrode CE can be disposed in a region, other than a pad part 110 disposed in the substrate 100, of the display area AA of the substrate 100.

Each of the plurality of common electrode contact portions CECP can be disposed between two adjacent pixels P of the plurality of pixels P, can be respectively overlapping the plurality of pixel common power lines CPL and can electrically connect the common electrode CE to a corresponding pixel common power line CPL of the plurality of pixel common power lines CPL. With respect to the second direction Y, each of the plurality of common electrode contact portions CECP according to an embodiment can be electrically connected to a corresponding pixel common power line CPL among the plurality of pixel common power lines CPL at a portion between the plurality of pixels P or at a boundary portion between the plurality of pixels P and can be electrically connected to a portion of the common electrode CE, and thus, can electrically connect the common electrode CE to each of the plurality of pixel common power lines CPL.

Each of the plurality of common electrode contact portions CECP can be disposed between two adjacent pixels P of the plurality of pixels P to electrically connect the common electrode CE to each of the plurality of pixel common power lines CPL, and thus, can prevent or minimize the voltage drop (IR drop) of the pixel common power caused by a surface resistance of the common electrode CE. Accordingly, the display apparatus according to the present disclosure can prevent or minimize the degradation in image quality caused by a deviation of the pixel common power supplied to each of the pixels P arranged in the display area AA.

According to an embodiment, each of the plurality of common electrode contact portions CECP can be formed along with a pixel electrode PE having a three-layer structure so as to be electrically connected to each of the plurality of pixel common power lines CPL. Each of the plurality of common electrode contact portions CECP can be connected to the common electrode CE through a side contact structure having a "("-shaped cross-sectional structure or a "<"-shaped cross-sectional structure. For example, when each of the plurality of common electrode contact portions CECP is formed of first to third metal layers, each of the plurality of common electrode contact portions CECP can include a side contact structure corresponding to an undercut structure or a tapered structure formed on the lateral surface of the first metal layer and the second metal layer by an etching speed difference between the first metal layer and the second metal layer. For example, when each of the plurality of common electrode contact portions CECP is formed of first to fourth metal layers, each of the plurality of common electrode contact portions CECP can include a side contact structure corresponding to an undercut structure or a tapered structure formed on the lateral surface of the second metal layer and the third metal layer by an etching speed difference between the second metal layer and the third metal layer.

The pad part 110 can be disposed at a first edge portion among the first surface of the substrate 100 parallel to the first direction X. The pad part 110 can be disposed at a third edge portion of each of outermost pixel areas PAo disposed at the first edge portion of the substrate 100. With respect to the second direction Y, an end of the pad part 110 can overlap or can be aligned with an end of each of the outermost pixel areas PAo. Therefore, the pad part 110 can be included (or disposed) in each of the outermost pixel areas PAo disposed at the first edge portion of the substrate 100, and thus, a non-display area (or a bezel area) based on the pad part 110 may not be formed or may not be on in the substrate 100.

The pad part 110 can include a plurality of first pads which are disposed in parallel with one another in the first direction X on the first edge portion of the substrate 100.

The pad part 110 according to an embodiment can include a plurality of pad groups PG which are arranged in the order of a pixel driving power pad PPP, two data pads DP, a gate pad GP, a pixel common power pad CPP, two data pads DP, and a pixel driving power pad PPP along the first direction X.

Each of the plurality of pad groups PG can be connected to two adjacent pixels P disposed along the first direction X. For example, the plurality of pad groups PG can include a first pad group PG1, including one pixel driving power pad PPP, two data pads DP, and one gate pad GP continuously disposed in an odd-numbered pixel area PA along the first direction X, and a second pad group PG2 including one pixel common power pad CPP, two data pads DP, and one pixel driving power pad PPP continuously disposed in an even-numbered pixel area PA along the first direction X.

The substrate 100 according to the present disclosure can further include a plurality of secondary power lines SPL and a plurality of secondary power contact portions SPCP.

Each of the plurality of secondary power lines SPL can extend long in the second direction Y and can be disposed adjacent to a corresponding pixel common power line CPL of the plurality of pixel common power lines CPL. Each of the plurality of secondary power lines SPL can be electrically connected to an adjacent pixel common power line CPL without being electrically connected to the pixel common power pad CPP and can be supplied with a pixel common power through the adjacent pixel common power line CPL. To this end, the substrate 100 according to the present disclosure can further include a plurality of line connection patterns LCP which electrically connect a pixel common power line CPL and a secondary power line SPL adjacent to each other.

Each of the plurality of line connection patterns LCP can be disposed on the substrate 100 so that a pixel common power line CPL and a secondary power line SPL adjacent to each other intersect with each other and can electrically connect a pixel common power line CPL and a secondary power line SPL adjacent to each other by using a line jumping structure. For example, one side of each of the plurality of line connection patterns LCP can be electrically connected to a portion of the secondary power line SPL through a first line contact hole formed in an insulation layer on the secondary power line SPL, and the other side of each of the plurality of line connection patterns LCP can be electrically connected to a portion of the pixel common power line CPL through a second line contact hole formed in an insulation layer on the pixel common power line CPL.

Each of the plurality of secondary power contact portions SPCP can be disposed between the plurality of pixels P respectively overlapping the plurality of secondary power lines SPL and can electrically connect the common electrode CE to each of the plurality of secondary power lines SPL. With respect to the second direction Y, each of the plurality of secondary power contact portions SPCP according to an embodiment can be electrically connected to each of the plurality of secondary power lines SPL at a portion between the plurality of pixels P or a boundary portion between the plurality of pixels P and can be electrically connected to a portion of the common electrode CE, and thus, can electrically connect the common electrode CE to each of the plurality of secondary power lines SPL. Therefore, the common electrode CE can be additionally connected to each of the plurality of secondary power lines SPL through the secondary power contact portions SPCP. Accordingly, the display apparatus according to the present disclosure can prevent or minimize the degradation in image quality caused by a deviation of the pixel common power supplied to each of the pixels P arranged in the display area AA. Also, in the display apparatus according to the present disclosure, although the pixel common power pad CPP connected to each of the plurality of secondary power lines SPL is not additionally disposed (or formed), the pixel common power can be supplied to the common electrode CE in each of the plurality of pixel areas PA.

Each of the plurality of secondary power contact portions SPCP can electrically connect a corresponding secondary power line of the plurality of secondary power lines SPL to the common electrode CE through a side contact structure having a side contact structure having a "("-shaped cross-sectional structure or a "<"-shaped cross-sectional structure, like each of the plurality of common electrode contact portions CECP.

The display apparatus according to the present disclosure can further include a plurality of reference power lines RL.

The plurality of reference power lines RL can extend long in the second direction Y and can be disposed apart from one another by a predetermined interval in the display area AA of the substrate 100 in the first direction X. Each of the plurality of reference power lines RL can be disposed in a center region of each of the pixel areas PA. For example, each of the plurality of reference power lines RL can be disposed between an odd-numbered data line DLo and an even-numbered data line DLe in each pixel area PA.

Each of the plurality of reference power lines RL can be shared by two adjacent subpixels ((SP1, SP2) (SP3, SP4)) in the first direction X in each pixel area PA. To this end, each of the plurality of reference power lines RL can include a reference branch line RDL.

The reference branch line RDL can branch (or protrude) to the two adjacent subpixels ((SP1, SP2) (SP3, SP4)) in the first direction X in each pixel area PA and can be electrically connected to the two adjacent subpixels ((SP1, SP2) (SP3, SP4)).

The pad part 110 according to the present disclosure can further include a plurality of reference power pads RPP. Each of the plurality of reference power pads RPP can be individually (or respectively) connected to one end of a corresponding reference power line RL of the plurality of reference power lines RL. For example, each of the plurality of reference power pads RPP can be disposed between two data pads DP disposed in each of a plurality of outermost pixel areas PAo, but is not limited thereto.

Optionally, the plurality of reference power lines RL, the plurality of reference power pads RPP, and the reference branch line RDL can each be omitted based on a circuit configuration of the pixel circuit PC.

Referring to FIG. 4, the pixel circuit PC disposed in each of the first to fourth subpixels SP1 to SP4 of the pixel P can be disposed in a circuit area and can be connected to adjacent gate lines GLo and GLe, adjacent data lines DLo and DLe, a reference power line RL, and a pixel driving power line PL. The pixel circuit PC can provide the light emitting device ED with a data current corresponding to a difference voltage between a data signal supplied through the adjacent data lines DLo and DLe and a reference voltage supplied through the reference power line RL in response to a scan signal supplied through the adjacent gate lines GLo and GLe, thereby allowing the light emitting device ED to emit light.

The pixel circuit PC according to an embodiment can include a first switching TFT Tsw1, a second switching TFT Tsw2, a storage capacitor Cst, and a driving TFT Tdr. In the following description, a thin film transistor can be referred to as a TFT.

At least one of the first switching TFT Tsw1, the second switching TFT Tsw2, and the driving TFT Tdr can be an N-type or P-type TFT. At least one of the first switching TFT Tsw1, the second switching TFT Tsw2, and the driving TFT Tdr can be an amorphous silicon (a-Si) TFT, a poly-Si TFT, an oxide TFT, or an organic TFT. For example, in the pixel circuit PC, some of the first switching TFT Tsw1, the second switching TFT Tsw2, and the driving TFT Tdr can be a TFT including a semiconductor layer (or an active layer) including low-temperature polysilicon (LTPS) having an excellent response characteristic, and the other of the first switching TFT Tsw1, the second switching TFT Tsw2, and the driving TFT Tdr can be a TFT including a semiconductor layer (or an active layer) including oxide which is good in off current characteristic. The first switching TFT Tsw1, the second switching TFT Tsw2, and the driving TFT Tdr can have different sizes (or channel sizes). For example, the driving TFT Tdr can have a size which is greater than that of each of the first switching TFT Tsw1 and the second switching TFT Tsw2, and the second switching TFT Tsw2 can have a size which is greater than that of the first switching TFT Tsw1.

The first switching TFT Tsw1 can include a gate electrode connected to the adjacent gate lines GLo and GLe, a first source/drain electrode connected to the adjacent data lines DLo and DLe, and a second source/drain electrode connected to a first node (or a gate electrode of the driving TFT Tdr) n1. The first switching TFT Tsw1 can be turned on by a scan signal supplied through corresponding gate lines GLo and GLe and can transfer a data signal, supplied through corresponding data lines DLo and DLe, to the first node n1 (i.e., the gate electrode n1 of the driving TFT Tdr).

According to an embodiment, the gate electrode of the first switching TFT Tsw1 disposed in the pixel circuit PC of each of the first subpixel SP1 and the second subpixel SP2 can be connected to an odd-numbered gate line GLo, and the gate electrode of the first switching TFT Tsw1 disposed in the pixel circuit PC of each of the third subpixel SP3 and the fourth subpixel SP4 can be connected to an even-numbered gate line GLe. The first source/drain electrode of the first switching TFT Tsw1 disposed in the pixel circuit PC of each of the first subpixel SP1 and the third subpixel SP3 can be connected to an odd-numbered data line DLo, and the first source/drain electrode of the first switching TFT Tsw1 disposed in the pixel circuit PC of each of the second subpixel SP2 and the fourth subpixel SP4 can be connected to an even-numbered data line DLe.

The second switching TFT Tsw2 can include a gate electrode connected to the adjacent gate lines GLo and GLe, a first source/drain electrode connected to an adjacent reference power line RL, and a second source/drain electrode connected to a second node (or a source electrode of the driving TFT Tdr) n2. The second switching TFT Tsw2 can be turned on by a scan signal supplied through corresponding gate lines GLo and GLe and can transfer a reference voltage, supplied through a corresponding reference branch line RDL and reference power line RL, to the source electrode n2 of the driving TFT Tdr.

According to an embodiment, the gate electrode of the second switching TFT Tsw2 disposed in the pixel circuit PC of each of the first subpixel SP1 and the second subpixel SP2 can be connected to an odd-numbered gate line GLo, and the gate electrode of the second switching TFT Tsw2 disposed in the pixel circuit PC of each of the third subpixel SP3 and the fourth subpixel SP4 can be connected to an even-numbered gate line GLe. The first source/drain electrode of the second switching TFT Tsw2 disposed in the pixel circuit PC of each of the first to fourth subpixels SP1 and SP4 can be connected to an adjacent reference power line RL in common through a corresponding reference branch line RDL.

The scan signal supplied to the gate electrode of the first switching TFT Tsw1 and the scan signal supplied to the gate electrode of the second switching TFT Tsw2 can be the same signal. For example, the gate electrode of the first switching TFT Tsw1 and the gate electrode of the second switching TFT Tsw2 can be connected to the same gate lines GLo and GLe. Therefore, the first switching TFT Tsw1 and the second switching TFT Tsw2 disposed in the pixel circuit PC of each of the first subpixel SP1 and the second subpixel SP2 can be simultaneously turned on or off by a scan signal supplied through the odd-numbered gate line GLo. Likewise, the first switching TFT Tsw1 and the second switching TFT Tsw2 disposed in the pixel circuit PC of each of the third subpixel SP3 and the fourth subpixel SP4 can be simultaneously turned on or off by a scan signal supplied through the even-numbered gate line GLe.

Optionally, the scan signal supplied to the gate electrode of the first switching TFT Tsw1 and the scan signal supplied to the gate electrode of the second switching TFT Tsw2 can be different signals. For example, the gate electrode of the first switching TFT Tsw1 and the gate electrode of the second switching TFT Tsw2 can be connected to different gate lines GLo and GLe.

Each of the odd-numbered gate line GLo and the even-numbered gate line GLe according to an embodiment can include first and second gate lines.

The first gate line of the odd-numbered gate line GLo can be connected to the gate electrode of the first switching TFT Tsw1 disposed in the pixel circuit PC of each of the first subpixel SP1 and the second subpixel SP2, and the second gate line of the odd-numbered gate line GLo can be connected to the gate electrode of the second switching TFT Tsw2 disposed in the pixel circuit PC of each of the first subpixel SP1 and the second subpixel SP2.

The first gate line of the even-numbered gate line GLe can be connected to the gate electrode of the first switching TFT Tsw1 disposed in the pixel circuit PC of each of the third subpixel SP3 and the fourth subpixel SP4, and the second gate line of the even-numbered gate line GLe can be connected to the gate electrode of the second switching TFT Tsw2 disposed in the pixel circuit PC of each of the third subpixel SP3 and the fourth subpixel SP4.

Therefore, the first switching TFT Tsw1 and the second switching TFT Tsw2 disposed in the pixel circuit PC of each of the first subpixel SP1 and the second subpixel SP2 can be simultaneously turned on or off by the same scan signal supplied through the first and second gate lines of the odd-numbered gate line GLo, or can be individually turned on or off by different scan signals supplied through the first and second gate lines of the odd-numbered gate line GLo. Likewise, the first switching TFT Tsw1 and the second switching TFT Tsw2 disposed in the pixel circuit PC of each of the third subpixel SP3 and the fourth subpixel SP4 can be simultaneously turned on or off by the same scan signal supplied through the first and second gate lines of the even-numbered gate line GLe, or can be individually turned on or off by different scan signals supplied through the first and second gate lines of the even-numbered gate line GLe. For example, in each of the first to fourth subpixels SP1 to SP4, the first switching TFT Tsw1 can be turned on based on a first scan signal supplied through a first gate line, and the second switching TFT Tsw2 can be turned on based on a second scan signal supplied through a second gate line.

The second switching TFT Tsw2 disposed in the pixel circuit PC of each of the first to fourth subpixels SP1 to SP4 can transfer a reference voltage to the source electrode n2 of the driving TFT Tdr through the reference power line RL during a data charging period (or section) of the pixel P based on an external sensing mode and can transfer a current, flowing in the source electrode n2 of the driving TFT Tdr, to the reference power line RL during a sensing period (or section) of the pixel P, and in this case, the driving circuit unit can sense the current supplied to the reference power line RL to generate compensation data for compensating for a characteristic variation of the driving TFT Tdr and can modulate pixel data on the basis of the generated compensation data. For example, the characteristic variation of the driving TFT Tdr can include a shift of a threshold voltage and/or mobility.

The storage capacitor Cst can be provided in an overlap region between the gate electrode n1 and the source electrode n2 of the driving TFT Tdr. The storage capacitor Cst can include a first capacitor electrode connected to the gate electrode of the driving TFT Tdr, a second capacitor electrode connected to the source electrode of the driving TFT Tdr, and a dielectric layer formed in an overlap region between the first capacitor electrode and the second capacitor electrode. The storage capacitor Cst can be charged with a difference voltage between the gate electrode n1 and the source electrode n2 of the driving TFT Tdr, and then, can turn on or off the driving TFT Tdr on the basis of a charged voltage.

The driving TFT Tdr can include a gate electrode (or a gate node) n1 which is connected to the second source/drain electrode of the first switching TFT Tsw1 and the first capacitor electrode of the storage capacitor Cst, a source electrode (or a source node) which is connected to the second source/drain electrode of the second switching TFT Tsw2, the second capacitor electrode of the storage capacitor Cst, and a pixel electrode PE in common, and a drain electrode (or a drain node) connected to an adjacent pixel driving power line PL.

The drain electrode of the driving TFT Tdr disposed in the pixel circuit PC of each of the first to fourth subpixels SP1 to SP4 can be connected to an adjacent pixel driving power line PL through a power sharing line PSL. The power sharing line PSL can branch from the adjacent pixel driving power line PL adjacent thereto in parallel with the first direction X and can be disposed in a center region of the pixel P. The driving TFT Tdr can be turned on based on a voltage of the storage capacitor Cst and can control the amount of current flowing from the pixel driving power line PL to the light emitting device ED.

The driving TFTs Tdr respectively disposed in the pixel circuits PC of the first to fourth subpixels SP1 to SP4 can have different sizes (or channel sizes) on the basis of the emission efficiency of a corresponding light emitting device ED. For example, the driving TFT Tdr of the first subpixel (or a red subpixel) SP1 can have a size which is greater than that of the driving TFT Tdr of each of the second to fourth subpixels SP2 to SP4, the driving TFT Tdr of the fourth subpixel (or a green subpixel) SP4 can have a size which is greater than that of the driving TFT Tdr of each of the second and third subpixels SP2 and SP3, and the driving TFT Tdr of the second subpixel (or a blue subpixel) SP2 can have a size which is greater than that of the driving TFT Tdr of the third subpixel (or a white subpixel) SP3.

Optionally, in each of the first to fourth subpixels SP1 to SP4, the pixel circuit PC including the first switching TFT Tsw1, the second switching TFT Tsw2, the storage capacitor Cst, and the driving TFT Tdr can be implemented as a pixel driving chip, disposed in a circuit area of a corresponding pixel area PA, and connected to gate lines GLo and GLe adjacent thereto, data lines DLo and DLe adjacent thereto, and the pixel driving power line PL. Such a pixel driving chip can sample a data signal supplied from corresponding data lines DLo and DLe in response to a scan signal supplied from corresponding gate lines GLo and GLe and can supply a data current, corresponding to a sampled data signal, to the pixel electrode PE.

A pixel driving chip according to an embodiment can be a microchip or a chip set which corresponds to a minimum unit and can be a semiconductor packaging device which has a fine size and includes two or more transistors and one or more capacitors. The pixel driving chip can sample a data signal supplied through corresponding data lines DLo and DLe in response to the scan signal supplied through corresponding gate lines GLo and GLe and can control a current flowing from the pixel driving power line PL to the light emitting device ED on the basis of the sampled data signal.

The pixel electrode PE can be disposed in an emission area of each of the first to fourth subpixels SP1 to SP4 and can be connected to the source electrode n2 of a driving TFT Tdr disposed in a corresponding pixel circuit PC.

Based on a resolution of the display apparatus, the pixel electrode PE can be disposed in a corresponding subpixel area not to overlap the pixel circuit PC or to overlap a portion or all of the pixel circuit PC.

The light emitting device ED can be disposed on the pixel electrode PE and can be electrically connected to the pixel electrode PE. Also, the light emitting device ED can be electrically connected to the common electrode CE. For example, the light emitting device ED can be disposed between the pixel electrode PE and the common electrode CE. The light emitting device ED can emit light with a data current supplied from a corresponding pixel circuit PC and can irradiate the light onto a portion above a first surface of the substrate 100. The light emitting device ED according to an embodiment can include a self-light emitting device described above.

Optionally, in the pixel circuit PC according to an embodiment, the second switching TFT Tsw2 can be omitted based on a driving (or operating) manner of the pixel P, and in this case, the reference power line RL disposed on the substrate 100 can also be omitted.

Figure 5:
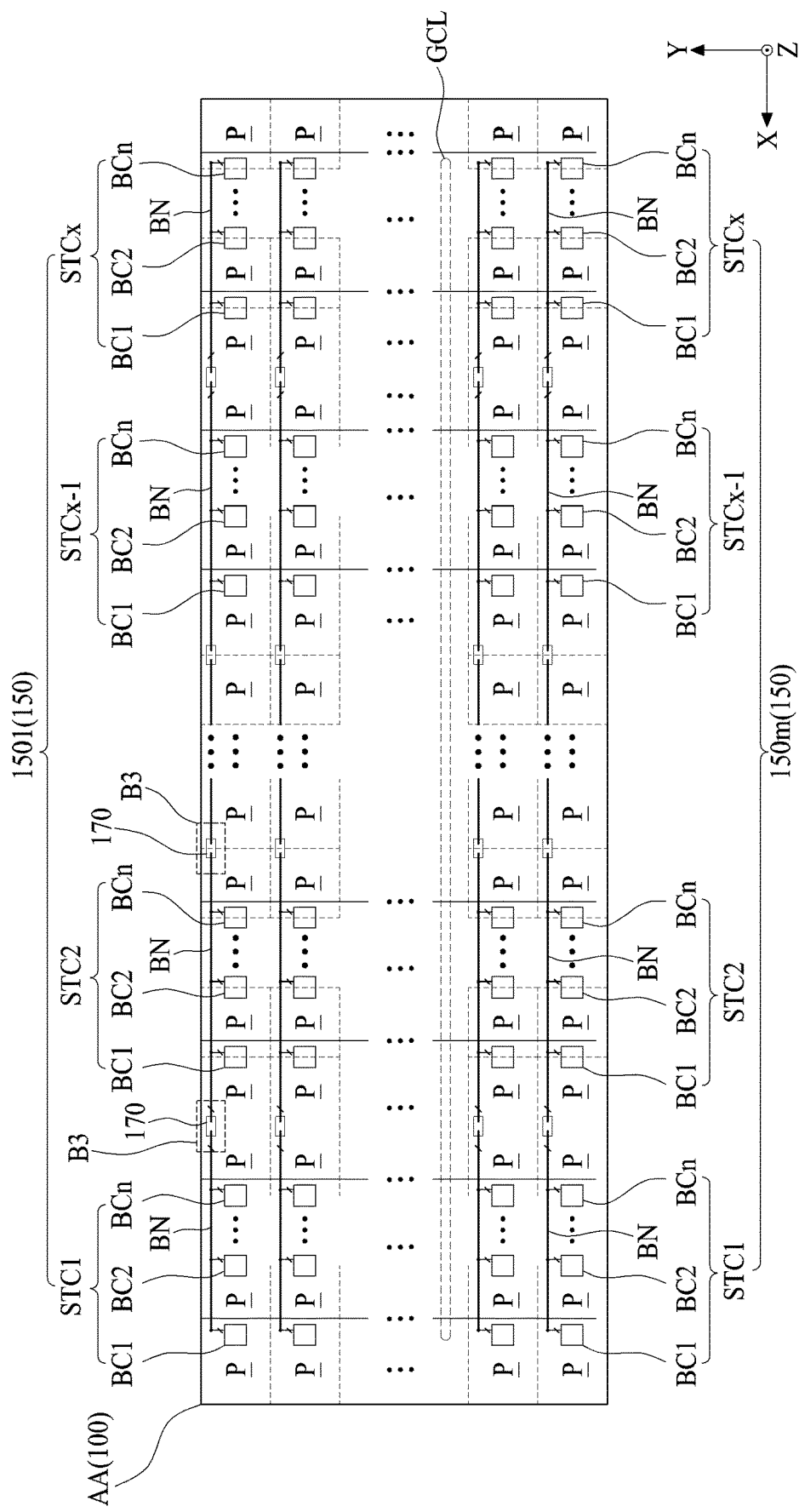
FIG. 5 is a diagram illustrating a gate driving circuit according to an embodiment of the present disclosure illustrated in FIGS. 2 and 3.
Figure 6:
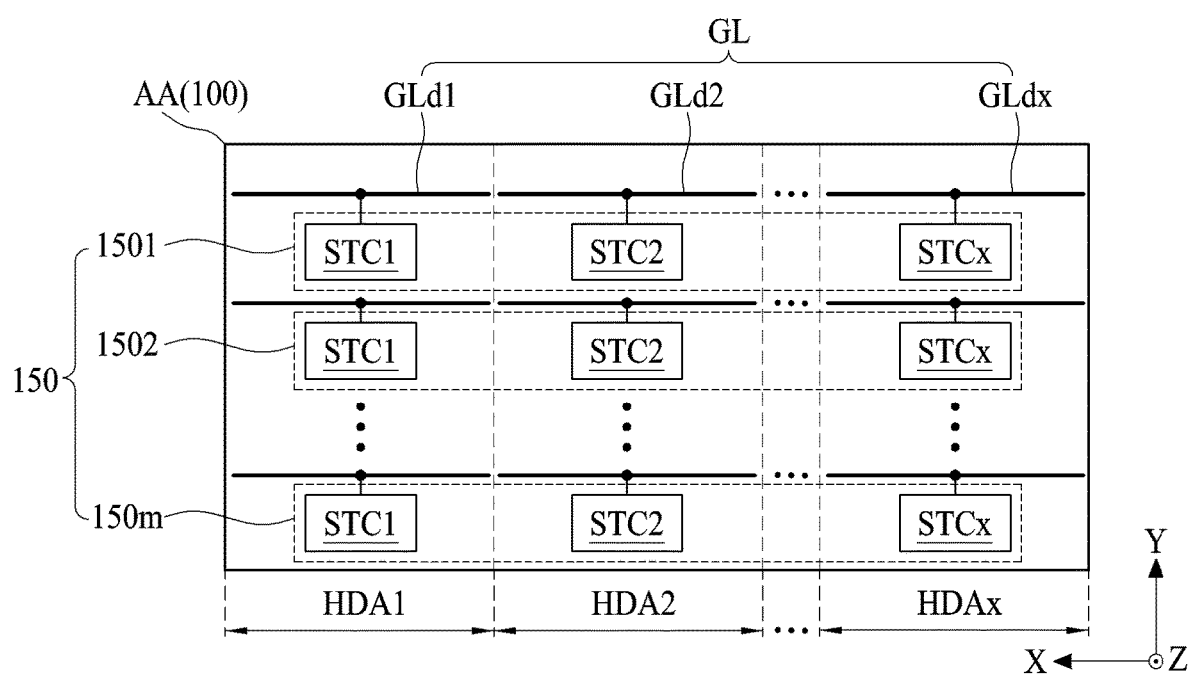
FIG. 6 is a diagram illustrating gate lines connected to a plurality of stage circuit units illustrated in FIG. 5.

FIG. 5 is a diagram illustrating a gate driving circuit according to an embodiment of the present disclosure illustrated in FIGS. 2 and 3, and FIG. 6 is a diagram illustrating gate lines connected to a plurality of stage circuit units illustrated in FIG. 5.

Referring to FIGS. 2 to 6, the gate driving circuit 150 according to an embodiment of the present disclosure can be implemented with a shift register including a plurality of stage circuit units 1501 to 150$m$.

Each of the plurality of stage circuit units 1501 to 150$m$ can be individually disposed in each horizontal line on a first surface of the substrate 100 in a first direction X, and the plurality of stage circuit units 1501 to 150$m$ can be dependently connected to one another in a second direction Y, where m can be a positive number such as a positive integer equal to or greater than 2. Each of the plurality of stage circuit units 1501 to 150$m$ can generate a scan signal in a predetermined order in response to a gate control signal supplied through a pad part 110 and a gate control line group GCL and can supply the scan signal to a corresponding gate line GL.

Each of the plurality of stage circuit units 1501 to 150$m$ according to an embodiment can include first to x$^{th}$ (where x is a natural number of 2 or more) stage circuits STC1 to STCx.

The first to x$^{th}$ stage circuits STC1 to STCx can be respectively disposed in first to x$^{th}$ horizontal division regions HDA1 to HDAx defined in each horizontal line of a display area AA in the first direction X. Each of the first to x$^{th}$ stage circuits STC1 to STCx can generate the scan signal in a predetermined order in response to the gate control signal supplied through the pad part 110 and the gate control line group GCL and can supply the scan signal to a corresponding gate line GL.

A plurality of gate lines GL according to an embodiment can include first to x$^{th}$ gate division lines GLd1 to GLdx which are respectively disposed in the first to x$^{th}$ horizontal division regions HDA1 to HDAx of each horizontal line with respect to the first direction X and are electrically disconnected from one another. In this case, a plurality of pixels P disposed in each of the first to x$^{th}$ horizontal division regions HDA1 to HDAx can be connected to the first to x$^{th}$ gate division lines GLd1 to GLdx disposed in corresponding horizontal division regions HDA1 to HDAx. For example, a plurality of pixels P disposed in a first horizontal division region HDA1 can be connected to the first gate division line GLd1 disposed in the first horizontal division region HDA1.

According to another embodiment, each of a plurality of gate lines GL can be implemented as a line type which connects continuously from one side of a corresponding horizontal line to the other side of the corresponding horizontal line, with respect to the first direction X. In this case, a plurality of pixels P disposed in each horizontal line can be connected to a corresponding gate line GL in common.

Each of the first to x$^{th}$ stage circuits STC1 to STCx can include a plurality of branch circuits BC1 to BCn and a branch network BN.

Each of the plurality of branch circuits BC1 to BCn can be selectively connected to lines of the gate control line group GCL through a branch network BN and can be electrically connected to one another through the branch network BN. Each of the plurality of branch circuits BC1 to BCn can generate the scan signal on the basis of the gate control signal supplied through each line of the gate control line group GCL and the branch network BN and a signal transferred between branch networks BN and can supply the scan signal to a corresponding gate line GL.

Each of the plurality of branch circuits BC1 to BCn can include at least one of a plurality of TFTs configuring one stage circuit STC. For example, each of the plurality of branch circuits BC1 to BCn can correspond to at least one of first to forty-third TFTs T1 to T43 configuring one stage circuit STC illustrated in FIGS. 8 and 9.

Each of the plurality of branch circuits BC1 to BCn according to an embodiment can be disposed in a circuit region between two adjacent pixels P or a circuit region between two pixels P, in each horizontal line of the substrate 100, but is not limited thereto and can be separately disposed (or distributedly disposed) between a plurality of pixels P on the basis of the number of TFTs configuring one stage circuit unit STC and the number of pixels P disposed in one horizontal line.

The branch network BN can be disposed in each horizontal line of the substrate 100 and can electrically connect the plurality of branch circuits BC1 to BCn. Also, the branch network BC can be electrically connected to a corresponding gate line GL and can electrically connect at least one of the plurality of branch circuits BC1 to BCn to the gate control line group GCL. The branch network BN according to an embodiment can include a plurality of nodes and a network line.

The plurality of control nodes can be disposed in each horizontal line of the substrate 100 and can be selectively connected to the plurality of branch circuits BC1 to BCn in one horizontal line. For example, the plurality of control nodes can be disposed in an upper edge area (or a lower edge area) of a plurality of pixel areas arranged in each horizontal line.

The network line can be selectively connected to the lines of the gate control line group GCL disposed on the substrate 100 and can be selectively connected to the plurality of branch circuits BC1 to BCn. For example, the network line can supply a corresponding branch circuit BC with the gate control signal supplied through the lines of the gate control line group GCL and can transfer a signal between the plurality of branch circuits BC1 to BCn.

The gate driving circuit 150 or each of the stage circuit units 150I to 150m according to an embodiment of the present disclosure can further include a plurality of circuit repair portions 170 for repairing the abnormal operation or non-driving of at least one of the first to $x^{th}$ stage circuits STC1 to STCx.

Each of the plurality of circuit repair portions 170 can be disposed between adjacent stage circuits of the first to $x^{th}$ stage circuits STC1 to STCx. Each of the plurality of circuit repair portions 170 can be disposed between branch networks BN of the first to $x^{th}$ stage circuits STC1 to STCx.

Each of the plurality of circuit repair portions 170 according to an embodiment can be disposed on the substrate 100 to overlap branch networks BN of two adjacent stage circuits STC in the first direction X. For example, the plurality of circuit repair portions 170 can be disposed on the substrate 100 to overlap an end of a branch network BN disposed in each of the $y^{th}$ (where y is one to x) stage circuit STCy and the y+1$^{th}$ stage circuit STCy+1 of the first to $x^{th}$ stage circuits STC1 to STCx and to be electrically insulated therefrom. For example, with respect to the first direction X, the branch networks BN of the $y^{th}$ stage circuit STCy and the y+1$^{th}$ stage circuit STCy+1 overlapping the circuit repair portion 170 can be apart from each other on the circuit repair portion 170, or can be electrically disconnected from each other.

Likewise, each of the plurality of circuit repair portions 170 can be disposed between carry output terminals of each of the first to $x^{th}$ stage circuits STC1 to STCx.

At least one of the plurality of circuit repair portions 170 can be implemented to normally operate the $y^{th}$ stage circuit STCy or the plurality of branch circuits BC1 to BCn through a laser repair process when at least one of the plurality of branch circuits BC1 to BCn implementing the $y^{th}$ stage circuit STCy of the first to $x^{th}$ stage circuits STC1 to STCx operates abnormally or is not driven.

According to an embodiment, when at least one of the plurality of branch circuits BC1 to BCn implementing the $y^{th}$ stage circuit STCy operates abnormally or is not driven, in the laser repair process, a connection line between an abnormally-operating branch circuit BC and a corresponding branch network BN can be laser-cut, and a branch network BN disposed in the $y^{th}$ stage circuit STCy can be electrically connected to a branch network BN of the y-1$^{th}$ stage circuit STCy-1 or the y+1$^{th}$ stage circuit STCy+1, whereby the $y^{th}$ stage circuit STCy or the plurality of branch circuits BC1 to BCn can operate normally. After the laser repair process, the $y^{th}$ stage circuit STCy can share the branch network BN of the y-1$^{th}$ stage circuit STCy-1 or the y+1$^{th}$ stage circuit STCy+1, and thus, the at least one of the plurality of branch circuits BC1 to BCn disposed in the $y^{th}$ stage circuit STCy can transfer or receive a signal through the branch network BN of the y-1$^{th}$ stage circuit STCy-1 or the y+1$^{th}$ stage circuit STCy+1 to operate normally.

Figure 7:
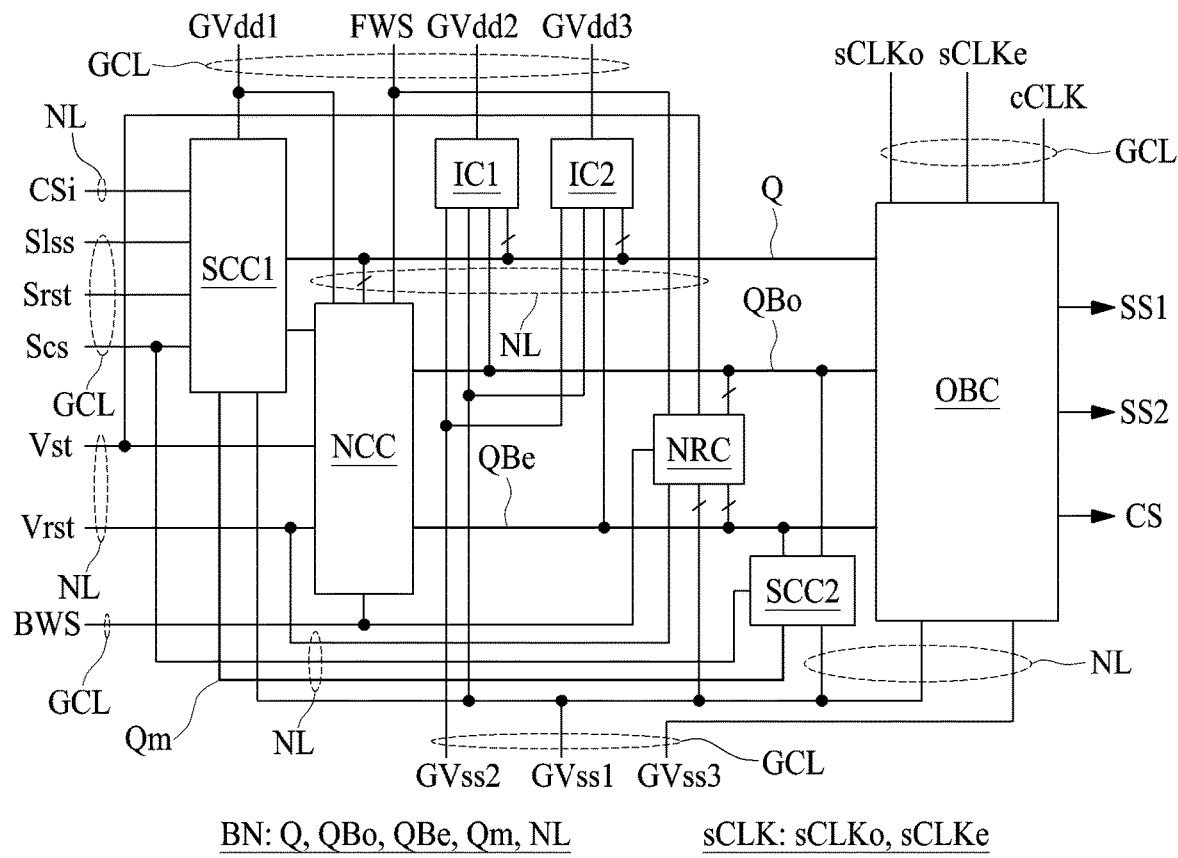
FIG. 7 is a circuit diagram illustrating an arbitrary stage circuit disposed in an $i^{th}$ stage circuit unit illustrated in FIGS. 5 and 6.

FIG. 7 is a circuit diagram illustrating an arbitrary stage circuit disposed in the $i^{th}$ stage circuit unit illustrated in FIGS. 5 and 6.

Referring to FIGS. 5 to 7, a stage circuit STC of an $i^{th}$ stage circuit unit 150i according to the present disclosure can output two scan signals SS1 and SS2 and a carry signal CS in response to a gate control signal supplied from a gate control line group GCL disposed on the substrate 100.

The gate control signal according to an embodiment can include a start signal Vst, a plurality of shift clocks including a plurality of scan clocks sCLK and a plurality of carry clocks cCLK, first to third gate driving powers GVdd1, GVdd2, and GVdd3, and first to third gate common powers GVss1, GVss2 and GVss3. In this case, the gate control line group GCL can include a start signal line, a plurality of scan clock lines, a plurality of carry clock lines, first to third gate driving power lines, and first to third gate common power lines.

The gate control signal according to an embodiment can include first to $j^{th}$ carry clocks and first to $j^{th}$ scan clocks. For example, j can be 4, but is not limited thereto and can be an even number of 6, 8, or 10 or more.

When the gate control signal includes the first to fourth carry clocks, the first carry clock can be applied to a 4k-3$^{th}$ (where k is 1 to m/4) stage circuit unit, the second carry clock can be applied to a 4k-2$^{th}$ stage circuit unit, the third carry clock can be applied to a 4k-1$^{th}$ stage circuit unit, and the fourth carry clock can be applied to a 4k$^{th}$ stage circuit unit. When the gate control signal includes the first to fourth scan clocks, the first and second scan clocks can be applied to an odd-numbered stage circuit unit, and the third and fourth scan clocks can be applied to an even-numbered stage circuit unit.

Moreover, the gate control signal according to an embodiment can further include a forward driving signal FWS and a backward driving signal BWS. In this case, the gate control line group GCL can further include a forward driving signal line and a backward driving signal line.

The gate control signal according to an embodiment can further include an external sensing line selection signal Slss, an external sensing reset signal Srst, and an external sensing control signal Scs for an external sensing mode. In this case, the gat control line group GCL can further include an external sensing selection signal line, an external sensing reset signal line, and an external sensing control signal line.

The stage circuit STC of the $i^{th}$ stage circuit unit 150i according to the present disclosure can include a branch network BN, a node control circuit NCC, a first inverter circuit IC1, a second inverter circuit IC2, a node reset circuit NRC, and an output buffer circuit OBC.

The branch network BN can be selectively connected to the lines of the gate control line group GCL. The branch network BN according to an embodiment can include first to third control nodes Q, QBo, and QBe and a network line NL.

Each of the first to third control nodes Q, QBo, and QBe can be disposed in an upper edge region (or a lower edge region) of each of pixel areas arranged in an $i^{th}$ horizontal line of the substrate 100. Each of the first to third control nodes Q, QBo, and QBe can be disposed in parallel with a first direction X or an $i^{th}$ gate line. For example, each of the first to third control nodes Q, QBo, and QBe can be disposed adjacent to the $i^{th}$ gate line.

The network line NL can be selectively connected to the lines of the gate control line group GCL and can be selectively connected to the first to third control nodes Q, QBo, and QBe. Also, the network line NL can be selectively connected between circuits configuring the stage circuit STC.

The node control circuit NCC, the first inverter circuit IC1, the second inverter circuit IC2, and the node reset circuit NRC can be referred to as a logic circuit unit. The output buffer circuit OBC can be referred to as an output circuit unit.

The node control circuit NCC can be implemented to control a voltage of each of the first to third control nodes Q, QBo, and QBe.

The node control circuit NCC according to an embodiment can be connected to each of the first to third control nodes Q, QBo, and QBe through the network line NL and can be implemented to control the voltage of each of the first to third control nodes Q, QBo, and QBe in response to the start signal Vst, the reset signal Vrst, and the first gate driving power GVdd1 supplied through the network line NL. For example, the start signal Vst can be a carry signal CS output from the i−2$^{th}$ stage circuit unit 150i−2. The reset signal Vrst can be a carry signal CS output from an i+2$^{th}$ stage circuit unit 150i+2.

According to another embodiment, the node control circuit NCC can be connected to each of the first to third control nodes Q, QBo, and QBe through the network line NL and can control the voltage of each of the first to third control nodes Q, QBo, and QBe in response to the start signal Vst, the reset signal Vrst, the forward driving signal FWS, the backward driving signal BWS, and the first gate driving power GVdd1 supplied through the network line NL. For example, when the forward driving signal FWS has a high voltage level (or a high potential voltage level), the backward driving signal BWS can have a low voltage level (or a low potential voltage level), and when the forward driving signal FWS has a low voltage level (or a low potential voltage level), the backward driving signal BWS can have a high voltage level (or a high potential voltage level). For example, when the forward driving signal FWS has a high voltage level, the gate driving circuit 150 can supply a scan signal up to a last gate line from a first gate line on the basis of forward scan driving, and when the backward driving signal BWS has a high voltage level, the gate driving circuit 150 can supply the scan signal up to the first gate line from the last gate line on the basis of backward scan driving. Herein, a high voltage level can be referred to as a first voltage level, a high potential voltage level, a gate turn-on voltage level, or a transistor on voltage level, and a low voltage level can be referred to as a second voltage level, a low potential voltage level, a gate turn-off voltage level, or a transistor off voltage level.

The first inverter circuit IC1 can control or discharge the voltage of the second control node QBo on the basis of the voltage of the first control node Q. The first inverter circuit IC1 according to an embodiment can be connected to the second gate driving power GVdd2, the first control node Q, the second control node QBo, the first gate common power GVss1, and the second gate common power GVss2 through the network line NL. In response to the second gate driving power GVdd2 and the voltage of the first control node Q, the first inverter circuit IC1 can supply the first gate common power GVss1 to the second control node QBo to discharge the voltage of the second control node QBo.

The second inverter circuit IC2 can control or discharge the voltage of the third control node QBe on the basis of the voltage of the first control node Q. The second inverter circuit IC2 according to an embodiment can be connected to the third gate driving power GVdd3, the first control node Q, the third control node QBe, the first gate common power GVss1, and the second gate common power GVss2 through the network line NL. In response to the third gate driving power GVdd3 and the voltage of the first control node Q, the second inverter circuit IC2 can supply the first gate common power GVss1 to the third control node QBe to discharge the voltage of the third control node QBe.

The second gate driving power GVdd2 and the third gate driving power GVdd3 can have voltage levels which are inverted (or opposite to each other) therebetween. For example, when the second gate driving power GVdd2 has a high voltage level, the third gate driving power GVdd3 can have a low voltage level, and when the second gate driving power GVdd2 has a low voltage level, the third gate driving power GVdd3 can have a high voltage level.

The second gate common power GVss2 and the first gate common power GVss1 can have the same voltage level or different voltage levels.

The node reset circuit NRC can maintain a voltage level of each of the second control node QBo and the third control node QBe while the voltage of the first control node Q has a high voltage level.

The node reset circuit NRC according to an embodiment can simultaneously reset the voltage of the second control node QBo and the voltage of the third control node QBe in response to the start signal Vst and the reset signal Vrst supplied through the network line NL. For example, the node reset circuit NRC can supply the first gate common power GVss1 to the second control node QBo and the third control node QBe in response to the start signal Vst and the reset signal Vrst, and thus, can maintain the second control node QBo and the third control node QBe at a voltage level of the first gate common power GVss1.

According to another embodiment, the node reset circuit NRC can simultaneously reset the voltage of the second control node QBo and the voltage of the third control node QBe in response to the start signal Vst, the reset signal Vrst, the forward driving signal FWS, and the backward driving signal BWS supplied through the network line NL. For example, the node reset circuit NRC can supply the first gate common power GVss1 to the second control node QBo and the third control node QBe in response to the start signal Vst, the reset signal Vrst, the forward driving signal FWS, and the backward driving signal BWS, and thus, can maintain each of the second control node QBo and the third control node QBe at a voltage level of the first gate common power GVss1.

The output buffer circuit OBC can be implemented to sequentially output two scan signals SS1 and SS2 having a gate-on voltage level or to sequentially output two scan signals SS1 and SS2 having a gate-off voltage level in response to the voltage of each of the first to third control nodes Q, QBo, and QBe on the basis of the carry clock cCLK, the scan clock sCLK, the first gate common power GVss1, and the third gate common power GVss3 supplied through the network line NL.

When the voltage of the first control node Q has a high voltage level and the voltage of each of the second and third control nodes QBo and QBe has a low voltage level, the output buffer circuit OBC according to an embodiment can output each of a carry signal CS corresponding to the carry clock cCLK, a first scan signal SS1 corresponding to an odd-numbered scan clock sCLKo, and a second scan signal SS2 corresponding to an even-numbered scan clock sCLKe. For example, the carry signal CS can be supplied as the start signal Vst to the i+2th stage circuit unit, the first scan signal SS1 can be supplied to an odd-numbered gate line GLo (or an i$^{th}$ gate line GL), and the second scan signal SS2 can be supplied to an even-numbered gate line GLe (or an i+1$^{th}$ gate line).

When the voltage of each of the first and third control nodes Q and QBe has a low voltage level and the voltage of the second control node QBo has a high voltage level, the output buffer circuit OBC according to an embodiment can output each of the first scan signal SS1 and the second scan signal SS2 each having a gate-off voltage level corresponding to a voltage level of the third gate common power GVss3 and can output the carry signal CS having a gate-off voltage level corresponding to a voltage level of the first gate common power GVss1.

When the voltage of each of the first and second control nodes Q and QBo has a low voltage level and the voltage of the third control node QBe has a high voltage level, the output buffer circuit OBC according to an embodiment can output each of the first scan signal SS1 and the second scan signal SS2 each having a gate-off voltage level corresponding to a voltage level of the third gate common power GVss3 and can output the carry signal CS having a gate-off voltage level corresponding to a voltage level of the first gate common power GVss1.

The first to third gate common powers GVss1, GVss2, and GVss3 can have the same voltage level or different voltage levels.

The stage circuit STC of the $i^{th}$ stage circuit unit 150$i$ according to the present disclosure can further include a fourth control node Qm, a first sensing control circuit SCC1, and a second sensing control circuit SCC2. Here, the first sensing control circuit SCC1 and the second sensing control circuit SCC2 can be referred to as a logic circuit unit together with the node control circuit NCC, the first inverter circuit IC1, the second inverter circuit IC2, and the node reset circuit NRC.

The fourth control node Qm can be implemented to be electrically connected between the first sensing control circuit SCC1 and the second sensing control circuit SCC2. The fourth control node Qm can be included in the branch network BN and can be electrically connected between the first sensing control circuit SCC1 and the second sensing control circuit SCC2 through the network line NL.

The first sensing control circuit SCC1 can be implemented to control a voltage of each of the first control node Q and the fourth control node Qm in response to the carry signal CS, the external sensing line selection signal Slss, the external sensing control signal Scs, the external sensing reset signal Srst, and the first gate driving power GVdd1 supplied through the branch network BN. For example, the first sensing control circuit SCC1 can charge the first gate driving power GVdd1 into the fourth control node Qm in response to the carry signal CS having a high voltage level and the external sensing line selection signal Slss having a high voltage level, and then, can control the voltage of the first control node Q in response to a voltage charged into the fourth control node Qm, the external sensing control signal Scs having a high voltage level supplied during a fore period of a vertical blank period, and the first gate driving power GVdd1. Therefore, the output buffer circuit OBC can output each of the carry signal CS corresponding to the carry clock cCLK, the first scan signal SS1 corresponding to the odd-numbered scan clock sCLKo, and the second scan signal SS2 corresponding to the even-numbered scan clock sCLKe during the vertical blank period on the basis of the voltage of the first control node Q.

Moreover, the first sensing control circuit SCC1 can discharge the voltage of the first control node Q in response to the external sensing reset signal Srst supplied through the branch network BN. For example, the first sensing control circuit SCC1 can supply the first gate common power GVss1 to the first control node Q to reset or initialize the voltage of the first control node Q in response to the external sensing reset signal Srst having a high voltage level supplied during a latter period of the vertical blank period.

The second sensing control circuit SCC2 can be implemented to discharge the voltage of each of the second control node QBo and the third control node QBe in response to the voltage of the fourth control node Qm and the external sensing control signal Scs supplied through the branch network BN. For example, the second sensing control circuit SCC2 can supply the first gate common power GVss1 to each of the second control node QBo and the third control node QBe to simultaneously discharge the second control node QBo and the third control node QBe, in response to the voltage of the fourth control node Qm having a high voltage level and the external sensing control signal Scs having a high voltage level.

Figure 8:
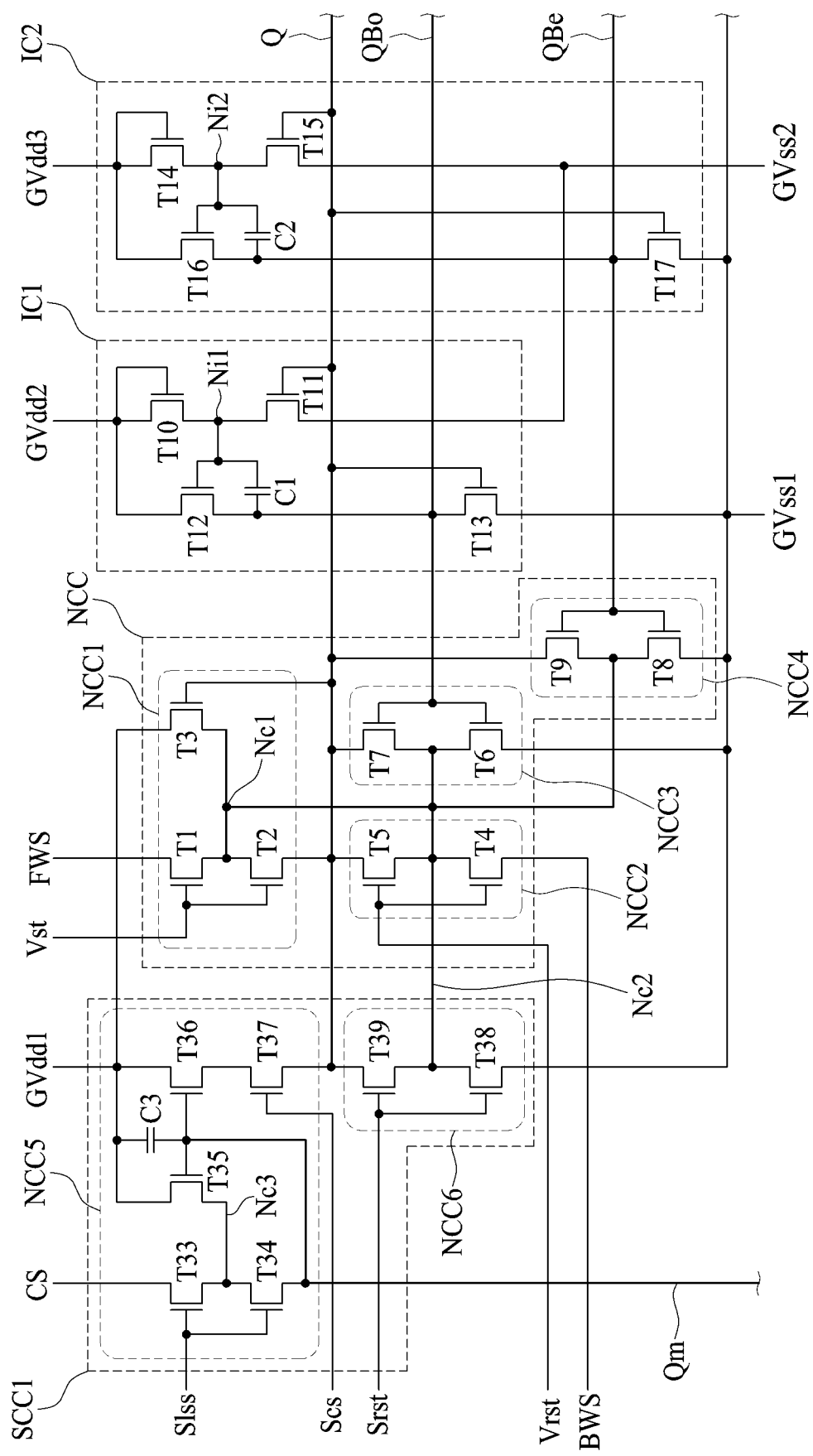
FIG. 8 is a circuit diagram illustrating a node control circuit, a first inverter circuit, a second inverter circuit, and a first sensing control circuit illustrated in FIG. 7.

FIG. 8 is a circuit diagram illustrating the node control circuit, the first inverter circuit, the second inverter circuit, and the first sensing control circuit each illustrated in FIG. 7.

Referring to FIGS. 5 to 8, a node control circuit NCC according to an embodiment can include first to fourth node control circuits NCC1 to NCC4.

In forward scan driving, the first node control circuit NCC1 can charge a high voltage level of a forward driving signal FWS into a first control node Q in response to a start signal Vst having a high voltage level and the forward driving signal FWS having a high voltage level. Also, in backward scan driving, the first node control circuit NCC1 can electrically connect a forward driving signal line having a low voltage level to the first control node Q to discharge a voltage, charged into the first control node Q, to a low voltage level in response to the start signal Vst having a high voltage level and the forward driving signal FWS having a low voltage level.

The first node control circuit NCC1 can include first to third TFTs T1 to T3.

The first TFT T1 can output the forward driving signal FWS to a first connection node Nc1 in response to the start signal Vst. For example, the first TFT T1 can be turned on based on the start signal Vst having a high voltage level and can output the forward driving signal FWS, supplied through the forward driving signal line, to the first connection node Nc1.

The second TFT T2 can electrically connect the first connection node Nc1 to a first control node Q in response to the start signal Vst. For example, the second TFT T2 can be turned on based on the start signal Vst having a high voltage level and can output the forward driving signal FWS, supplied through the first TFT T1 and the first connection node Nc1, to the first control node Q.

The third TFT T3 can supply a first gate driving power GVdd1, supplied through a first gate driving power line, to the first connection node Nc1 in response to a voltage of the first control node Q. For example, the third TFT T3 can be turned on based on the voltage of the first control node Q having a high voltage level and can transfer the first gate driving power GVdd1 to the first connection node Nc1 between the first TFT T1 and the second TFT T2, thereby preventing the current leakage of the first control node Q. For example, the third TFT T3 can increase a voltage difference between a gate voltage of the second TFT T2 and the voltage of the first connection node Nc1 to turn off the second TFT T2 which has been turned off based on the start signal Vst having a low voltage level, and thus, can prevent the voltage drop of the first control node Q through the turned-off second TFT T2, thereby stably maintaining the voltage of the first control node Q.

In backward scan driving, the second node control circuit NCC2 can charge a high voltage level of a backward driving signal BWS into the first control node Q in response to a reset signal Vrst having a high voltage level and the backward driving signal BWS having a high voltage level. Also, in forward scan driving, the second node control circuit NCC2 can electrically connect a backward driving signal line having a low voltage level to the first control node Q to discharge a voltage, charged into the first control node Q, to a low voltage level in response to the start signal Vrst having a high voltage level and the backward driving signal BWS having a low voltage level.

The second node control circuit NCC2 according to an embodiment can include a fourth TFT T4 and a fifth TFT T5.

The fourth TFT T4 can output the backward driving signal BWS in response to the reset signal Vrst. For example, the fourth TFT T4 can be turned on based on the reset signal Vrst having a high voltage level and can output the backward driving signal BWS, supplied through a backward driving signal line, to a second connection node Nc2.

The fifth TFT T5 can electrically connect the second connection node Nc2 to the first control node Q in response to the reset signal Vrst. For example, the fifth TFT T5 can be turned on based on the reset signal Vrst having a high voltage level and can output the backward driving signal BWS, supplied through the fourth TFT T4 and the second connection node Nc2, to the first control node Q.

The second connection node Nc2 between the fourth TFT T4 and the fifth TFT T5 can be electrically connected to the first connection node Nc1. Therefore, the second connection node Nc2 can be supplied with the first gate driving power GVdd1, supplied through the first gate driving power line, through the third TFT T3 of the first node control circuit NCC1. Therefore, the third TFT T3 of the first node control circuit NCC1 can increase a voltage difference between a gate voltage of the fifth TFT T5 of the second node control circuit NCC2 and the voltage of the second connection node Nc2 to turn off the fifth TFT T5 which has been turned off based on the reset signal Vrst having a low voltage level, and thus, can prevent the voltage drop (or the current leakage) of the first control node Q through the turned-off fifth TFT T5, thereby stably maintaining the voltage of the first control node Q.

The third node control circuit NCC3 can discharge the voltage of the first control node Q in response to a voltage of a second control node QBo. For example, the third node control circuit NCC3 can form a current path between the first control node Q and a first gate common power line on the basis of a high voltage level of the second control node QBo to discharge the voltage of the first control node Q to the first gate common power line.

The third node control circuit NCC3 according to an embodiment can include a sixth TFT T6 and a seventh TFT T7.

The sixth TFT T6 can supply the second connection node Nc2 with the first gate common power GVss1 supplied through the first gate common power line in response to the voltage of the second control node QBo. For example, the sixth TFT T6 can be turned on based on a high voltage level of the second control node QBo and can electrically connect the second connection node Nc2 to the first gate common power line.

The seventh TFT T7 can electrically connect the second connection node Nc2 to the first control node Q in response to the voltage of the second control node QBo. For example, the seventh TFT T7 can be turned on based on a high voltage level of the second control node QBo and can electrically connect the second connection node Nc2 to the first control node Q.

The seventh TFT T7 can be turned off based on a low voltage level of the second control node QBo, and a voltage difference between a gate voltage of the turned-off seventh TFT T7 and the voltage of the second connection node Nc2 can increase based on the first gate driving power GVdd1 supplied to the second connection node Nc2 through the third TFT T3 of the first node control circuit NCC1, whereby the seventh TFT T7 turned off based on the low voltage level of the second control node QBo can be completely turned off based on the first gate driving power GVdd1 supplied to the second connection node Nc2. Accordingly, the voltage drop (or current leakage) of the first control node Q through the third node control circuit NCC3 can be prevented because the seventh TFT T7 is completely turned off, thereby stably maintaining the voltage of the first control node Q.

The fourth node control circuit NCC4 can discharge the voltage of the first control node Q in response to a voltage of a third control node QBe. For example, the fourth node control circuit NCC4 can form a current path between the first control node Q and the first gate common power line on the basis of a high voltage level of the third control node QBe to discharge the voltage of the first control node Q to the first gate common power line.

The fourth node control circuit NCC4 according to an embodiment can include an eighth TFT T8 and a ninth TFT T9.

The eighth TFT T8 can supply the second connection node Nc2 with the first gate common power GVss1 supplied through the first gate common power line in response to the voltage of the third control node QBe. For example, the eighth TFT T8 can be turned on based on a high voltage level of the third control node QBe and can electrically connect the second connection node Nc2 to the first gate common power line.

The ninth TFT T9 can electrically connect the second connection node Nc2 to the first control node Q in response to the voltage of the third control node QBe. For example, the ninth TFT T9 can be turned on based on a high voltage level of the third control node QBe and can electrically connect the second connection node Nc2 to the first control node Q.

The ninth TFT T9 can be turned off based on a low voltage level of the third control node QBe, and a voltage difference between a gate voltage of the turned-off ninth TFT T9 and the voltage of the second connection node Nc2 can increase based on the first gate driving power GVdd1 supplied to the second connection node Nc2 through the third TFT T3 of the first node control circuit NCC1, whereby the ninth TFT T9 turned off based on the low voltage level of the third control node QBe can be completely turned off based on the first gate driving power GVdd1 supplied to the second connection node Nc2. Accordingly, the voltage drop (or current leakage) of the first control node Q through the fourth node control circuit NCC4 can be prevented because the ninth TFT T9 is completely turned off, thereby stably maintaining the voltage of the first control node Q.

The first inverter circuit IC1 can discharge the voltage of the second control node QBo in response to the voltage of the first control node Q and a second gate driving power GVdd2. For example, the first inverter circuit IC1 can form a current path between the second control node QBo and the first gate common power line on the basis of a high voltage level of the first control node Q to discharge the voltage of the second control node QBo to the first gate common power line.

The first inverter circuit IC1 according to an embodiment can include tenth to thirteenth TFTs T10 to T13 and a first capacitor C1.

The tenth TFT T10 can be turned on or off based on the second gate driving power GVdd2 and can output the second gate driving power GVdd2, which has a high voltage level when turned on, to a first internal node Ni1. The tenth TFT T10 according to an embodiment can be diode-connected between the second gate driving power GVdd2 and the first internal node Ni1.

The eleventh TFT T11 can be turned on or off based on the voltage of the first control node Q, and when turned on, can discharge a voltage of the first internal node Ni1 to a second gate common power line.

The twelfth TFT T12 can be turned on or off based on the voltage of the first internal node Ni1, and when turned on, can supply the second gate driving power GVdd2 to the second control node QBo.

The thirteenth TFT T13 can be turned on or off based on the voltage of the first control node Q, and when turned on, can discharge the voltage of the second control node QBo to the first gate common power line.

The first capacitor C1 can be formed between the first internal node Ni1 and a node (or the second control node QBo) between the twelfth TFT T12 and the thirteenth TFT T13. For example, the first capacitor C1 can allow bootstrapping to occur in the first internal node Ni1 on the basis of a voltage variation of the second gate driving power GVdd2. Therefore, when a voltage level of the second gate driving power GVdd2 varies, the voltage of the first internal node Ni1 can further vary by a voltage variation of the second gate driving power GVdd2 due to bootstrapping caused by coupling of the first capacitor C1 and the second gate driving power GVdd2, thereby more enhancing an output characteristic of the twelfth TFT T12.

The second inverter circuit IC2 can discharge the voltage of the third control node QBe in response to the voltage of the first control node Q and a third gate driving power GVdd3. For example, the second inverter circuit IC2 can form a current path between the third control node QBe and the first gate common power line on the basis of a high voltage level of the first control node Q to discharge the voltage of the third control node QBe to the first gate common power line.

The second inverter circuit IC2 according to an embodiment can include fourteenth to seventeenth TFTs T14 to T17 and a second capacitor C2.

The fourteenth TFT T14 can be turned on or off based on the third gate driving power GVdd3 and can output the third gate driving power GVdd3, which has a high voltage level when turned on, to a second internal node Ni2. The fourteenth TFT T14 according to an embodiment can be diode-connected between the third gate driving power GVdd3 and the second internal node Ni2.

The fifteenth TFT T15 can be turned on or off based on the voltage of the first control node Q, and when turned on, can discharge a voltage of the second internal node Ni2 to the second gate common power line.

The sixteenth TFT T16 can be turned on or off based on the voltage of the second internal node Ni2, and when turned on, can supply the third gate driving power GVdd3 to the third control node QBe.

The seventeenth TFT T17 can be turned on or off based on the voltage of the first control node Q, and when turned on, can discharge the voltage of the third control node QBe to the first gate common power line.

The second capacitor C2 can be formed between the second internal node Ni2 and a node (or the third control node QBe) between the sixteenth TFT T16 and the seventeenth TFT T17. For example, the second capacitor C2 can allow bootstrapping to occur in the second internal node Ni2 on the basis of a voltage variation of the third gate driving power GVdd3. Therefore, when a voltage level of the third gate driving power GVdd3 varies, the voltage of the second internal node Ni2 can further vary by a voltage variation of the third gate driving power GVdd3 due to bootstrapping caused by coupling of the second capacitor C2 and the third gate driving power GVdd3, thereby more enhancing an output characteristic of the sixteenth TFT T16.

The first sensing control circuit SCC1 can be implemented to control a voltage of each of the first control node Q and the fourth control node Qm in response to an carry signal CS, an external sensing line selection signal Slss, an external sensing control signal Scs, an external sensing reset signal Srst, and the first gate driving power GVdd1.

The first sensing control circuit SCC1 according to an embodiment can include a fifth node control circuit NCC5 and a sixth node control circuit NCC6.

The fifth node control circuit NCC5 can control the voltage of each of the first control node Q and the fourth control node Qm in response to the carry signal CS, the external sensing line selection signal Slss, the external sensing control signal Scs, and the first gate driving power GVdd1.

The fifth node control circuit NCC5 according to an embodiment can include thirty-third to thirty-seventh TFT T33 to T37 and a third capacitor C3.

The thirty-third TFT T33 can output the carry signal CS to a third connection node Nc3 in response to the external sensing line selection signal Slss supplied along with the start signal Vst. For example, the thirty-third TFT T33 can be turned on based on the external sensing line selection signal Slss having a high voltage level and can output the carry signal CS to the third connection node Nc3.

The thirty-fourth TFT T34 can electrically connect the third connection node Nc3 to the fourth control node Qm in response to the external sensing line selection signal Slss. For example, the thirty-fourth TFT T34 can be turned on based on the external sensing line selection signal Slss having a high voltage level and can supply the carry signal CS, supplied through the thirty-third TFT T33 and the third connection node Nc3, to the fourth control node Qm. The third connection node Nc3 can be a connection line between the thirty-third TFT T33 and the thirty-fourth TFT T34.

The thirty-fifth TFT T35 can supply the first gate driving power GVdd1 to the third connection node Nc3 in response to the voltage of the fourth control node Qm. For example, the thirty-fifth TFT T35 can be turned on based on the voltage of the fourth control node Qm having a high voltage level and can supply the first gate driving power GVdd1 to the third connection node Nc3, thereby preventing the current leakage of the fourth control node Qm. For example, the thirty-fifth TFT T35 can increase a voltage difference between a gate voltage of the thirty-fourth TFT T34 and the voltage of the third connection node Nc3, and thus, can turn off the thirty-fourth TFT T34 which has been turned off based on the external sensing line selection signal Slss having a low voltage level, thereby preventing the voltage drop (or current leakage) of the fourth control node Qm through the turned-off thirty-fourth TFT T34 to stably maintain the voltage of the fourth control node Qm.

The thirty-sixth TFT T36 can output the first gate driving power GVdd1 to the thirty-seventh TFT T37 in response to the voltage of the fourth control node Qm. For example, the thirty-sixth TFT T36 can be turned on based on the voltage of the fourth control node Qm having a high voltage level and can supply the first gate driving power GVdd1 to the thirty-seventh TFT T37.

The thirty-seventh TFT T37 can electrically connect the thirty-sixth TFT T36 to the first control node Q in response to the external sensing control signal Scs. For example, the thirty-seventh TFT T37 can be turned on based on the external sensing control signal Scs having a high voltage level and can supply the first gate driving power GVdd1, supplied through the thirty-sixth TFT T36, to the first control node Q to charge a voltage level of the first gate driving power GVdd1 into the first control node Q.

The third capacitor C3 can be formed between the fourth control node Qm and the first gate driving power line and can store a difference voltage between the fourth control node Qm and the first gate driving power line. For example, a first electrode of the third capacitor C3 can be electrically connected to the fourth control node Qm which is connected to a gate electrode of the thirty-fifth TFT T35 and a gate electrode of the thirty-sixth TFT T36 in common, and a second electrode of the third capacitor C3 can be electrically connected to the first gate driving power line. The third capacitor C3 can store the carry signal CS according to the turn-on of the thirty-third, thirty-fourth, and thirty-fifth TFTs T33 to T35, and when the thirty-third, thirty-fourth, and thirty-fifth TFTs T33 to T35 are turned off, the third capacitor C3 can maintain the voltage of the fourth control node Qm at a high voltage level by using the stored voltage. For example, the third capacitor C3 can maintain the voltage of the fourth control node Qm at a high voltage level by using the stored voltage during one horizontal period.

The sixth node control circuit NCC6 can discharge the voltage of the first control node Q in response to the external sensing reset signal Srst. For example, the sixth node control circuit NCC6 can supply the first gate common power GVss1 to the first control node Q in response to the external sensing reset signal Srst having a high voltage level, thereby resetting or initializing the voltage of the first control node Q.

The sixth node control circuit NCC6 according to an embodiment can include a thirty-eighth TFT T38 and a thirty-ninth TFT T39.

The thirty-eighth TFT T38 can supply the first gate common power GVss1, supplied through the first gate common power line, to the second connection node Nc2 in response to the external sensing reset signal Srst. For example, the thirty-eighth TFT T38 can be turned on based on the external sensing reset signal Srst having a high voltage level and can output the first gate common power GVss1 to the second connection node Nc2.

The thirty-ninth TFT T39 can electrically connect the second connection node Nc2 to the first control node Q in response to the external sensing reset signal Srst. For example, the thirty-ninth TFT T39 can be turned on based on the external sensing reset signal Srst having a high voltage level and can supply the first gate common power GVss1, supplied through the thirty-eighth TFT T38 and the second connection node Nc2, to the first connection node Nc1.

The second connection node Nc2 between the thirty-eighth TFT T38 and the thirty-ninth TFT T39 can be electrically connected to the first connection node Nc1. Therefore, the second connection node Nc2 can be supplied with the first gate driving power GVdd1 through the third TFT T3 of the first node control circuit NCC1. Therefore, the third TFT T3 of the first node control circuit NCC1 can increase a voltage difference between a gate voltage of the thirty-ninth TFT T39 of the sixth node control circuit NCC6 and the voltage of the second connection node Nc2 to turn off the thirty-ninth TFT T39 which has been turned off based on the external sensing reset signal Srst having a low voltage level, and thus, can prevent the voltage drop (or the current leakage) of the first control node Q through the turned-off thirty-ninth TFT T39, thereby stably maintaining the voltage of the first control node Q.

Optionally, the first sensing control circuit SCC1 can be omitted. For example, the first sensing control circuit SCC1 can be a circuit which is used for sensing a characteristic value of a driving TFT disposed in a subpixel of a pixel on the basis of an external sensing mode of the pixel, and when the pixel is not driven in the external sensing mode, the first sensing control circuit SCC1 can be an undesired element and thus can be omitted.

Figure 9:
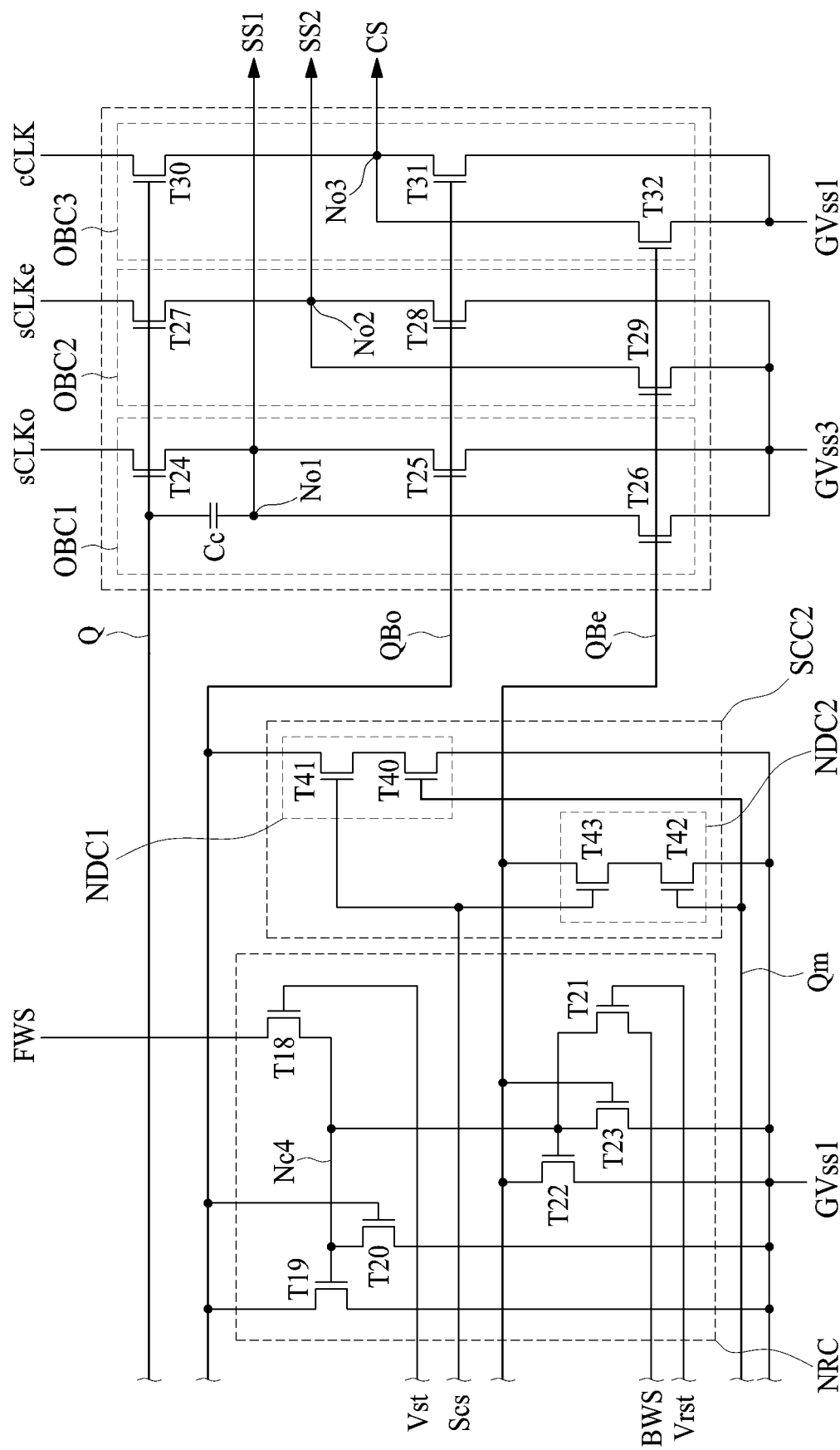
FIG. 9 is a circuit diagram illustrating a node reset circuit, an output buffer circuit, and a second sensing control circuit illustrated in FIG. 7.

FIG. 9 is a circuit diagram illustrating the node reset circuit, the output buffer circuit, and the second sensing control circuit each illustrated in FIG. 7.

Referring to FIGS. 5 to 9, a node reset circuit NRC according to an embodiment can maintain a voltage level of each of a second control node QBo and a third control node QBe while a voltage of a first control node Q has a high voltage level.

The node reset circuit NRC according to an embodiment can include eighth to twenty-third TFTs T18 to T23.

The eighteenth TFT T18 can electrically connect a fourth connection node Nc4 to a forward driving signal line in response to a start signal Vst and a forward driving signal FWS. For example, the eighteenth TFT T18 can be turned on based on the start signal Vst having a high voltage level and can supply the forward driving signal FWS to the fourth connection node Nc4.

The nineteenth TFT T19 can electrically connect a second control node QBo to a first gate common power line in response to a voltage of a fourth connection node Nc4. For example, the nineteenth TFT T19 can be turned on based on a voltage of the fourth connection node Nc4 and can form a current path between the second control node QBo and a first gate common power line to discharge a voltage of the second control node QBo to the first gate common power line, thereby resetting the voltage of the second control node QBo to a voltage level of a first gate common power GVss1.

The twentieth TFT T20 can electrically connect the fourth connection node Nc4 to the first gate common power line in response to the voltage of the second control node QBo. For example, the twentieth TFT T20 can be turned on based on a high voltage level of the second control node QBo and can form a current path between the fourth connection node Nc4 and the first gate common power line to discharge a voltage of the fourth connection node Nc4 to the first gate common power line, thereby resetting the voltage of the fourth connection node Nc4 to the voltage level of the first gate common power GVss1. Accordingly, when the voltage of the second control node QBo has a high voltage level, the twentieth TFT T20 can reset the voltage of the fourth connection node Nc4 to the voltage level of the first gate common power GVss1 to turn off the nineteenth TFT T19, and thus, can prevent the voltage of the second control node QBo from being discharged to the first gate common power line through the nineteenth TFT T19.

The twenty-first TFT T21 can electrically connect the fourth connection node Nc4 to a backward driving signal line in response to a reset signal Vrst and a backward driving signal BWS. For example, the twenty-first TFT T21 can be turned on based on the reset signal Vrst having a high voltage level and can supply the backward driving signal BWS having a high voltage level to the fourth connection node Nc4.

The twenty-second TFT T22 can electrically connect the third control node QBe to the first gate common power line in response to the voltage of the fourth connection node Nc4. For example, the twenty-second TFT T22 can be turned on based on the voltage of the fourth connection node Nc4 and can form a current path between the third control node QBe and the first gate common power line to discharge a voltage of the third control node QBe to the first gate common power line, thereby resetting the voltage of the third control node QBe to the voltage level of the first gate common power GVss1.

The twenty-third TFT T23 can electrically connect the fourth connection node Nc4 to the first gate common power line in response to the voltage of the third control node QBe. For example, the twenty-third TFT T23 can be turned on based on a high voltage level of the third control node QBe and can form a current path between the fourth connection node Nc4 and the first gate common power line to discharge the voltage of the fourth connection node Nc4 to the first gate common power line, thereby resetting the voltage of the fourth connection node Nc4 to the voltage level of the first gate common power GVss1. Accordingly, when the voltage of the third control node QBe has a high voltage level, the twenty-third TFT T23 can reset the voltage of the fourth connection node Nc4 to the voltage level of the first gate common power GVss1 to turn off the twenty-second TFT T22, and thus, can prevent the voltage of the third control node QBe from being discharged to the first gate common power line through the twenty-second TFT T22.

The nineteenth TFT T19 and the twenty-second TFT T22 can be simultaneously turned on or off based on the voltage of the fourth connection node Nc4.

For example, in forward scan driving of the gate driving circuit 150, the nineteenth TFT T19 and the twenty-second TFT T22 can be simultaneously turned on based on a high voltage level of the forward driving signal FWS supplied to the fourth connection node Nc4 through the eighteenth TFT T18 turned on based on the start signal Vst having a high voltage level and can be simultaneously turned off based on the first gate common power GVss1 supplied to the fourth connection node Nc4 through the twentieth TFT T20 turned on based on a high voltage level of the second control node QBo or can be simultaneously turned off based on the first gate common power GVss1 supplied to the fourth connection node Nc4 through the twenty-third TFT T23 turned on based on a high voltage level of the third control node QBe.

As another example, in backward scan driving of the gate driving circuit 150, the nineteenth TFT T19 and the twenty-second TFT T22 can be simultaneously turned on based on a high voltage level of the backward driving signal BWS supplied to the fourth connection node Nc4 through the twenty-first TFT T21 turned on based on the reset signal Vrst having a high voltage level and can be simultaneously turned off based on the first gate common power GVss1 supplied to the fourth connection node Nc4 through the twenty-third TFT T23 turned on based on a high voltage level of the third control node QBe or can be simultaneously turned off based on the first gate common power GVss1 supplied to the fourth connection node Nc4 through the twentieth TFT T20 turned on based on a high voltage level of the second control node QBo.

The output buffer circuit OBC can receive a carry clock cCLK, an odd-numbered scan clock sCLKo, an even-numbered scan clock sCLKe, a first gate common power GVss1, and a third gate common power GVss3 and can output a first scan signal SS1, a second scan signal SS2, and an carry signal CS based on the carry clock cCLK, the scan clock sCLK, the first gate common power GVss1 and the third gate common power GVss3 in response to the voltage of each of the first to third control nodes Q, QBo, and QBe. For example, when the voltage of the first control node Q has a high voltage level, the output buffer circuit OBC can output the carry signal CS corresponding to the carry clock cCLK, the first scan signal SS1 corresponding to the odd-numbered scan clock sCLKo, and the second scan signal SS2 corresponding to the even-numbered scan clock sCLKe.

The output buffer circuit OBC according to an embodiment can include first to third output buffer circuits OBC1 to OBC3.

The first output buffer circuit OBC1 can output the first scan signal SS1 having a voltage level of the odd-numbered scan clock sCLKo or a voltage level of the third gate common power GVss3 on the basis of the voltage of each of the first to third control nodes Q, QBo, and QBe.

The first output buffer circuit OBC1 according to an embodiment can include twenty-fourth to twenty-sixth TFTs T24 to T26 and a coupling capacitor Cc.

The twenty-fourth TFT T24 (or a first pull-up TFT) can transfer the first scan signal SS1 having a high voltage level corresponding to the odd-numbered scan clock sCLKo to the $i^{th}$ gate line GL on the basis of the voltage of the first control node Q. For example, the twenty-fourth TFT T24 can include a gate electrode connected to the first control node Q, a first source/drain electrode connected to the first output node No1 (or a first output terminal), and a second source/drain electrode connected to an odd-numbered scan clock line.

The twenty-fifth TFT T25 (or an odd first pull-down TFT) can transfer the third gate common power GVss3 to the $i^{th}$ gate line GL through the first output node No1 on the basis of the voltage of the second control node QBo. For example, the twenty-fifth TFT T25 can include a gate electrode connected to the second control node QBo, a first source/drain electrode connected to the first output node No1, and a second source/drain electrode connected to a third gate common power line.

The twenty-sixth TFT T26 (or an even first pull-down TFT) can transfer the third gate common power GVss3 to the $i^{th}$ gate line GL through the first output node No1 on the basis of the voltage of the third control node QBe. For example, the twenty-sixth TFT T26 can include a gate electrode connected to the third control node QBe, a first source/drain electrode connected to the first output node No1, and a second source/drain electrode connected to a third gate common power line.

The coupling capacitor Cc can be formed between the first control node Q and the first output node No1. For example, the coupling capacitor Cc can be a parasitic capacitor between a gate electrode of the twenty-fourth TFT T24 and the first output node No1. The coupling capacitor Cc can allow bootstrapping to occur in the first control node Q on the basis of a phase shift (or variation) of the odd-numbered scan clock sCLKo. Accordingly, when the odd-numbered scan clock sCLKo is shifted from a low voltage level to a high voltage level, the voltage of the first control node Q can be boosted to a higher voltage by a high voltage level of the odd-numbered scan clock sCLKo on the basis of bootstrapping caused by coupling between the coupling capacitor Cc and the odd-numbered scan clock sCLKo having a high voltage level. For example, as the odd-numbered scan clock sCLKo having a high voltage level is supplied to the second source/drain electrode of the twenty-fourth TFT T24, the voltage of the first control node Q pre-charged with a voltage level of the forward driving signal FWS by the first node control circuit NCC1 can be boosted to a higher voltage, and thus, the twenty-fourth TFT T24 can be completely turned on and the odd-numbered scan clock sCLKo having a high voltage level can be supplied to, as the first scan signal SS1, the $i^{th}$ gate line GL through the first output node No1 and the turned-on twenty-fourth TFT T24 without voltage loss.

The second output buffer circuit OBC2 can output the second scan signal SS2 having a voltage level of the even-numbered scan clock sCLKe or a voltage level of the third gate common power GVss3 on the basis of the voltage of each of the first to third control nodes Q, QBo, and QBe.

The second output buffer circuit OBC2 according to an embodiment can include twenty-seventh to twenty-ninth TFTs T27 to T29.

The twenty-seventh TFT T27 (or a second pull-up TFT) can transfer the even-numbered scan clock sCLKe to the $i+1^{th}$ gate line GL through a second output node No2 (or a second output terminal), on the basis of the voltage of the first control node Q. For example, the twenty-seventh TFT T27 can include a gate electrode connected to the first control node Q, a first source/drain electrode connected to the second output node No2, and a second source/drain electrode connected to an even-numbered scan clock line. The twenty-seventh TFT T27 can be turned on based on the bootstrapped voltage of the first control node Q, and thus, can transfer the even-numbered scan clock sCLKe having a high voltage level, supplied through an even-numbered scan clock line, to the $i+1^{th}$ gate line GL as the second scan signal SS2 through the second output node No2 without voltage loss.

The twenty-eighth TFT T28 (or an odd second pull-down TFT) can transfer the third gate common power GVss3 to the $i+1^{th}$ gate line GL through the second output node No2 on the basis of the voltage of the second control node QBo. For example, the twenty-eighth TFT T28 can include a gate electrode connected to the second control node QBo, a first source/drain electrode connected to the second output node No2, and a second source/drain electrode connected to the third gate common power line.

The twenty-ninth TFT T29 (or an even second pull-down TFT) can transfer the third gate common power GVss3 to the $i+1^{th}$ gate line GL through the second output node No2 on the basis of the voltage of the third control node QBe. For example, the twenty-ninth TFT T29 can include a gate electrode connected to the third control node QBe, a first source/drain electrode connected to the second output node No2, and a second source/drain electrode connected to the third gate common power line.

The third output buffer circuit OBC3 can output the carry signal CS having a voltage level of the carry clock sCLK or a voltage level of the first gate common power GVss1 on the basis of the voltage of each of the first to third control nodes Q, QBo, and QBe.

The third output buffer circuit OBC3 according to an embodiment can include thirtieth to thirty-second TFTs T30 to T32.

The thirtieth TFT T30 (or a third pull-up TFT) can output, as the carry signal CS, the carry clock cCLK through a third output node No3 (or a carry output terminal), on the basis of the voltage of the first control node Q. For example, the thirtieth TFT T30 can include a gate electrode connected to the first control node Q, a first source/drain electrode connected to the third output node No3, and a second source/drain electrode connected to a carry clock line. The thirtieth TFT T30 can be turned on based on the bootstrapped voltage of the first control node Q and can output, as the carry signal CS, the carry clock cCLK having a high voltage level, supplied through the carry clock line, through the third output node No3 without voltage loss.

The thirty-first TFT T31 (or an odd third pull-down TFT) can output, as the carry signal CS, the first gate common power GVss1 through the third output node No3 on the basis of the voltage of the second control node QBo. For example, the thirty-first TFT T31 can include a gate electrode connected to the second control node QBo, a first source/drain electrode connected to the third output node No3, and a second source/drain electrode connected to the first gate common power line.

The thirty-second TFT T32 (or an even third pull-down TFT) can output, as the carry signal CS, the first gate common power GVss1 through the third output node No3 on the basis of the voltage of the third control node QBe. For example, the thirty-second TFT T32 can include a gate electrode connected to the third control node QBe, a first source/drain electrode connected to the third output node No3, and a second source/drain electrode connected to the first gate common power line.

Alternatively, the coupling capacitor Cc can be formed between the first control node Q and the third output node No3. Furthermore, the coupling capacitor Cc can be formed in at least one of a region between the first control node Q and the first output node No1, a region between the first control node Q and the second output node No2, and a region between the first control node Q and the third output node No3.

The second sensing control circuit SCC2 can be implemented to discharge the voltage of each of the second control node QBo and the third control node QBe in response to the voltage of the fourth control node Qm and the external sensing control signal Scs.

The second sensing control circuit SCC2 according to an embodiment can include a first node discharging circuit NDC1 and a second node discharging circuit NDC2.

The first node discharging circuit NDC1 can discharge the voltage of the second control node QBo in response to the voltage of the fourth control node Qm and the external sensing control signal Scs. For example, the first node discharging circuit NDC1 can supply the first gate common power GVss1 to the second control node QBo in response to the voltage of the fourth control node Qm having a high voltage level and the external sensing control signal Scs having a high voltage level, and thus, can discharge the voltage of the second control node QBo to the first gate common power line or can reset the voltage of the second control node QBo to the first gate common power GVss1.

The first node discharging circuit NDC1 according to an embodiment can include a fortieth TFT T40 and a forty-first TFT T41.

The fortieth TFT T40 can transfer the first gate common power GVss1 to the forty-first TFT T41 in response to the voltage of the fourth control node Qm. For example, the fortieth TFT T40 can be turned on based on a high voltage level of the fourth control node Qm and can form a current path between the forty-first TFT T41 and the first gate common power GVss1.

The forty-first TFT T41 can electrically connect the second control node QBo to the fortieth TFT T40 in response to the external sensing control signal Scs. For example, the forty-first TFT T41 can be turned on based on the external sensing control signal Scs having a high voltage level and can form a current path between the second control node QBo and the fortieth TFT T40. The forty-first TFT T41 can be turned on based on the external sensing control signal Scs having a high voltage level in a state where the fortieth TFT T40 is turned on based on a high voltage level of the fourth control node Qm, and thus, the voltage of the second control node QBo can be discharged to the first gate common power line or can be reset to the first gate common power GVss1 through each of the forty-first TFT T41 and the fortieth TFT T40.

The second node discharging circuit NDC2 can discharge the voltage of the third control node QBe in response to the voltage of the fourth control node Qm and the external sensing control signal Scs. For example, the second node discharging circuit NDC2 can supply the first gate common power GVss1 to the third control node QBe in response to the voltage of the fourth control node Qm having a high voltage level and the external sensing control signal Scs having a high voltage level, and thus, can discharge the voltage of the third control node QBe to the first gate common power line or can reset the voltage of the third control node QBe to the first gate common power GVss1

The second node discharging circuit NDC2 according to an embodiment can include a forty-second TFT T42 and a forty-third TFT T43.

The forty-second TFT T42 can transfer the first gate common power GVss1 to the forty-third TFT T43 in response to the voltage of the fourth control node Qm. For example, the forty-second TFT T42 can be turned on based on a high voltage level of the fourth control node Qm and can form a current path between the forty-third TFT T43 and the first gate common power GVss1.

The forty-third TFT T43 can electrically connect the third control node QBe to the forty-second TFT T42 in response to the external sensing control signal Scs. For example, the forty-third TFT T43 can be turned on based on the external sensing control signal Scs having a high voltage level and can form a current path between the third control node QBe and the forty-second TFT T42. The forty-third TFT T43 can be turned on based on the external sensing control signal Scs having a high voltage level in a state where the forty-second TFT T42 is turned on based on a high voltage level of the fourth control node Qm, and thus, the voltage of the third control node QBe can be discharged to the first gate common power line or can be reset to the first gate common power GVss1 through each of the forty-third TFT T43 and the forty-second TFT T42.

Alternatively, the second sensing control circuit SCC2 can be omitted along with the first sensing control circuit SCC1. For example, each of the first sensing control circuit SCC1 and the second sensing control circuit SCC2 can be a circuit which is used for sensing a characteristic value of a driving TFT disposed in a subpixel of a pixel on the basis of an external sensing mode of the pixel, and when the pixel is not driven in the external sensing mode, each of the first sensing control circuit SCC1 and the second sensing control circuit SCC2 can be an undesired element and thus can be omitted.

The first to forty-third TFTs T1 to T43 illustrated in FIGS. 8 and 9 can be separately disposed (or distributedly disposed) in one horizontal line of the display area AA and can be connected to one another through the branch network BN, and thus, can configure the plurality of branch circuits BC1 to BCn illustrated in FIG. 5. For example, one of stage circuits STC1 to STCx can include first to $n^{th}$ (where n is 43) branch circuits BC1 to BCn where the first to forty-third TFTs T1 to T43 is disposed or provided, but is not limited thereto and each of the plurality of branch circuits BC1 to BCn can be implemented with at least one of the first to forty-third TFTs T1 to T43 on the basis of the number of pixels disposed in one horizontal line.

Additionally, in the stage circuit STC illustrated in FIGS. 5 to 9, when the first switching TFT Tsw1 and the second switching TFT Tsw2 disposed in the pixel circuit PC of each of the plurality of subpixels SP1 to SP4 illustrated in FIGS. 3 and 4 are turned on based on different first and second scan signals, the first scan signal SS1 can be used as a first scan signal supplied through a first gate line of the odd-numbered gate line GLo and the second scan signal SS2 can be used as the first scan signal supplied through a first gate line of the even-numbered gate line GLe. Therefore, the output buffer circuit OBC of the stage circuit STC illustrated in FIGS. 7 and 9 can further include a fourth output buffer circuit and a fifth output buffer circuit.

The fourth output buffer circuit can be implemented to output a second scan signal to a second gate line of the odd-numbered gate line GLo, and the fifth output buffer circuit can be implemented to output the second scan signal to a second gate line of the even-numbered gate line GLe.

The fourth output buffer circuit according to an embodiment can output an $i^{th}$ second scan signal having a voltage level of a second scan odd-numbered scan clock or a voltage level of the third gate common power GVss3 on the basis of the voltage of each of the first to third control nodes Q, QBo, and QBe. Except for that the fourth output buffer circuit outputs the $i^{th}$ second scan signal on the basis of the second scan odd-numbered scan clock, the fourth output buffer circuit can include three TFTs which are substantially the same as those of the first output buffer circuit OBC1 illustrated in FIG. 9, and thus, its detailed description is omitted or may be brief.

The fifth output buffer circuit according to an embodiment can output an $i+1^{th}$ second scan signal having a voltage level of a second scan even-numbered scan clock or a voltage level of the third gate common power GVss3 on the basis of the voltage of each of the first to third control nodes Q, QBo, and QBe. Except for that the fifth output buffer circuit outputs the $i+1^{th}$ second scan signal on the basis of the second scan even-numbered scan clock, the fifth output buffer circuit can include three TFTs which are substantially the same as those of the second output buffer circuit OBC2 illustrated in FIG. 9, and thus, its detailed description is omitted or may be brief.

In the stage circuit STC illustrated in FIGS. 7 to 9, the odd-numbered scan clock sCLKo can be referred to as a first scanning odd-numbered scan clock, and the even-numbered scan clock sCLKe can be referred to as a first scanning even-numbered scan clock. For example, a first scanning scan clock and a second scanning scan clock can have the same phase or different phases. Also, the first scanning scan clock and the second scanning scan clock can have the same clock width or different clock widths.

Figure 10:
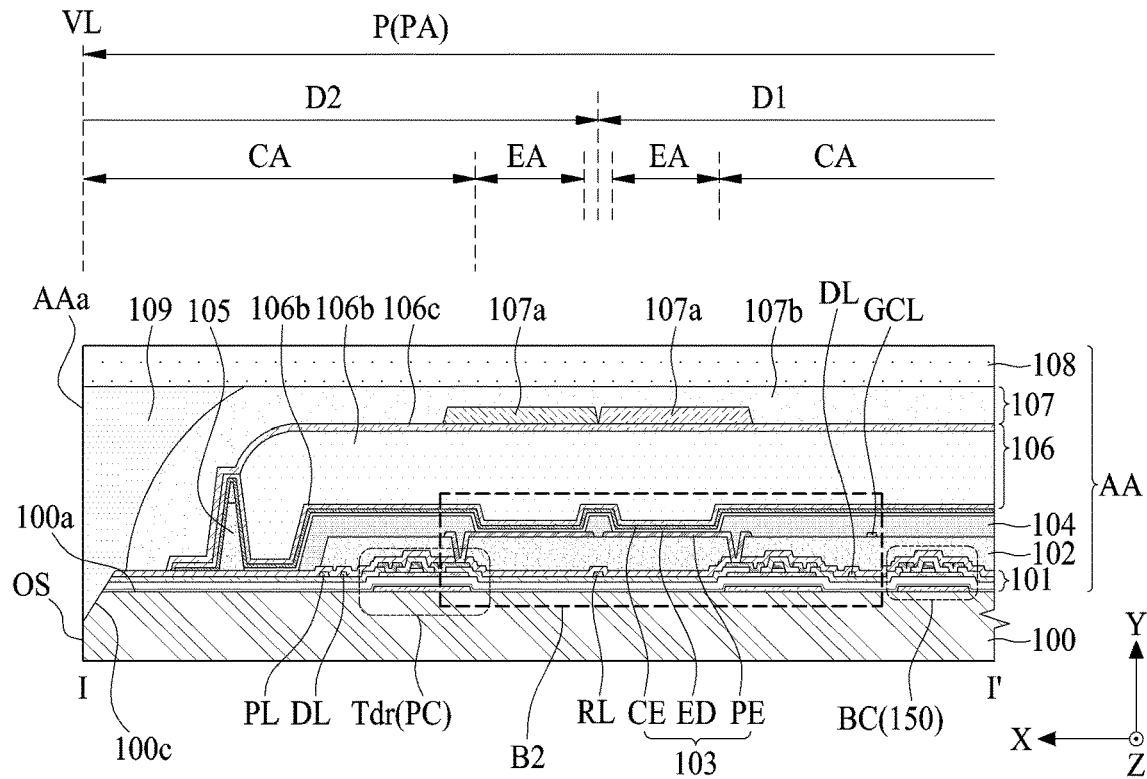
FIG. 10 is a cross-sectional view taken along line I-I' illustrated in FIG. 3.
Figure 11:
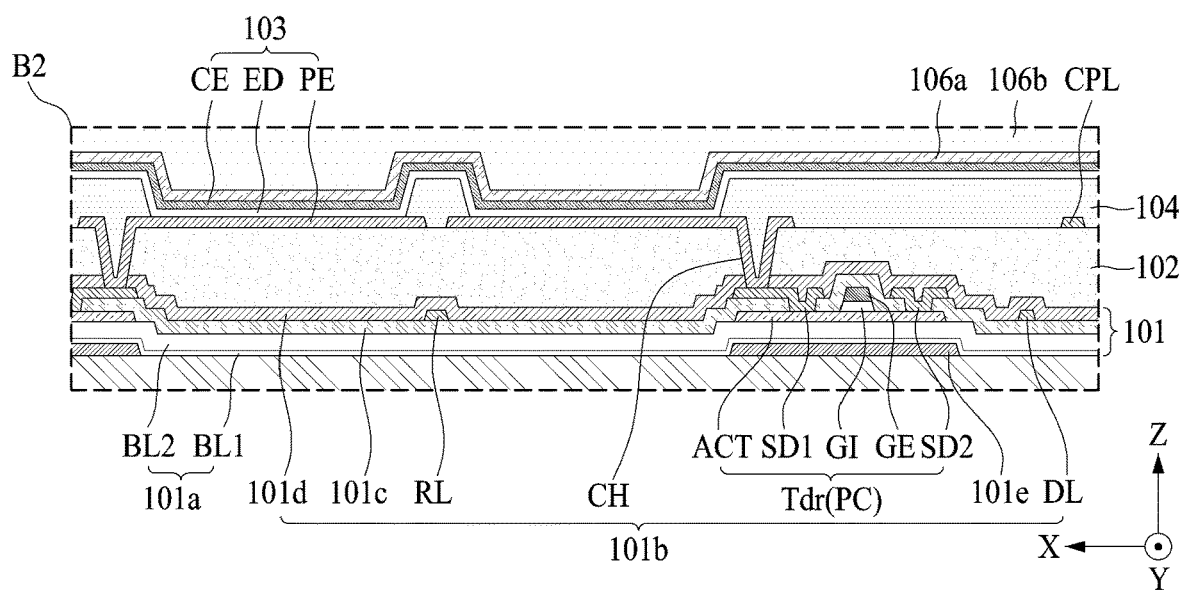
FIG. 11 is an enlarged view of a region 'B2' illustrated in FIG. 10.

FIG. 10 is a cross-sectional view taken along line I-I' illustrated in FIG. 3, and FIG. 11 is an enlarged view of a region 'B2' illustrated in FIG. 10. FIGS. 10 and 11 are diagrams for describing a cross-sectional structure of the substrate of a display apparatus according to the present disclosure. In describing FIGS. 10 and 11, elements which are the same or correspond to the elements of FIGS. 3 and 4 are referred to by like reference numerals, and their repetitive descriptions are omitted or will be briefly described below.

Referring to FIGS. 3, 4, 10, and 12, in display apparatus according to the present disclosure, the substrate 100 can include a circuit layer 101, a planarization layer 102, a light emitting device layer 103, a bank 104, a dam pattern 105, and an encapsulation layer 106.

The circuit layer 101 can be disposed on a first surface 100a of the substrate 100. The circuit layer 101 can be referred to as a pixel array layer or a TFT array layer.

The circuit layer 101 according to an embodiment can include a buffer layer 101a and a circuit array layer 101b.

The buffer layer 101a can prevent materials, such as hydrogen included in the substrate 100, from being diffused to the circuit array layer 101b in a high temperature process of a process of manufacturing a TFT. Also, the buffer layer 101a can prevent external water or moisture from penetrating into the light emitting device layer 103. For example, the buffer layer 101a can include a first buffer layer BL1 which includes SiNx and is disposed on the substrate 100 and a second buffer layer BL2 which includes SiOx and is disposed on the first buffer layer BL1.

The pixel array layer 101b can include a plurality of pixel driving lines GL, DL, PL, RL, CPL, PSL, RDL, and LCP disposed on the buffer layer 101a and a pixel circuit PC which includes a driving TFT Tdr disposed in each of a plurality of pixel areas PA on the buffer layer 101a.

The driving TFT Tdr disposed in each pixel area PA can include an active layer ACT, a gate insulation layer GI, a gate electrode GE, an interlayer insulation layer 101c, a first source/drain electrode SD1, a second source/drain electrode SD2, and a passivation layer 101d.

The active layer ACT can be disposed on the buffer layer 101a in each pixel area PA. The active layer ACT can include a channel area, overlapping the gate electrode GE, and a first source/drain area and a second source/drain area parallel to each other between adjacent channel areas. The active layer ACT can have conductivity in a conductivity process, and thus, can be used as a bridge line of a jumping structure which directly connects lines in the display area AA or electrically connects lines disposed on different layers.

The gate insulation layer GI can be disposed in the channel area of the active layer ACT. The gate insulation layer GI can insulate the active layer ACT from the gate electrode GE.

The gate electrode GE can be disposed on the gate insulation layer GI. The gate electrode GE can overlap the channel area of the active layer ACT with the gate insulation layer GI therebetween.

The gate electrode GE according to an embodiment can have a single-layer structure or a multi-layer structure including at least one of molybdenum (Mo), titanium (Ti), a Mo—Ti alloy (MoTi), and copper (Cu).

Each of gate lines GL, power sharing lines PSL, line connection patterns LCP, and a reference branch line RDL among the pixel driving lines GL, DL, PL, RL, CPL, PSL, RDL, and LCP can include the same material as that of the gate electrode GE, but is not limited thereto.

The interlayer insulation layer 101c can be disposed on the substrate 100 to cover the gate electrode GE and the active layer ACT. The interlayer insulation layer 101c can electrically insulate (or isolate) the gate electrode GE from the source/drain electrodes SD1 and SD2.

The first source/drain electrode SD1 can be disposed on the interlayer insulation layer 101c overlapping the first source/drain area of the active layer ACT and can be electrically connected to the first source/drain area of the active layer ACT through a first source/drain contact hole disposed in the interlayer insulation layer 101c. For example, the first source/drain electrode SD1 can be a source electrode of the driving TFT Tdr, and the first source/drain area of the active layer ACT can be a source area.

The second source/drain electrode SD2 can be disposed on the interlayer insulation layer 101c overlapping the second source/drain area of the active layer ACT and can be electrically connected to the second source/drain area of the active layer ACT through a second source/drain contact hole disposed in the interlayer insulation layer 101c. For example, the second source/drain electrode SD2 can be a drain electrode of the driving TFT Tdr, and the second source/drain area of the active layer ACT can be a drain area.

The source/drain electrodes SD1 and SD2 according to an embodiment can have a single-layer structure or a multi-layer structure including the same material as that of the gate electrode GE.

Each of data lines DL, pixel driving power lines PL, and reference power lines RL among the pixel driving lines GL, DL, PL, RL, CPL, PSL, RDL, and LCP can include the same material as that of the source/drain electrode SD1 and SD2, but is not limited thereto. Also, each line of a gate control line group GCL can include the same material as that of the source/drain electrode SD1 and SD2, but is not limited thereto.

A passivation layer 101d can be disposed on a first surface 100a of the substrate 100 to cover the pixel circuit PC including the driving TFT Tdr. The passivation layer 101d according to an embodiment can include SiOx, SiNx, SiON, or a multilayer thereof, but is not limited thereto.

Each of first and second switching TFTs Tsw1 and Tsw2 configuring the pixel circuit PC can be formed along with the driving TFT Tdr, and thus, their detailed descriptions are omitted or may be brief.

The circuit layer 101 according to an embodiment can further include a light blocking layer 101e which is disposed under the active layer ACT of each of the TFTs Tdr, Tsw1, and Tsw2 configuring the pixel circuit PC.

The light blocking layer (or a light blocking pattern) 101e can be disposed in an island shape between the substrate 100 and the active layer ACT. The light blocking layer 101e can be covered by the buffer layer 101a. The light blocking layer 101e can block light which is incident on the active layer ACT through the substrate 100, thereby preventing or minimizing a threshold voltage variation of each TFT caused by external light. Optionally, the light blocking layer 101e can be electrically connected to the first source/drain electrode SD1 of a corresponding TFT and thus can act as a lower gate electrode of the corresponding TFT, and in this case, a characteristic variation of each TFT caused by light and a threshold voltage variation of each TFT caused by a bias voltage can be minimized or prevented.

Moreover, the light blocking layer 101e can be used as at least one of the power sharing lines PSL, the line connection patterns LCP, and the reference branch line RDL among the pixel driving lines GL, DL, PL, RL, CPL, PSL, RDL, and LCP, but is not limited thereto.

The gate driving circuit 150 illustrated in FIGS. 5 to 9 can be formed along with the driving TFT Tdr of the pixel circuit PC. For example, a plurality of TFTs configuring each of the stage circuit STC1 to STCx of each of the stage circuit units 1501 to 150m of the gate driving circuit 150 can be formed along with the driving TFT Tdr, and thus, the plurality of branch circuits BC1 to BCn disposed in each horizontal line on the substrate 100 can be implemented. The first to fourth control nodes Q, QBo, QBe, and Qm configuring the branch network BN disposed at each of the stage circuit STC1 to STCx of each of the stage circuit units 1501 to 150m can be formed along with the gate line GL. Also, a network line NL configuring the branch network BN of each of the stage circuit units 1501 to 150m can be formed along with at least one of the light blocking layer 101e, the gate line GL, and the data line DL on the basis of a position of a connection portion of each of the branch circuits BC1 to BCn to be connected, but is not limited thereto.

The planarization layer 102 can be disposed on the first surface 100a of the substrate 100 and can provide a flat surface on the circuit layer 101. The planarization layer 102 can cover the circuit layer 101 including the driving TFT Tdr disposed in each of the plurality of pixel areas PA. The planarization layer 102 according to an embodiment can include acryl resin, epoxy resin, phenolic resin, polyamides resin, or polyimides resin, but is not limited thereto.

The planarization layer 102 according to an embodiment can be formed to cover the circuit layer 101 except an edge portion of the first surface 100a of the substrate 100. Therefore, the passivation layer 101d of the circuit layer 101 disposed at the edge portion of the first surface 100a of the substrate 100 can be exposed without being exposed by the planarization layer 102.

The light emitting device layer 103 can be disposed on the planarization layer 102 and can emit light toward the first surface 100a of the substrate 100 on the basis of a top emission type.

The light emitting device layer 103 according to an embodiment can include a pixel electrode PE, a light emitting device ED, and a common electrode CE.

The pixel electrode PE can be referred to as an anode electrode, a reflective electrode, a lower electrode, or a first electrode of the light emitting device layer 103.

The pixel electrode PE can be disposed on the planarization layer 102 overlapping an emission area EA of each of the plurality of pixel areas PA. The pixel electrode PE can be patterned and disposed in an island shape in each pixel area PA and can be electrically connected to the first source/drain electrode SD1 of the driving TFT Tdr of a corresponding pixel circuit PC. One side of the pixel electrode PE can extend from the emission area EA of the pixel area PA to the first source/drain electrode SD1 of the driving TFT Tdr disposed in a circuit area CA and can be electrically connected to the first source/drain electrode SD1 of the driving TFT Tdr through a contact hole CH provided in the passivation layer 101d and the planarization layer 102.

The pixel electrode PE according to an embodiment can include a metal material which is low in work function and is good in reflective efficiency. For example, the pixel electrode PE can be formed in a three-layer structure of IZO/MoTi/ITO or ITO/MoTi/ITO, or can be formed in a four-layer structure of ITO/Cu/MoTi/ITO.

Optionally, the line connection patterns LCP among the pixel driving lines GL, DL, PL, RL, CPL, PSL, RDL, and LCP can be formed of the same material along with the pixel electrode PE, but are not limited thereto. Also, pads of a pad part 110 disposed on the substrate 100 can be formed of the same material along with the pixel electrode PE, but are not limited thereto.

The light emitting device ED can be formed on the pixel electrode PE and can directly contact the pixel electrode PE. The light emitting device ED can be a common layer which is formed in common in each of a plurality of subpixels SP so as not to be distinguished by subpixel SP units. The light emitting device ED can react on a current flowing between the pixel electrode PE and the common electrode CE to emit white light. The light emitting device ED according to an embodiment can include an organic light emitting device or an inorganic light emitting device, or can include a stacked or combination structure of an organic light emitting device (or an inorganic light emitting device) and a quantum dot light emitting device.

An organic light emitting device according to an embodiment can include two or more light emitting material layers (or a light emitting portion) for emitting white light. For example, the organic light emitting device can include a first light emitting material layer and a second light emitting material layer, for emitting white light on the basis of a combination of first light and second light. Here, the first light emitting material layer can include at least one of a blue light emitting material, a green light emitting material, a red light emitting material, a yellow light emitting material, and a yellow-green light emitting material. The second light emitting material layer can include at least one of a blue light emitting material, a green light emitting material, a red light emitting material, a yellow light emitting material, and a yellow-green light emitting material, for emitting second light which is combined with first light to generate white light.

The organic light emitting device according to an embodiment can further include one or more function layers for enhancing emission efficiency and/or lifetime. For example, the function layer can be disposed upper and/or under a light emitting material layer.

An inorganic light emitting device according to an embodiment can include a semiconductor light emitting diode, a micro light emitting diode, or a quantum dot light emitting diode. For example, when the light emitting device ED is the inorganic light emitting device, the light emitting device ED can have a scale of 1 μm or 100 μm, but is not limited thereto.

The common electrode CE can be referred to as a cathode electrode, a transparent electrode, an upper electrode, or a second electrode of the light emitting device layer 103. The common electrode CE can be formed on the light emitting device ED and can directly contact the light emitting device ED or can electrically and directly contact the light emitting device ED. The common electrode CE can include a transparent conductive material which transmits light emitted from the light emitting device ED.

The common electrode CE according to an embodiment can be formed in a single-layer structure or a multi-layer structure, which includes at least one material of graphene or a transparent conductive material which is relatively high in work function. For example, the common electrode CE can include metal oxide such as ITO or IZO, or can include a combination of oxide and metal such as ZnO:Al or $SnO_2$:Sb.

Additionally, by adjusting a refractive index of light emitted from the light emitting device ED, a capping layer for enhancing the emission efficiency of light can be further disposed on the common electrode CE.

The bank 104 can be disposed on the planarization layer 102 to cover an edge portion of the pixel electrode PE. The bank 104 can define an emission area EA (or an opening portion) of each of the plurality of subpixels SP and can electrically isolate pixel electrodes PE disposed in adjacent subpixels SP. The bank 104 can be formed to cover a contact hole CH disposed in each of the plurality of pixel areas PA. The bank 104 can be covered by the light emitting device ED. For example, the bank 104 according to an embodiment can include a transparent material or an opaque material including a black pigment.

The dam pattern 105 can be disposed on the circuit layer 101 at an edge portion of the substrate 100 to have a closed loop shape or a closed loop line shape. For example, the dam pattern 105 can be disposed on a passivation layer 101*d* of the circuit layer 101. The dam pattern 105 can prevent the spread or overflow of the encapsulation layer 106. The dam pattern 105 can be included within a plurality of pixels P (or outermost pixels Po (or an outermost pixel area PAo) disposed at an edge portion of the substrate). In this case, a portion of the dam pattern 105 can be disposed (or implemented) between the pad part 110 disposed in the substrate 100 and an emission area EA of each of the outermost pixels Po (or the outermost pixel area PAo).

The dam pattern 105 according to an embodiment can include the same material along with the planarization layer 102. The dam pattern 105 can have the same height (or thickness) as that of the planarization layer 102, or can have a height which is higher than the planarization layer 102. For example, a height (or thickness) of the dam pattern 105 can be twice a height (or thickness) of the planarization layer 102.

According to another embodiment, the dam pattern 105 can include a lower dam pattern, which is formed of the same material along with the planarization layer 102, and an upper dam pattern which is stacked on the lower dam pattern and includes the same material as that of the bank 104. The lower dam pattern can have the same height (or thickness) as that of the planarization layer 102, or can have a height which is higher than the planarization layer 102. For example, a height (or thickness) of the lower dam pattern can be twice a height (or thickness) of the planarization layer 102.

The light emitting device ED including an organic light emitting device can be implemented in only an internal region (or an inner region) surrounded by the dam pattern 105. For example, the light emitting device ED including an organic light emitting device can be disposed at a portion other than a portion between an outer surface OS of the substrate 100 and the dam pattern 105 in the first surface 100*a* of the substrate 100, and may not be disposed between the outer surface OS of the substrate 100 and the dam pattern 105 and on a top surface of the dam pattern 105. Also, the common electrode CE of the light emitting device layer 103 can be implemented to cover the light emitting device ED and the dam pattern 105.

The encapsulation layer 106 can be disposed on a portion other than an outermost edge portion of the first surface 100*a* of the substrate 100 to cover the light emitting device layer 103. For example, the encapsulation layer 106 can be implemented to surround all of a front surface and lateral surfaces of the light emitting device layer 103.

The encapsulation layer 106 according to an embodiment can include first to third encapsulation layer 106*a* to 106*c*.

The first encapsulation layer 106*a* can be implemented to prevent oxygen or water from penetrating into the light emitting device layer 103. The first encapsulation layer 106*a* can be disposed on the common electrode CE to surround the light emitting device layer 103. Therefore, all of the front surface of lateral surfaces of the light emitting device layer 103 can be surrounded by the first encapsulation layer 106*a*. For example, an end of the first encapsulation layer 106*a* can be disposed between the outer surface OS of the substrate 100 and the dam pattern 105. The first encapsulation layer 106*a* can directly contact a top surface of the passivation layer 101*d* at an outer periphery of the dam pattern 105 and can cover a boundary portion (or an interface) between the common electrode CE and the passivation layer 101*d*, thereby preventing or minimizing lateral water penetration.

The first encapsulation layer 106*a* according to an embodiment can include an inorganic material.

The second encapsulation layer 106*b* can be implemented on the first encapsulation layer 106*a* to have a thickness which is relatively thicker than that of the first encapsulation layer 106*a*. The second encapsulation layer 106*b* can have a thickness for sufficiently covering undesired particles (or an undesired material or an undesired structure) on the first encapsulation layer 106*a*. The second encapsulation layer 106*b* can spread to an edge portion of the first surface 100*a* of the substrate 100 due to a relatively thick thickness, but the spread of the second encapsulation layer 106*b* can be blocked by the dam pattern 105. For example, an end of the second encapsulation layer 106*b* can directly contact the first encapsulation layer 106*a* on the dam pattern 105. Accordingly, the second encapsulation layer 106*b* can be disposed on only the first encapsulation layer 106*a* in an internal region (or an inner region) surrounded by the dam pattern 105. The second encapsulation layer 106*b* can be referred to as a particle cover layer. The second encapsulation layer 106*b* according to an embodiment can include an organic material such as SiOCz acryl or epoxy-based resin.

The third encapsulation layer 106*c* can be implemented to primarily prevent oxygen or water from penetrating into the light emitting device layer 103. The third encapsulation layer 106*c* can be implemented to surround all of the second encapsulation layer 106*b* and the first encapsulation layer 106*a* uncovered by the second encapsulation layer 106*b*. For example, an end of the third encapsulation layer 106*c* can be disposed between the end of the first encapsulation layer 106*a* and the outer surface OS of the substrate 100 and can directly contact the passivation layer 101*d*. The third encapsulation layer 106*c* can directly contact a top surface of the passivation layer 101*d* and can cover a boundary portion (or an interface) between the first encapsulation layer 106*a* and the passivation layer 101*d*, thereby additionally preventing or minimizing lateral water penetration. The third encapsulation layer 106*c* according to an embodiment can include an inorganic material.

The substrate 100 according to an embodiment can further include a wavelength conversion layer 107.

The wavelength conversion layer 107 can convert a wavelength of light incident from the emission area EA of each of the plurality of pixel areas PA. For example, the wavelength conversion layer 107 can convert white light, which is incident from the emission area EA, into colored light corresponding to a corresponding pixel P.

The wavelength conversion layer 107 according to an embodiment can include a plurality of wavelength conversion patterns 107*a* and a protection layer 107*b*.

The plurality of wavelength conversion patterns 107*a* can be disposed on the encapsulation layer 106 disposed in the emission area EA of each of the plurality of pixel areas PA. The plurality of wavelength conversion patterns 107*a* can be divided (or classified) into a red light filter which converts white light into red light, a green light filter which converts white light into green light, and a blue light filter which converts white light into blue light. For example, the plurality of wavelength conversion patterns 107*a* can be divided (or classified) into the red light filter (or a first light filter) disposed in the first subpixel SP1, the green light filter (or a second light filter) disposed in the second subpixel SP2, and the blue light filter (or a third light filter) disposed in the fourth subpixel SP4.

The protection layer 107*b* can be implemented to cover the wavelength conversion patterns 107*a* and to provide a flat surface on the wavelength conversion patterns 107*a*. The protection layer 107b can be disposed to cover the wavelength conversion patterns 107a and the encapsulation layer 106 where the wavelength conversion patterns 107a are not disposed. The protection layer 107b according to an embodiment can include an organic material. Optionally, the protection layer 107b can further include a getter material for adsorbing water and/or oxygen.

Alternatively, the wavelength conversion layer 107 can be changed to a wavelength conversion sheet having a sheet form and can be disposed on the encapsulation layer 106. In this case, the wavelength conversion sheet (or a quantum dot sheet) can include the wavelength conversion patterns 107a disposed between a pair of films. For example, when the wavelength conversion layer 107 includes a quantum dot which re-emits colored light set in a subpixel, the light emitting device layer 103 of a subpixel can be implemented to emit white light or blue light.

The substrate 100 according to an embodiment can further include a functional film 108.

The functional film 108 can be disposed on the wavelength conversion layer 107. For example, the functional film 108 can be coupled to the wavelength conversion layer 107 by a transparent adhesive member.

The functional film 108 according to an embodiment can include an anti-reflection layer (or an anti-reflection film) for preventing reflection of external light to enhance outdoor visibility and a contrast ratio with respect to an image displayed by the display panel. For example, the anti-reflection layer can include a circular polarization layer (or a circular polarization film) which prevents external light, reflected by TFTs and/or the pixel driving lines disposed on the substrate 100, from traveling to the outside.

The functional film 108 according to an embodiment can further include a barrier layer (or a barrier film) for primarily preventing the penetration of water or oxygen, and the barrier layer can include a material (for example, a polymer material) which is low in water transmission rate.

The functional film 108 according to an embodiment can further include a light path control layer (or a light path control film) for controlling a path of light output from each pixel P to the outside. The light path control layer can include a stacked structure where a high refraction layer and a low refraction layer are alternately stacked and can change a path of light incident from each pixel P to minimize a color shift based on a viewing angle.

The substrate 100 according to an embodiment can further include a side sealing member 109.

The side sealing member (or an edge sealing member) 109 can be formed between the substrate 100 and the functional film 108 and can cover all of side (or lateral) surfaces of each of the circuit layer 101, the planarization layer 103, and the wavelength conversion layer 107. For example, the side sealing member 109 can cover all of side surfaces of each of the circuit layer 101, the planarization layer 103, and the wavelength conversion layer 107 which are exposed at the outside of the display apparatus, between the functional film 108 and the substrate 100. Also, the side sealing member 109 can cover a first chamfer 100c which is formed (or disposed) at a corner portion between the first surface 100a and the outer surface OS of the substrate 100 through a chamber process. For example, each of the outermost outer surface of the substrate 100, an outer surface of the side sealing member 109, and an outer surface of the functional film 108 can be disposed (or aligned) on the same vertical line VL.

The side sealing member 109 according to an embodiment can include a silicon-based or ultraviolet (UV)-curable sealant (or resin), but considering a tack process time, the side sealing member 109 can include the UV-curable sealant. Also, the side sealing member 109 can have a color (for example, blue, red, bluish green, or black), but is not limited thereto and can include a colored resin or a light blocking resin for preventing lateral light leakage. The side sealing member 109 can prevent lateral light leakage by absorbing light, traveling from an inner portion of the wavelength conversion layer 107 to an outer surface thereof, of light emitted from the light emitting device ED of each subpixel SP. Particularly, the side sealing member 109 overlapping the pad part of the substrate 100 can prevent or minimize the reflection of external light caused by the pad disposed in the pad part.

Optionally, the side sealing member 109 can further include a getter material for adsorbing water and/or oxygen.

Figure 12:
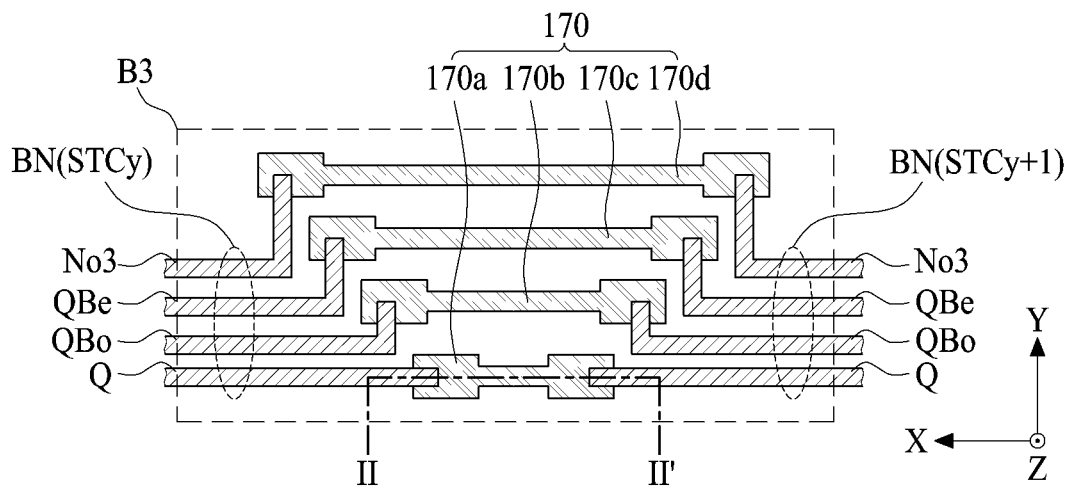
FIG. 12 is an enlarged view of a region 'B3' illustrated in FIG. 5.
Figure 13:
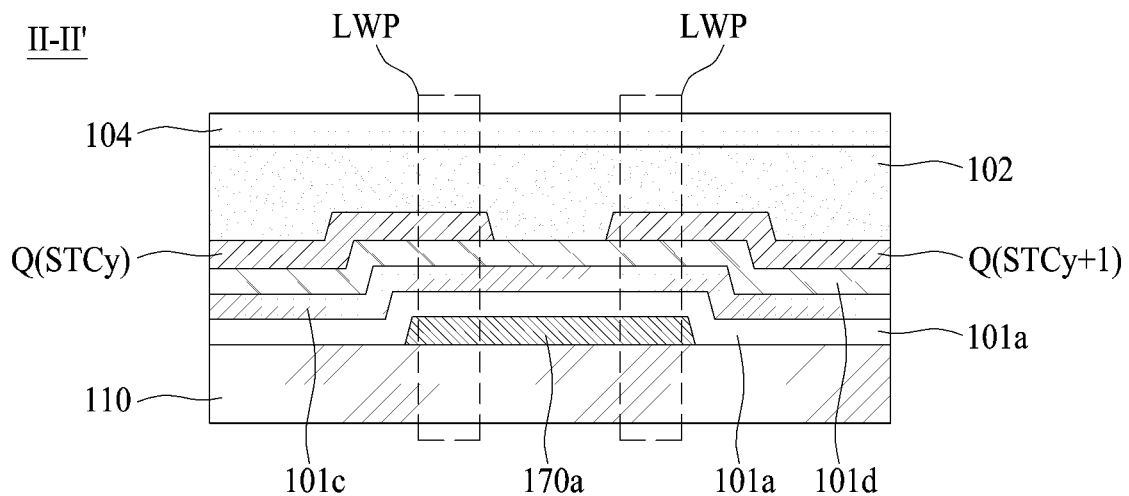
FIG. 13 is a cross-sectional view taken along line II-II' illustrated in FIG. 12.

FIG. 12 is an enlarged view of a region 'B3' illustrated in FIG. 5, and FIG. 13 is a cross-sectional view taken along line II-IP illustrated in FIG. 12. FIGS. 12 and 13 are for describing a circuit repair portion.

Referring to FIGS. 12 and 13, a plurality of circuit repair portions 170 according to an embodiment of the present disclosure can each include a plurality of control node repair patterns 170a to 170c disposed between branch networks BN of each of the first to $x^{th}$ stage circuits STC1 to STCx.

Each of the plurality of control node repair patterns 170a to 170c according to an embodiment can be disposed on the substrate 100 to overlap a branch network BN of each of two stage circuits STC adjacent to each other along a first direction X. Each of the plurality of control node repair patterns 170a to 170c according to an embodiment can be disposed on a layer differing from the branch network BN with an insulation layer (or an insulation film) therebetween. For example, when the branch network BN is disposed on the same layer as a source/drain electrode of a TFT, each of the plurality of control node repair patterns 170a to 170c can be disposed on the same layer as a light blocking layer, or can be disposed on the same layer as a pixel electrode.

According to an embodiment, a first control node repair pattern 170a among the plurality of control node repair patterns 170a to 170c can be disposed on the substrate 100 to overlap each of a first control node Q of a branch network BN disposed in the $y^{th}$ stage circuit STCy among the first to $x^{th}$ stage circuits STC1 to STCx and a first control node Q of a branch network BN disposed in the $y+1^{th}$ stage circuit STCy+1 among the first to $x^{th}$ stage circuits STC1 to STCx. In this case, the first control nodes Q of the $y^{th}$ stage circuit STCy and the $y+1^{th}$ stage circuit STCy+1 can be apart from each other on the first control node repair pattern 170a, or can be electrically disconnected from each other.

A second control node repair pattern 170b among the plurality of control node repair patterns 170a to 170c can be disposed on the substrate 100 to overlap a second control node QBo of each of the $y^{th}$ stage circuit STCy and the $y+1^{th}$ stage circuit STCy+1. In this case, the second control nodes QBo of the $y^{th}$ stage circuit STCy and the $y+1^{th}$ stage circuit STCy+1 can be apart from each other on the second control node repair pattern 170b, or can be electrically disconnected from each other.

A third control node repair pattern 170c among the plurality of control node repair patterns 170a to 170c can be disposed on the substrate 100 to overlap a third control node QBe of each of the $y^{th}$ stage circuit STCy and the $y+1^{th}$ stage circuit STCy+1. In this case, the third control nodes QBe of the $y^{th}$ stage circuit STCy and the $y+1^{th}$ stage circuit STCy+1 can be apart from each other on the third control node repair pattern 170c, or can be electrically disconnected from each other.

Each of the plurality of circuit repair portions 170 according to an embodiment can further include a carry output repair pattern 170d which is disposed between carry output terminals No3 of each of the first to $x^{th}$ stage circuits STC1 to STCx.

The carry output repair pattern 170d can be disposed on the substrate 100 to overlap carry output terminals No3 of each of the $y^{th}$ stage circuit STCy and the $y+1^{th}$ stage circuit STCy+1. In this case, the carry output terminals No3 of the $y^{th}$ stage circuit STCy and the $y+1^{th}$ stage circuit STCy+1 can be apart from each other on the carry output repair pattern 170d, or can be electrically disconnected from each other.

An overlap region between each of the control node repair patterns 170a to 170c and the first to third control nodes Q, QBo, and QBe can be defined as a laser welding portion LWP. Also, an overlap region between the carry output repair pattern 170d and the carry output repair pattern 170d can be defined as a laser welding portion LWP. For example, the control node repair patterns 170a to 170c and the first to third control nodes Q, QBo, and QBe disposed in the laser welding portion LWP can be welded by a laser beam irradiated thereon in the laser repair process, and thus, can be electrically and respectively connected to one another. When the $y^{th}$ stage circuit STCy operates abnormally or is not driven, each of the control node repair patterns 170a to 170c and the carry output terminal No3 can act as a jumping line (or a bridge line) for electrically connecting each of the first to third control nodes Q, QBo, and QBe and the carry output terminal No3, disposed in the $y^{th}$ stage circuit STCy, to each of the first to third control nodes Q, QBo, and QBe and the carry output terminal No3 disposed in the $y+1^{th}$ stage circuit STCy+1.

Additionally, each of the plurality of circuit repair portions 170 according to an embodiment of the present disclosure can further include a first scan output repair pattern, disposed between first scan output terminals No1 of each of the first to $x^{th}$ stage circuits STC1 to STCx, and a second scan output repair pattern disposed between second scan output terminals No2 of each of the first to $x^{th}$ stage circuits STC1 to STCx.

The first scan output repair pattern can be disposed on the substrate 100 to overlap first scan output terminals No1 of each of the $y^{th}$ stage circuit STCy and the $y+1^{th}$ stage circuit STCy+1. The second scan output repair pattern can be disposed on the substrate 100 to overlap second scan output terminals No2 of each of the $y^{th}$ stage circuit STCy and the $y+1^{th}$ stage circuit STCy+1.

Figure 14A:
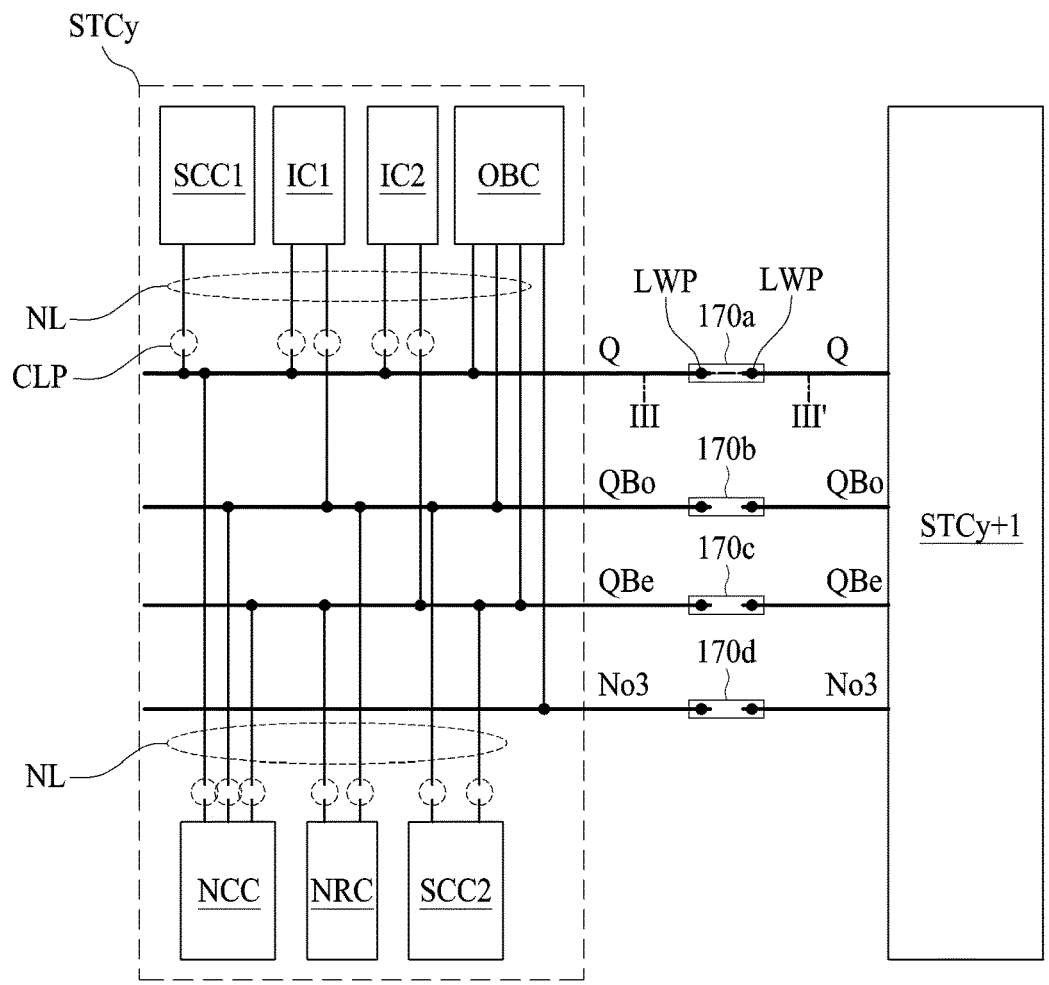
FIG. 14A is a diagram illustrating an example of a repair process performed on a gate driving circuit according to an embodiment of the present disclosure.
Figure 14B:
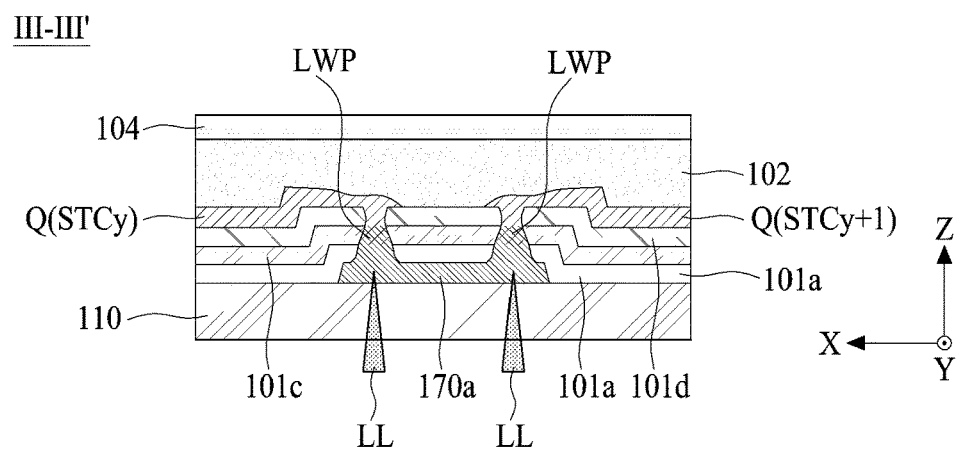
FIG. 14B is a cross-sectional view taken along line III-III' illustrated in FIG. 14A.

FIG. 14A is a diagram illustrating an example of a repair process performed on a gate driving circuit 150 according to an embodiment of the present disclosure, and FIG. 14B is a cross-sectional view taken along line illustrated in FIG. 14A. FIGS. 14A and 14B illustrate a repair process when the $y^{th}$ stage circuit illustrated in FIG. 5 operates abnormally or is not driven.

Referring to FIGS. 5, 7, 14A, and 14B, in the gate driving circuit 150 according to an embodiment, due to the abnormal operation or non-driving of a logic circuit unit NCC, IC1, IC2, NRC, SCC1, or SCC2 of a $y^{th}$ stage circuit STCy, an output of an output buffer circuit OBC of the $y^{th}$ stage circuit STCy can be abnormal. In this case, an output of the $y^{th}$ stage circuit STCy can be normalized through a laser repair process.

The first to third control nodes Q, QBo, and QBe of the $y^{th}$ stage circuit STCy can be electrically connected to the first to third control nodes Q, QBo, and QBe of the $y+1^{th}$ stage circuit STCy+1 through the plurality of control node repair patterns 170a to 170c disposed in the circuit repair portion 170.

According to an embodiment, when the logic circuit unit NCC, IC1, IC2, NRC, SCC1, or SCC2 disposed in the $y^{th}$ stage circuit STCy operates abnormally or is not driven, a network line NL between the logic circuit units NCC, IC1, IC2, NRC, SCC1, and SCC2 and the first to third control nodes Q, QBo, and QBe disposed in the $y^{th}$ stage circuit STCy can be cut by a laser cutting process. Accordingly, the logic circuit units NCC, IC1, IC2, NRC, SCC1, and SCC2 of the $y^{th}$ stage circuit STCy which operates abnormally or is not driven can be electrically disconnected from the first to third control nodes Q, QBo, and QBe by a cut line portion CLP of a laser-cut network line NL.

The first to third control nodes Q, QBo, and QBe of the $y^{th}$ stage circuit STCy overlapping the control node repair patterns 170a to 170c of the circuit repair portion 170 can be electrically connected to the first to third control nodes Q, QBo, and QBe of the $y+1^{th}$ stage circuit STCy+1 overlapping the control node repair patterns 170a to 170c of the circuit repair portion 170 by a laser beam LL irradiated onto the laser welding portion LWP of the circuit repair portion 170. Therefore, each of the first to third control nodes Q, QBo, and QBe of the $y^{th}$ stage circuit STCy can be electrically connected to each of the first to third control nodes Q, QBo, and QBe of the $y+1^{th}$ stage circuit STCy+1 through each of the plurality of control node repair patterns 170a to 170c disposed in the circuit repair portion 170, and thus, the output buffer circuit OBC of the $y^{th}$ stage circuit STCy can receive or share a voltage of each of the first to third control nodes Q, QBo, and QBe of the $y+1^{th}$ stage circuit STCy+1 to operate normally.

Additionally, when all of the output buffer circuit OBC and the logic circuit units NCC, IC1, IC2, NRC, SCC1, and SCC2 disposed in the $y^{th}$ stage circuit STCy operate abnormally or are not driven, a network line NL between the logic circuit units NCC, IC1, IC2, NRC, SCC1, and SCC2 and the first to third control nodes Q, QBo, and QBe disposed in the $y^{th}$ stage circuit STCy and a network line NL between the output terminals No1 to No3 and the output buffer circuit OBC disposed in the $y^{th}$ stage circuit STCy can be cut by a laser cutting process. Accordingly, the $y^{th}$ stage circuit STCy which operates abnormally or is not driven can be electrically disconnected from the first to third control nodes Q, QBo, and QBe by a cut line portion CLP of a laser-cut network line NL.

The output terminals No1 to No3 of the $y^{th}$ stage circuit STCy overlapping the output repair pattern of the circuit repair portion 170 can be electrically connected to the output terminals No1 to No3 of the $y+1^{th}$ stage circuit STCy+1 by a laser beam irradiated onto the laser welding portion of the circuit repair portion 170. Therefore, the output terminals No1 to No3 of the $y^{th}$ stage circuit STCy can be electrically connected to the output terminals No1 to No3 of the $y+1^{th}$ stage circuit STCy+1 through the output repair pattern disposed in the circuit repair portion 170, and thus, the $y^{th}$ stage circuit STCy can receive or share an output signal from each of the output terminals No1 to No3 of the $y+1^{th}$ stage circuit STCy+1 to output signal normally.

Figure 15:
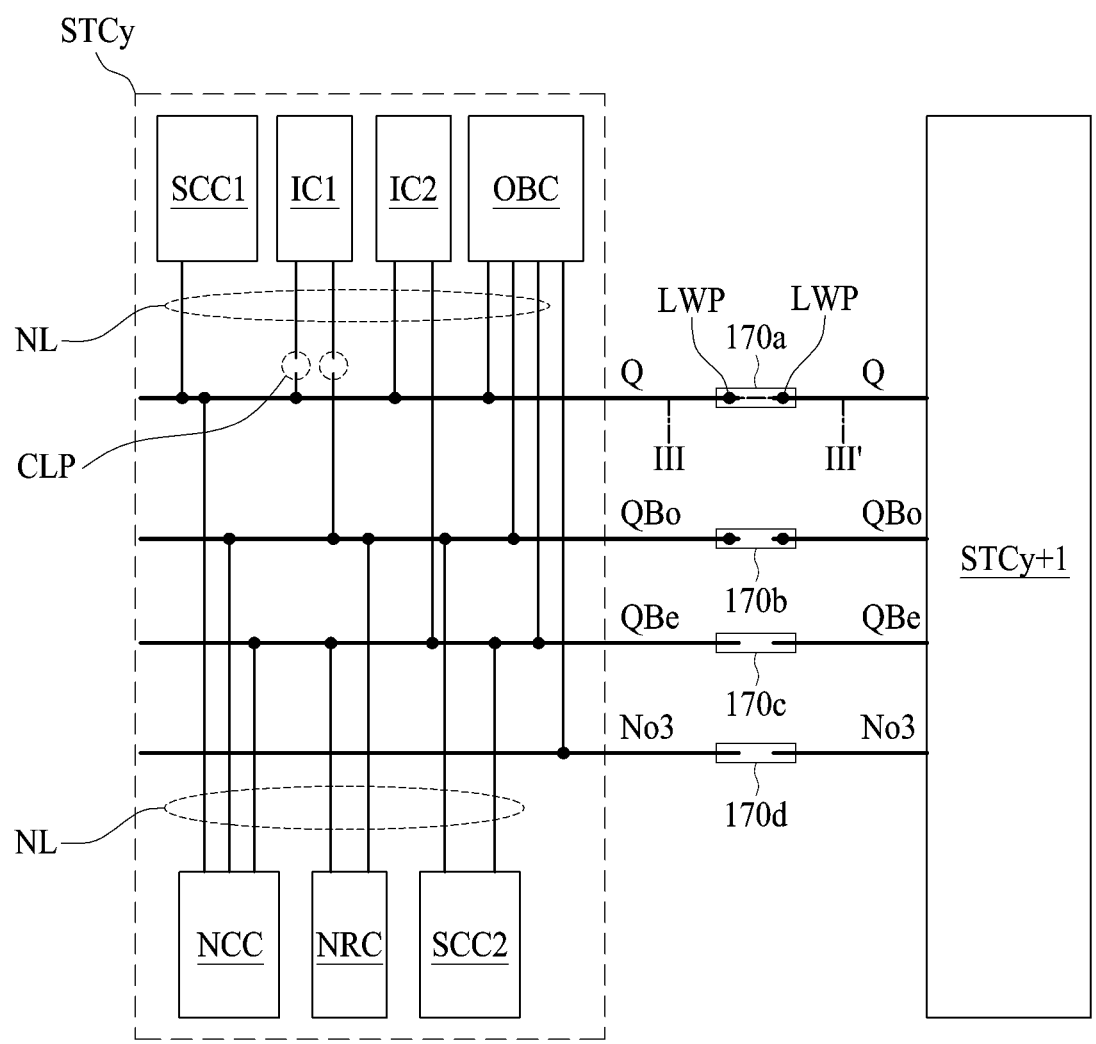
FIG. 15 is a diagram illustrating an example of a repair process performed on a gate driving circuit according to an embodiment of the present disclosure.

FIG. 15 is a diagram illustrating an example of a repair process performed on a gate driving circuit according to an embodiment of the present disclosure and illustrates a repair process when the first inverter circuit of the y$^{th}$ stage circuit illustrated in FIG. 7 operates abnormally or is not driven.

Referring to FIGS. 5, 7, and 15, in the gate driving circuit 150 according to an embodiment, an output of an output buffer circuit OBC of the y$^{th}$ stage circuit STCy can be abnormal due to the abnormal operation or non-driving of a first inverter circuit IC1 of a y$^{th}$ stage circuit STCy. In this case, an output of the y$^{th}$ stage circuit STCy can be normalized through a laser repair process.

According to an embodiment, when the first inverter circuit IC1 disposed in the y$^{th}$ stage circuit STCy operates abnormally or is not driven, a network line NL between the first inverter circuit IC1 and the first and second control nodes Q and QBo disposed in the y$^{th}$ stage circuit STCy can be cut by a laser cutting process. Accordingly, the first inverter circuit IC1 of the y$^{th}$ stage circuit STCy which operates abnormally or is not driven can be electrically disconnected from the first and second control nodes Q and QBo by a cut line portion CLP of a laser-cut network line NL. For example, the cut line portion CLP of the first inverter circuit IC1 can cut each of a network line NL between the first control node Q and a gate electrode of an eleventh TFT T11, a network line NL between the first control node Q and a gate electrode of a thirteenth TFT T13, and a network line NL between the second control node QBo and a source/drain electrode of the thirteenth TFT T13.

The first and second control nodes Q and QBo of the y$^{th}$ stage circuit STCy overlapping the first control node repair pattern 170a and the second control node repair pattern 170b of the circuit repair portion 170 can be electrically connected to the first and second control nodes Q and QBo of the y+1$^{th}$ stage circuit STCy+1 overlapping the first control node repair pattern 170a and the second control node repair pattern 170b of the circuit repair portion 170 by a laser beam LL irradiated onto the laser welding portion LWP of the circuit repair portion 170. Therefore, the first and second control nodes Q and QBo of the y$^{th}$ stage circuit STCy can be electrically connected to the first and second control nodes Q and QBo of the y+1$^{th}$ stage circuit STCy+1 through the plurality of first and second control node repair patterns 170a and 170b disposed in the circuit repair portion 170, and thus, the y$^{th}$ stage circuit STCy can share the first inverter circuit IC1 of the y+1$^{th}$ stage circuit STCy+1 and can normally operate to output a normal signal.

A repair process performed on the first inverter circuit IC1 which operates abnormally or is not driven can be identically applied even when at least one of the node control circuit NCC, the second inverter circuit IC2, the node reset circuit NRC, the first sensing control circuit SCC1, and the second sensing control circuit SCC2 operates abnormally.

Figure 16:
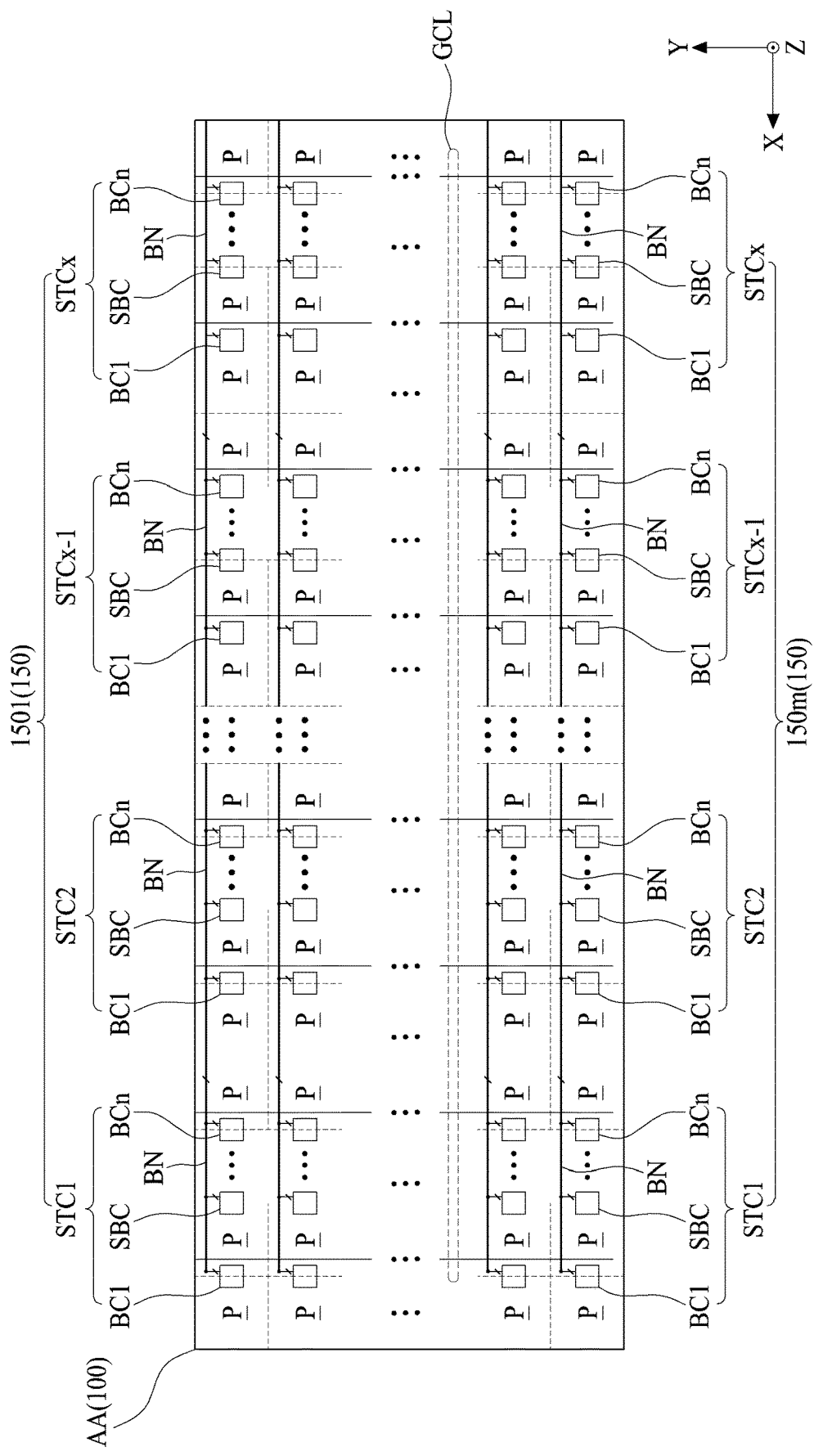
FIG. 16 is a diagram illustrating a gate driving circuit according to another embodiment of the present disclosure illustrated in FIGS. 2 and 3.

FIG. 16 is a diagram illustrating a gate driving circuit according to another embodiment of the present disclosure illustrated in FIGS. 2 and 3.

Referring to FIGS. 2 to 4 and 16, the gate driving circuit 150 according to another embodiment of the present disclosure can be implemented with a shift register including a plurality of stage circuit units 1501 to 150m.

Each of the plurality of stage circuit units 1501 to 150m according to an embodiment can include first to x$^{th}$ stage circuits STC1 to STCx.

The first to x$^{th}$ stage circuits STC1 to STCx can be respectively disposed in first to x$^{th}$ horizontal division regions HDA1 to HDAx defined in each horizontal line of a display area AA along a first direction X illustrated in FIG. 6. The first to x$^{th}$ stage circuits STC1 to STCx can generate a scan signal in a predetermined order in response to a gate control signal supplied through the pad part 110 and the gate control line group GCL and can simultaneously supply the scan signal to corresponding gate lines GL.

Each of the first to x$^{th}$ stage circuits STC1 to STCx according to an embodiment can include a plurality of branch circuits BC1 to BCn, a branch network BN, and at least one spare branch circuit SBC.

Each of the plurality of branch circuits BC1 to BCn and the branch network BN is substantially the same as the above description, and thus, its repetitive description is omitted or may be brief.

The at least one spare branch circuit SBC can be implemented for completely replacing an operation of at least one of the plurality of branch circuits BC1 to BCn.

The at least one spare branch circuit SBC can be disposed in a region, where the plurality of branch circuits BC1 to BCn are not disposed, of a region between pixels P disposed in a corresponding horizontal division region HDA.

The at least one spare branch circuit SBC according to an embodiment can be implemented to be substantially equal to at least one of the plurality of branch circuits BC1 to BCn. For example, the at least one spare branch circuit SBC can correspond to at least one TFT of the first to forty-third TFTs T1 to T43 of FIGS. 8 and 9 respectively corresponding to the plurality of branch circuits BC1 to BCn. For example, the at least one spare branch circuit SBC can correspond to each of second to fourth node control circuits NCC2 to NCC4 of the node control circuit NCC for controlling a voltage of the first control node Q, pull-up TFTs T24, T27, and T30 of the output buffer circuit OBC, pull-down TFTs T25, T26, T28, T29, T31, and T32 of the output buffer circuit OBC, tenth to thirteenth TFTs T10 to T13 of the first inverter circuit IC1, and fourteenth to seventeenth TFTs T14 to T17 of the second inverter circuit IC2 among the first to forty-third TFTs T1 to T43 illustrated in FIGS. 8 and 9, but the present disclosure is not limited thereto.

A branch circuit BC having completely the same configuration as the spare branch circuit SBC among the plurality of branch circuits BC1 to BCn can be disabled by a laser repair process and can be referred to as a disabling target branch circuit. For example, when the at least one spare branch circuit SBC replaces an operation of a corresponding branch circuit BC, a branch circuit BC which is the same as or corresponds to the at least one spare branch circuit SBC can be disabled in an abnormal state.

The at least one spare branch circuit SBC can be disposed to be electrically connected to at least one of the lines of the gate control line group GCL and the branch network BN by the laser repair process. When a disabling target branch circuit BC having the same configuration as that of the at least one spare branch circuit SBC among the plurality of branch circuits BC1 to BCn operates abnormally or is not driven, the at least one spare branch circuit SBC can be electrically connected to at least one of the lines of the gate control line group GCL and the branch network BN by the laser repair process, and thus, can operate instead of the disabling target branch circuit BC.

Figure 17:
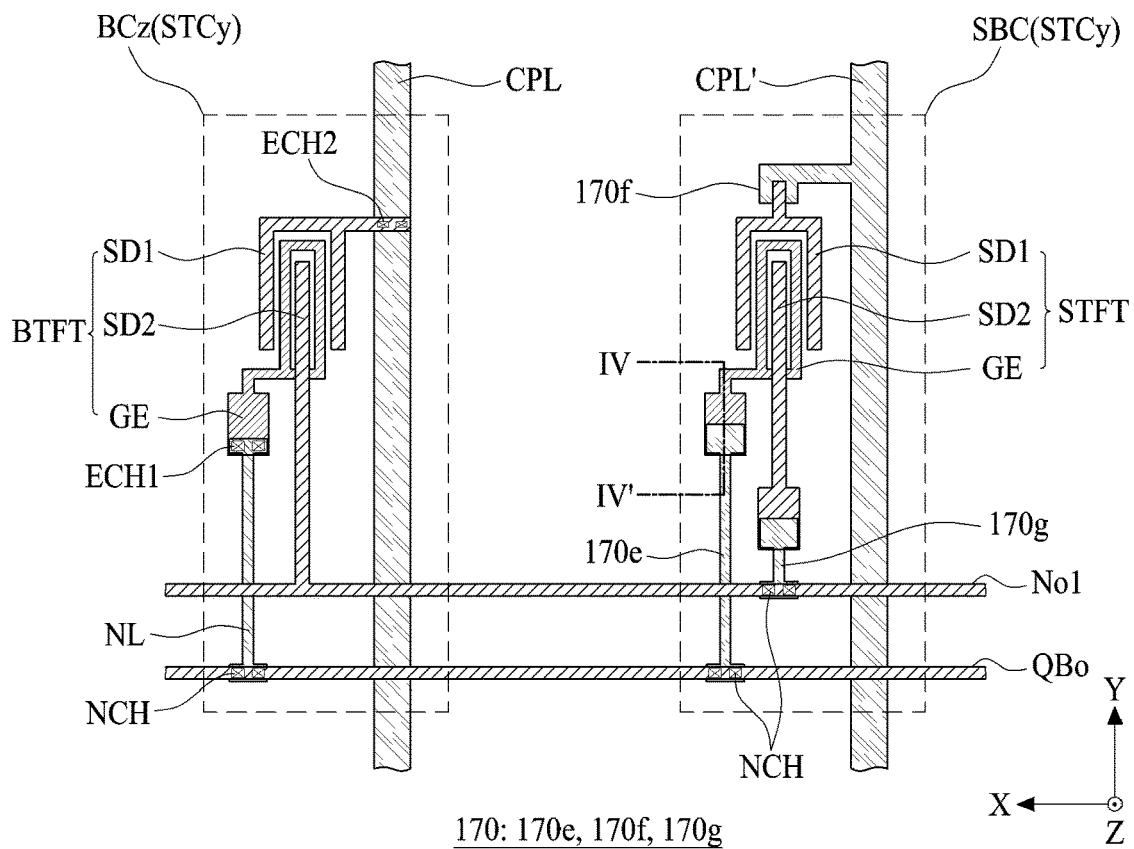
FIG. 17 is a diagram illustrating an arbitrary $z^{th}$ branch circuit and a spare branch circuit included in each stage circuit illustrated in FIG. 16.
Figure 18:
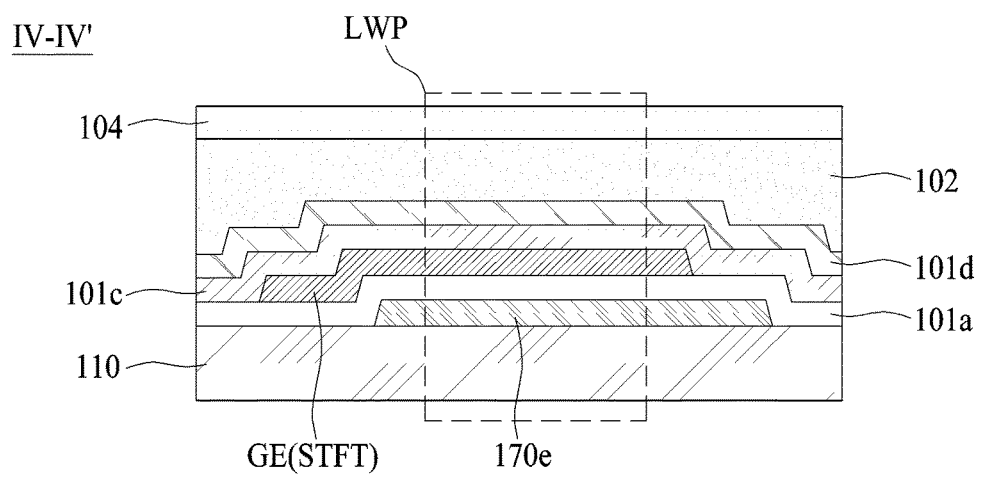
FIG. 18 is a cross-sectional view taken along line IV-IV' illustrated in FIG. 17.

FIG. 17 is a diagram illustrating an arbitrary z$^{th}$ branch circuit and a spare branch circuit included in each stage circuit illustrated in FIG. 16, and FIG. 18 is a cross-sectional view taken along line IV-IV' illustrated in FIG. 17. FIGS. 17 and 18 are for describing a spare branch circuit.

Referring to FIGS. 16 to 18, a z$^{th}$ branch circuit BCz according to an embodiment of the present disclosure can include a branch TFT BTFT and a network line NL.

The branch TFT BTFT can include a gate electrode GE connected to the network line NL through a first electrode contact hole ECH1, a first source/drain electrode SD1 connected to a gate control line group GCL through a second electrode contact hole ECH2, and a first source/drain electrode SD1 connected to a first output node No1. The second source/drain electrode SD2 of the branch TFT BTFT can be electrically connected to a pixel common power line CPL among lines of the gate control line group GCL. For example, the branch TFT BTFT can be the twenty-fifth TFT TFT25 illustrated in FIG. 9, but is not limited thereto. When the branch TFT BTFT operates abnormally or is not driven, the branch TFT BTFT can be electrically disconnected from the gate control line group GCL and the branch network BN by a laser cutting process.

The network line NL can electrically connect a second control node QBo to a gate electrode GE of the branch TFT BTFT. For example, one end of the network line NL can be electrically connected to the gate electrode GE of the branch TFT BTFT through the first contact hole ECH1, and the other end of the network line NL can be electrically connected to the second control node QBo through a network contact hole NCH.

A spare branch circuit SBC according to an embodiment of the present disclosure can be implemented for completely replacing an operation of the $z^{th}$ branch circuit BCz.

The spare branch circuit SBC can be apart from the $z^{th}$ branch circuit BCz and can be disposed between pixels P where another pixel common power line CPL' is disposed. The spare branch circuit SBC according to an embodiment of the present disclosure can include a spare TFT STFT and a circuit repair portion 170.

The spare TFT STFT can include a gate electrode GE, a first source/drain electrode SD1, and a second source/drain electrode SD2. The spare TFT STFT can have the same type (or a channel size) as the branch TFT BTFT. Each of the gate electrode GE, the first source/drain electrode SD1, and the second source/drain electrode SD2 of the spare TFT STFT can electrically maintain a floating state and can be electrically connected to the network line NL and one of the lines of the gate control line group GCL through the circuit repair portion 170 by using only the laser repair process, and thus, the spare TFT STFT can replace an operation of the branch TFT BTFT.

The circuit repair portion 170 can be disposed to be electrically connected to each of the second control node QBo, the other pixel common power line CPL', and a first output node No1 and to be overlapping with each of the gate electrode GE, the first source/drain electrode SD1, and the second source/drain electrode SD2 of the spare TFT STFT. The circuit repair portion 170 can electrically and respectively connect the gate electrode GE, the first source/drain electrode SD1, and the second source/drain electrode SD2 of the spare TFT STFT to the second control node QBo, the other pixel common power line CPL', and the first output node No1.

The circuit repair portion 170 according to an embodiment can include first to third repair patterns 170e to 170g.

The first repair pattern 170e can be electrically connected to the second control node QBo through the network contact hole NCH and can be implemented to overlap the gate electrode GE of the spare TFT STFT.

The second repair pattern 170f can be electrically connected to the other pixel common power line CPL' and can be implemented to overlap the first source/drain electrode SD1 of the spare TFT STFT. For example, the second repair pattern 170f can be disposed on the same layer as the pixel common power line CPL and can protrude or extend from one side of the other pixel common power line CPL' to overlap the first source/drain electrode SD1 of the spare TFT STFT.

The third repair pattern 170g can be electrically connected to the first output node No1 through the network contact hole NCH and can be implemented to overlap the second source/drain electrode SD2 of the spare TFT STFT.

According to an embodiment, the first to third repair patterns 170e to 170g can be disposed on the same layer as the pixel common power line CPL.

An overlap region between each of the first to third repair patterns 170e to 170g and each of the gate electrode GE, the first source/drain electrode SD1, and the second source/drain electrode SD2 of the spare TFT STFT can be defined as a laser welding portion LWP. For example, the first to third repair patterns 170e to 170g and the electrodes GE, SD1, and SD2 of the spare TFT STFT disposed in the laser welding portion LWP can be welded by a laser beam irradiated thereon in the laser repair process, and thus, can be respectively connected to each other. When the branch TFT BTFT of the $z^{th}$ branch circuit BCz operates abnormally or is not driven, each of the first to third repair patterns 170e to 170g can act as a jumping line (or a bridge line) for electrically and respectively connecting the gate electrode GE, the first source/drain electrode SD1, and the second source/drain electrode SD2 of the spare TFT STFT to the second control node QBo, the other pixel common power line CPL', and the first output node No1.

Figure 19:
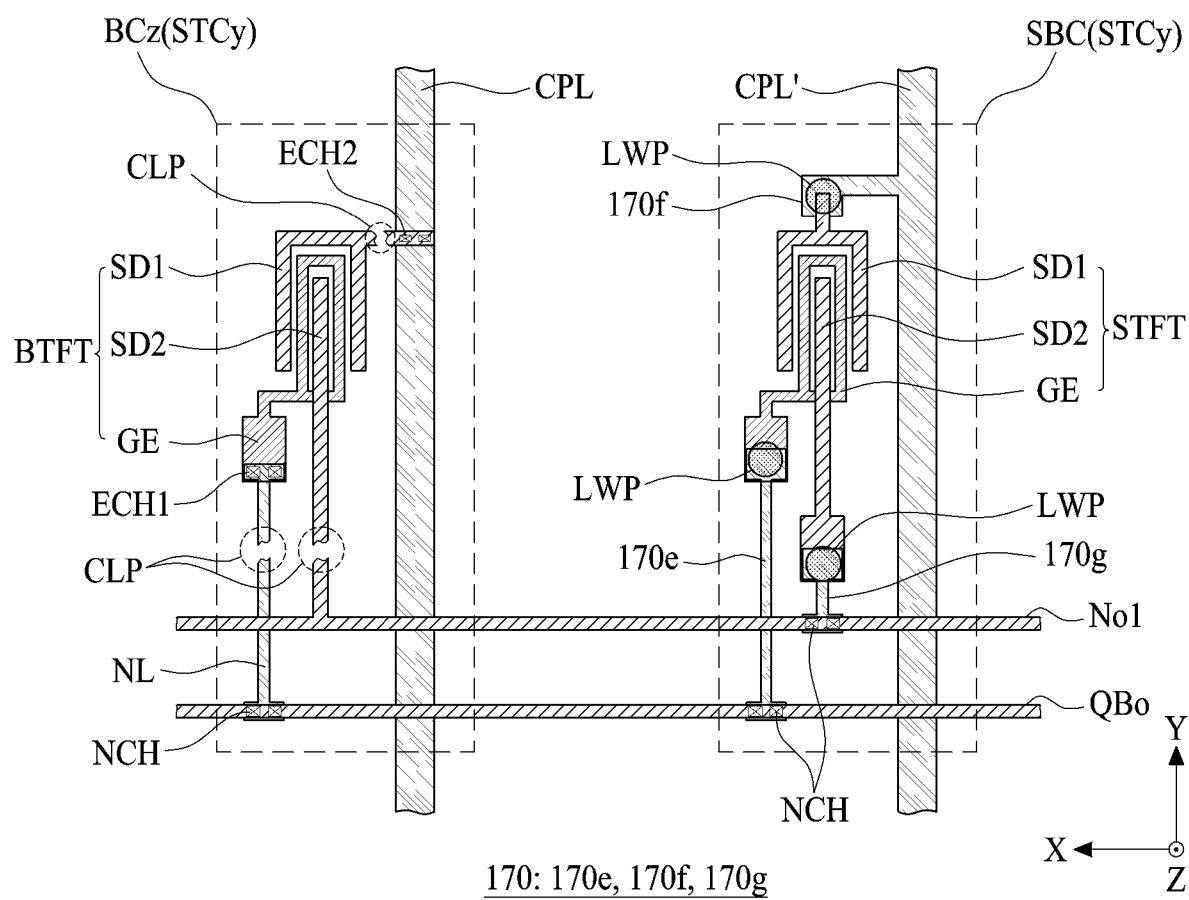
FIG. 19 is a diagram illustrating a disabling process performed on the $z^{th}$ branch circuit of FIG. 17 and a repair process performed on the spare branch circuit of FIG. 17.

FIG. 19 is a diagram illustrating a disabling process performed on the $z^{th}$ branch circuit of FIG. 17 and a repair process performed on the spare branch circuit of FIG. 17.

Referring to FIG. 19, in a gate driving circuit 150 according to an embodiment, a $z^{th}$ branch circuit BCz can abnormally operate or may not be driven due to an error or particles occurring in a manufacturing process. In this case, a spare branch circuit SBC can be repaired to replace an operation of the $z^{th}$ branch circuit BCz through a laser repair process.

According to an embodiment, when the $z^{th}$ branch circuit BCz operates abnormally or is not driven, each of a gate electrode GE, a first source/drain electrode SD1, and a second source/drain electrode SD2 of a branch TFT BTFT disposed in the $z^{th}$ branch circuit BCz can be cut by a laser cutting process. Therefore, the $z^{th}$ branch circuit BCz which operates abnormally or is not driven can be electrically disconnected from each of a second control node QBo, a pixel common power line CPL, and a first output node No1 by a cut line portion CLP of each of laser-cut electrodes GE, SD1, and SD2.

Each of first to third repair patterns 170e to 170g of a repair circuit repair portion 170 and each of a gate electrode GE, a first source/drain electrode SD1, and a second source/drain electrode SD2 of a spare TFT STFT disposed in a spare branch circuit SBC can be electrically connected to each other by a laser beam irradiated onto a laser welding portion LWP of the circuit repair portion 170. Therefore, the electrodes GE, SD1, and SD2 of the spare TFT STFT can be electrically connected to a second control node QBo, the other pixel common power line CPL', and a first output node No1 through the first to third repair patterns 170e to 170g, respectively, and thus, the spare TFT STFT can operate identically to the branch TFT BTFT disposed in the $z^{th}$ branch circuit BCz to replace an operation of the branch TFT BTFT. Therefore, a stage circuit STCy including the $z^{th}$ branch circuit BCz which operates abnormally or is not driven can normally operate based on an operation of the spare TFT STFT which is repaired to replace an operation of the $z^{th}$ branch circuit BCz, and thus, can output a normal signal.

Figure 20:
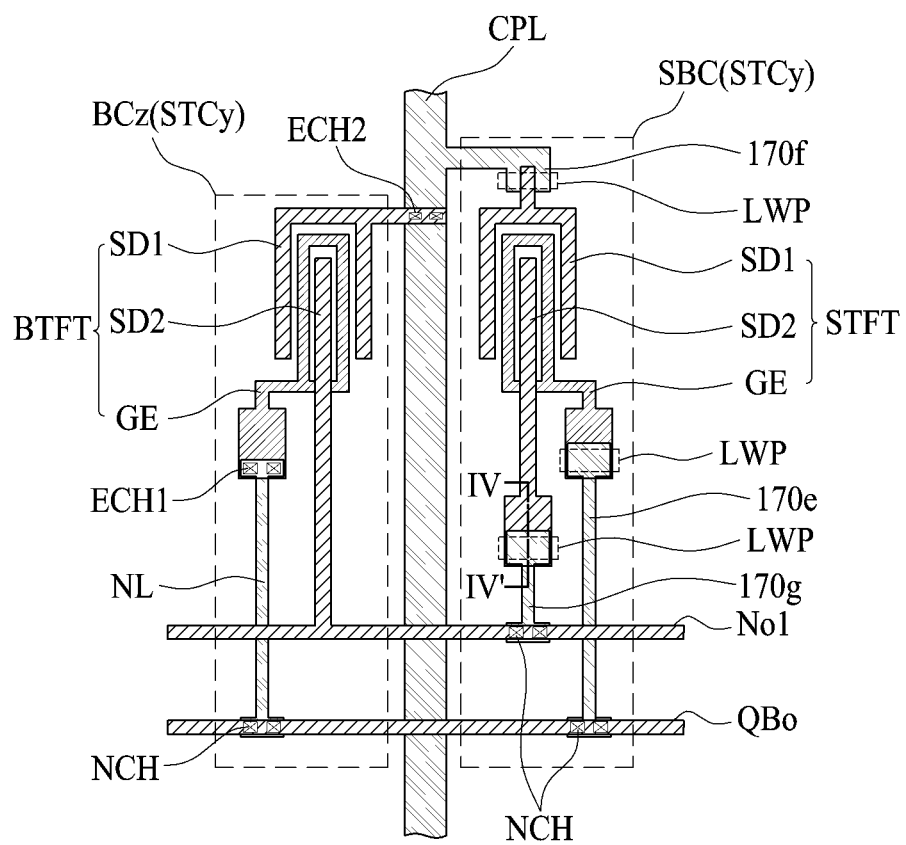
FIG. 20 is a diagram illustrating another example of the spare branch circuit illustrated in FIGS. 16 and 17.

FIG. 20 is a diagram illustrating another example of the spare branch circuit illustrated in FIGS. 16 and 17 and illustrates an embodiment which is implemented by modifying an arrangement position of a spare branch circuit. A cross-sectional surface taken along line IV-IV' illustrated in FIG. 20 is illustrated in FIG. 18. In describing FIG. 20, elements which are the same as or correspond to the elements of FIGS. 16 to 18 can be referred to by like reference numerals, and their repetitive descriptions are omitted or will be briefly given below.

Referring to FIG. 20, a spare branch circuit according to the present embodiment can be disposed between pixels P in parallel with a $z^{th}$ branch circuit BCz.

The spare branch circuit SBC can include a spare TFT STFT and a circuit repair portion 170.

The spare TFT STFT can include a gate electrode GE, a first source/drain electrode SD1, and a second source/drain electrode SD2. The spare TFT STFT can have the same type (or a channel size) as a branch TFT BTFT.

The circuit repair portion 170 can be disposed to be electrically connected to each of a second control node QBo, a pixel common power line CPL, and a first output node No1 and to be overlapping with each of the gate electrode GE, the first source/drain electrode SD1, and the second source/drain electrode SD2 of the spare TFT STFT. The circuit repair portion 170 can electrically and respectively connect the gate electrode GE, the first source/drain electrode SD1, and the second source/drain electrode SD2 of the spare TFT STFT to the second control node QBo, the pixel common power line CPL, and the first output node No1 by using only a laser repair process.

The circuit repair portion 170 according to an embodiment can include first to third repair patterns 170e to 170g.

The first repair pattern 170e can be electrically connected to a second control node QB through a network contact hole NCH and can be implemented to overlap the gate electrode GE of the spare TFT STFT.

The second repair pattern 170f can be electrically connected to the pixel common power line CPL electrically connected to the $z^{th}$ branch circuit BCz and can be implemented to overlap the first source/drain electrode SD1 of the spare TFT STFT. For example, the second repair pattern 170f can be disposed on the same layer as the pixel common power line CPL and can protrude or extend from one side of the pixel common power line CPL to overlap the first source/drain electrode SD1 of the spare TFT STFT.

The third repair pattern 170g can be electrically connected to the first output node No1 through the network contact hole NCH and can be implemented to overlap the second source/drain electrode SD2 of the spare TFT STFT.

An overlap region between each of the first to third repair patterns 170e to 170g and each of the gate electrode GE, the first source/drain electrode SD1, and the second source/drain electrode SD2 of the spare TFT STFT can be defined as a laser welding portion LWP. For example, the first to third repair patterns 170e to 170g and the electrodes GE, SD1, and SD2 of the spare TFT STFT disposed in the laser welding portion LWP can be welded by a laser beam irradiated thereon in the laser repair process, and thus, can be respectively connected to each other. When the branch TFT BTFT of the $z^{th}$ branch circuit BCz operates abnormally or is not driven, each of the first to third repair patterns 170e to 170g can act as a jumping line (or a bridge line) for electrically and respectively connecting the gate electrode GE, the first source/drain electrode SD1, and the second source/drain electrode SD2 of the spare TFT STFT to the second control node QBo, the pixel common power line CPL, and the first output node No1.

Figure 21:
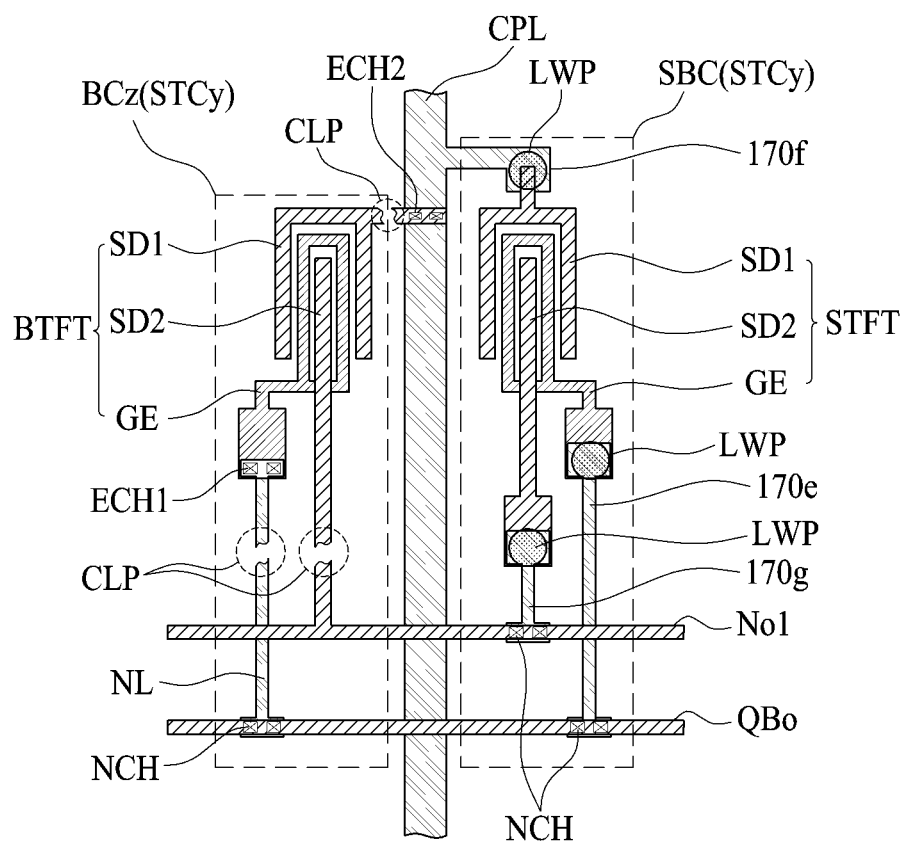
FIG. 21 is a diagram illustrating a disabling process performed on a $z^{th}$ branch circuit of FIG. 20 and a repair process performed on the spare branch circuit of FIG. 20.

FIG. 21 is a diagram illustrating a disabling process performed on a $z^{th}$ branch circuit of FIG. 20 and a repair process performed on the spare branch circuit of FIG. 20.

Referring to FIG. 21, in a gate driving circuit 150 according to an embodiment, a $z^{th}$ branch circuit BCz can abnormally operate or may not be driven due to an error or particles occurring in a manufacturing process. In this case, a spare branch circuit SBC can be repaired to replace an operation of the $z^{th}$ branch circuit BCz through a laser repair process.

According to an embodiment, when the $z^{th}$ branch circuit BCz operates abnormally or is not driven, each of a gate electrode GE, a first source/drain electrode SD1, and a second source/drain electrode SD2 of a branch TFT BTFT disposed in the $z^{th}$ branch circuit BCz can be cut by a laser cutting process. Therefore, the $z^{th}$ branch circuit BCz which operates abnormally or is not driven can be electrically disconnected from each of a second control node QBo, a pixel common power line CPL, and a first output node No1 by a cut line portion CLP of each of laser-cut electrodes GE, SD1, and SD2.

Each of first to third repair patterns 170e to 170g of a circuit repair portion 170 and each of a gate electrode GE, a first source/drain electrode SD1, and a second source/drain electrode SD2 of a spare TFT STFT disposed in a spare branch circuit SBC can be electrically connected to each other by a laser beam irradiated onto a laser welding portion LWP of the circuit repair portion 170. Therefore, the electrodes GE, SD1, and SD2 of the spare TFT STFT can be electrically connected to a second control node QBo, a pixel common power line CPL, and a first output node No1 through the first to third repair patterns 170e to 170g, respectively, and thus, the spare TFT STFT can operate identically to the branch TFT BTFT disposed in the $z^{th}$ branch circuit BCz to replace an operation of the branch TFT BTFT. Therefore, a stage circuit STCy including the $z^{th}$ branch circuit BCz which operates abnormally or is not driven can normally operate based on an operation of the spare TFT STFT which is repaired to replace an operation of the $z^{th}$ branch circuit BCz, and thus, can output a normal signal.

The display apparatus according to an embodiment of the present disclosure can include the circuit repair portion 170 for repairing the abnormal operation or non-driving of the stage circuit unit configuring the gate driving circuit 150 implemented in the display panel 10, and thus, the abnormal operation or non-driving of the gate driving circuit 150 implemented in the display panel 10 can be normalized by a repair process using the circuit repair portion 170.

Figure 22:
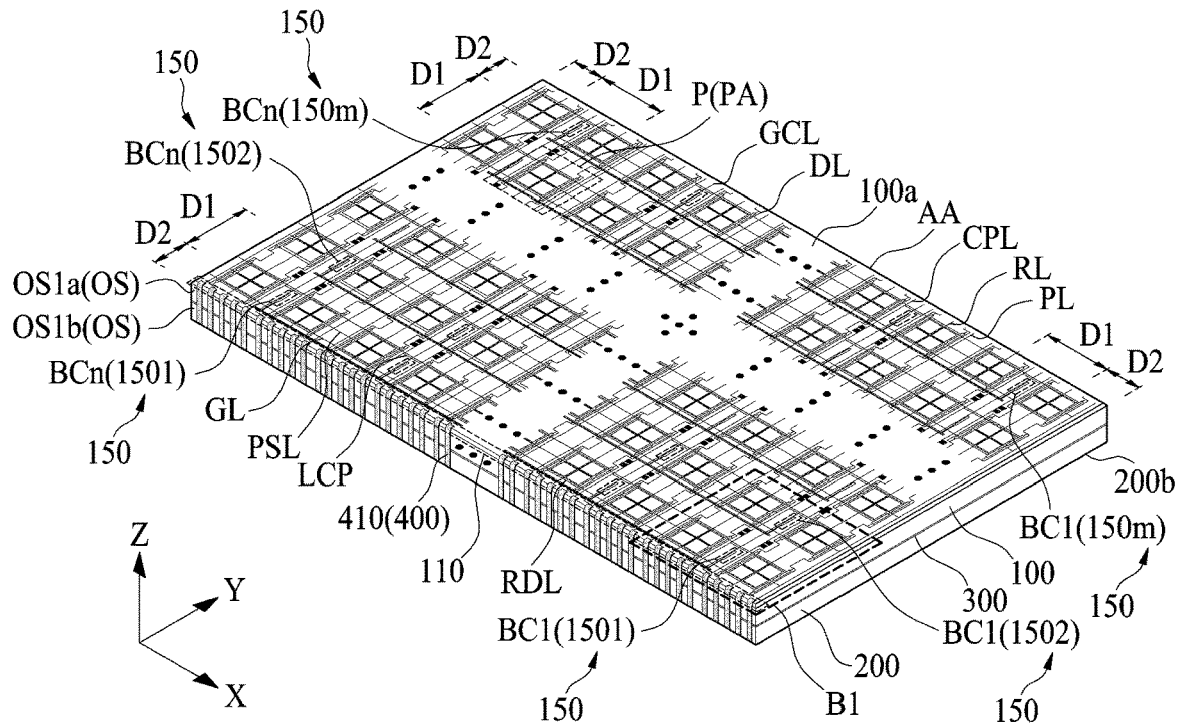
FIG. 22 is a perspective view illustrating a display apparatus according to another embodiment of the present disclosure.
Figure 23:
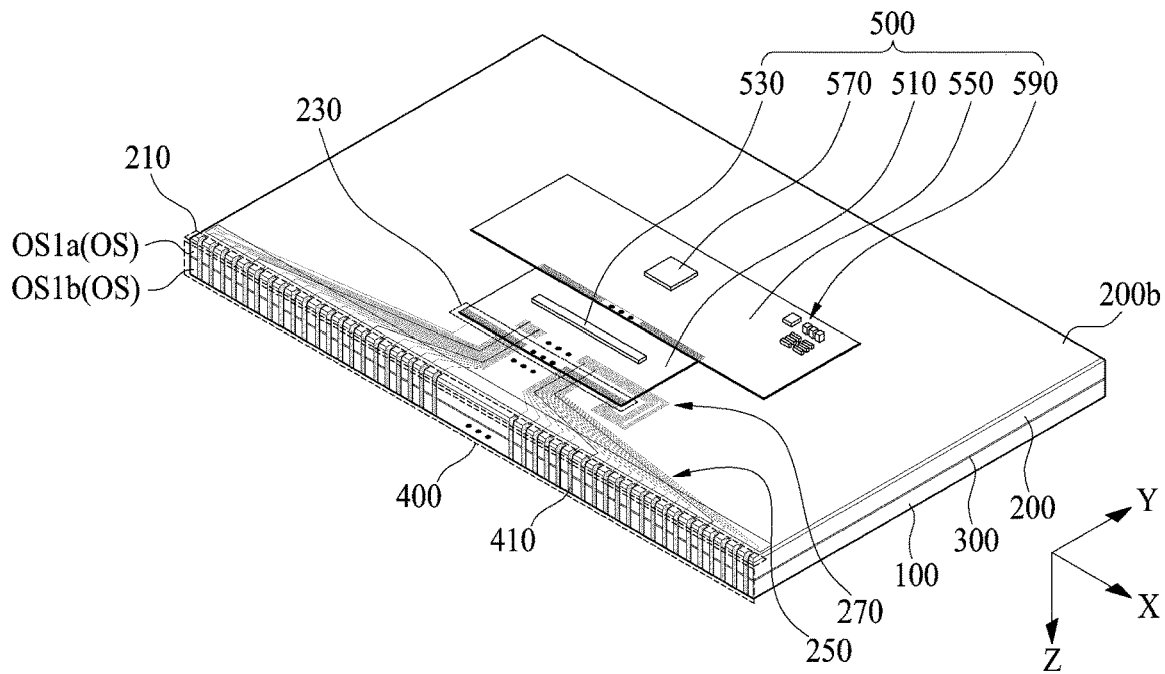
FIG. 23 is a diagram illustrating a rear surface of the display apparatus illustrated in FIG. 22.

FIG. 22 is a perspective view illustrating a display apparatus according to another embodiment of the present disclosure, and FIG. 23 is a diagram illustrating a rear surface of the display apparatus illustrated in FIG. 22. A region 'B1' illustrated in FIG. 22 is illustrated in FIG. 3.

Referring to FIGS. 22 and 23, the display apparatus according to another embodiment of the present disclosure can include a first substrate 100, a second substrate 200, a coupling member 300, and a routing portion 400.

The first substrate 100 can be referred to as a display substrate, a pixel array substrate, an upper substrate, a front substrate, or a base substrate.

The first substrate 100 can include a display area AA, a plurality of gate lines GL, a plurality of data lines DL, a plurality of pixel driving power lines PL, a plurality of pixel common power lines CPL, a plurality of pixels P, a common electrode CE, a plurality of common electrode contact portions CECP, a pad part 110, a gate driving circuit 150, and a plurality of circuit repair portions 170. The first substrate 100 can be substantially the same as the display panel 10 of the display apparatus illustrated in FIGS. 1 to 21, and thus, its repetitive description is omitted or may be brief. For example, the display panel 10 of the display apparatus illustrated in FIGS. 1 to 21 can be replaced by the first substrate 100 according to the present embodiment, and thus, like reference numerals refer to like elements and their repetitive descriptions are omitted or will be briefly given below.

The pad part 110 disposed on the first substrate 100 can be referred to as a first pad part 110.

The second substrate 200 can be referred to as a wiring substrate, a link substrate, a lower substrate, a rear substrate, or link glass. The second substrate 200 can include a glass material or a plastic material. The second substrate 200 can be a glass substrate, or can be a thin glass substrate or a plastic substrate, which is bendable or flexible. The second substrate 200 according to an embodiment can include the same material as that of the first substrate 100. For example, a size of the second substrate 200 can be the same as or substantially the same as that of the first substrate 100.

The second substrate 200 can be coupled (or connected) to a second surface of the first substrate 100 by using the coupling member 300. The second substrate 200 can include a front surface which faces the second surface of the first substrate 100 or is coupled to the coupling member 300, a rear surface (or a back surface) opposite to the front surface, and an outer surface OS between the front surface and the rear surface. The second substrate 200 can transfer a signal to the pixel driving lines and can increase the stiffness of the first substrate 100.

The display apparatus according to an embodiment can further include a second pad part 210 disposed on the second substrate 200.

The second pad part 210 can be disposed at a first edge portion of a rear surface of the second substrate 200 overlapping the first pad part 110 disposed on the first substrate 100. The first edge portion of the rear surface of the second substrate 200 can include a first outer surface (or one surface) OS1b of the outer surface OS of the second substrate 200.

The second pad part 210 can include a plurality of second pads which are arranged at a certain interval in the first direction X to respectively overlap the pads of the first pad part 110.

The display apparatus according to another embodiment of the present disclosure can further include a third pad part (or an input pad part) 230 disposed on the second substrate 200, a link line portion 250, and a gate control signal transfer line portion 270.

A third pad part 230 can be disposed on the rear surface 200b of the second substrate 200. For example, the third pad part 230 can be disposed at a center portion adjacent to the first edge portion of the rear surface 200b of the second substrate 200. The third pad part 230 according to an embodiment can include a plurality of third pads (or input pads) which are apart from one another by a certain interval.

The link line portion 250 can be disposed between the second pad part 210 and the third pad part 230. For example, the link line portion 250 can include a plurality of link lines which individually (or respectively) connect the second pads of the second pad part 210 to the third pads of the third pad part 230.

The gate control signal transfer line portion 270 can be disposed between the third pad part 230 and the link line portion 250. For example, the gate control signal transfer line portion 270 can include a gate control signal transfer line which individually connects a gate control signal pad, disposed in the third pad part 230, to a gate control signal link line disposed in the link line portion 250.

The coupling member 300 can be disposed between the first substrate 100 and the second substrate 200. The first substrate 100 and the second substrate 200 can be opposite-bonded to each other by the coupling member 300. For example, the second surface 100b of the first substrate 100 can be coupled to one surface of the coupling member 300, and the front surface of the second substrate 200 can be coupled to the other surface of coupling member 300. Accordingly, the first substrate 100 and the second substrate 200 opposite-bonded (or coupled) to each other by the coupling member 300 can be referred to as a display panel.

The routing portion 400 can be disposed to surround the outer surface OS of the first substrate 100 and the outer surface OS of the second substrate 200. The routing portion 400 according to an embodiment can include a plurality of routing lines 410 which are disposed on each of the first outer surface (or one surface) OS1a of the outer surface OS of the first substrate 100 and the first outer surface (or one surface) 051b of the outer surface OS of the second substrate 200.

Each of the plurality of routing lines 410 can be formed to surround each of the first outer surface OS1a of the first substrate 100 and the first outer surface OS1b of the second substrate 200. For example, the plurality of routing lines 410 can respectively (or individually) connect the pads of the first pad part 110, disposed on the first substrate 100, to the pads of the second pad part 210 disposed on the second substrate 200.

The display apparatus according to another embodiment of the present disclosure can further include a driving circuit unit 500.

The driving circuit unit 500 can drive (or emit light) the pixels P disposed on the first substrate 100 on the basis of digital video data and a timing synchronization signal supplied from a display driving system to allow the display area AA to display an image corresponding to image data. The driving circuit unit 500 can be connected to the third pad part 230 disposed on the rear surface 200b of the second substrate 200 and can output, to the third pad part 230, a data signal, a gate control signal, and a driving power for driving (or emitting light) the pixels P disposed on the first substrate 100. For example, the driving circuit unit 500 can have a size which is less than that of the second substrate 200, and thus, can be covered by the second substrate 200 and may not be exposed at the outer surface of the second substrate 200 or the outer surface of the first substrate 100.

The driving circuit unit 500 according to an embodiment can include a flexible circuit film 510, a driving IC 530, a PCB 550, a timing controller 570, and a power circuit unit 590. The driving circuit unit 500 having such a configuration can be substantially the same as the driving circuit unit 30 illustrated in FIG. 1, and thus, its repetitive description is omitted or will be briefly given below.

The flexible circuit film 510 can be connected to the third pad part 230 disposed on the rear surface 200b of the second substrate 200.

The driving IC 530 can be mounted on the flexible circuit film 510. The driving IC 530 can be connected to the plurality of data lines DL, the plurality of pixel driving power lines PL, the plurality of pixel common power lines CPL, and a plurality of reference power lines RL via the flexible circuit film 510, the third pad part 230, the link line portion 250, the second pad part 210, the routing portion 400, and the first pad part 110. The driving IC 530 can receive subpixel data and a data control signal provided from the timing controller 570, convert the subpixel data into an analog data signal on the basis of the data control signal to supply the analog data signal to a corresponding data line DL. Also, the driving IC 530 can generate a reference voltage, a pixel driving voltage, and a pixel common voltage and can supply the reference voltage, the pixel driving voltage, and the pixel common voltage to corresponding voltage lines RL, PL, and CPL.

The driving IC 530 can sense a characteristic value of a driving TFT disposed in the pixel P through the plurality of reference power lines RL disposed on the first substrate 100, generate sensing raw data corresponding to a sensing value, and provide the sensing raw data to the timing controller 570.

The PCB 550 can be connected to the other edge portion of the flexible circuit film 510. The PCB 550 can transfer a signal and power between elements of the driving circuit unit 500.

The timing controller 570 can be mounted on the PCB 550 and can receive the digital video data and the timing synchronization signal provided from the display driving system through a user connector disposed on the PCB 550. The timing controller 570 can be substantially the same as the timing controller 37 of the panel driving circuit unit 30 illustrated in FIG. 1, and thus, its repetitive description is omitted or may be brief.

The display apparatus according to another embodiment of the present disclosure can have the same effect as that of the display apparatus illustrated in FIGS. 1 to 21 and can have an air-bezel structure or a non-bezel structure where the display area AA is surrounded by air instead of an opaque non-display area.

Figure 24:
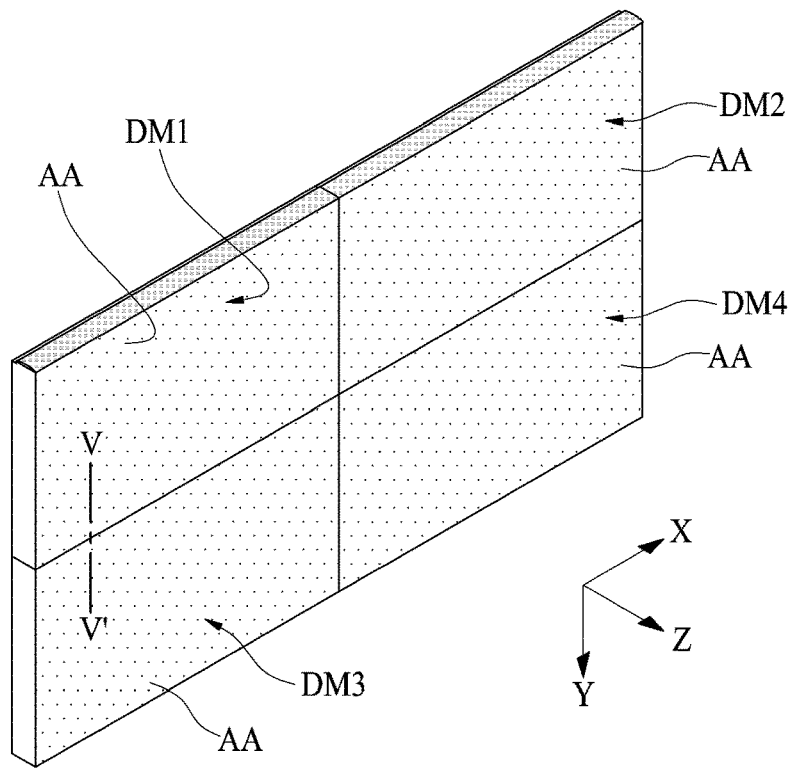
FIG. 24 is a diagram illustrating a multi-screen display apparatus according to an embodiment of the present disclosure.
Figure 25:
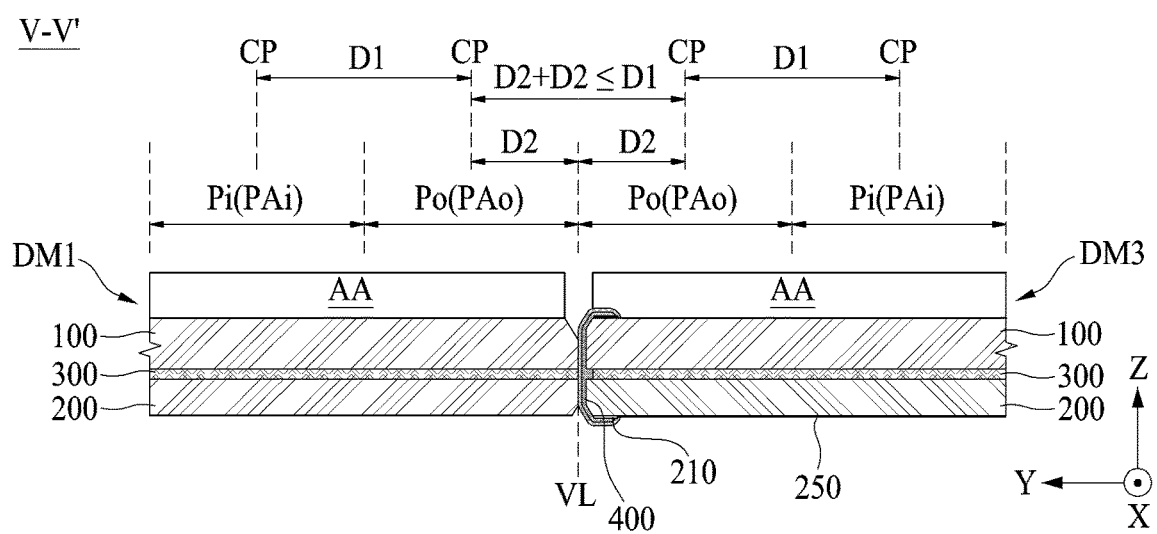
FIG. 25 is a cross-sectional view taken along line V-V' illustrated in FIG. 24.

FIG. 24 is a diagram illustrating a multi-screen display apparatus according to an embodiment of the present disclosure, and FIG. 25 is a cross-sectional view taken along line V-V' illustrated in FIG. 24. FIGS. 24 and 25 illustrate a multi-screen display apparatus implemented by tiling the display apparatus according to another embodiment of the present disclosure illustrated in FIGS. 22 and 23.

Referring to FIGS. 24 and 25, the multi-screen display apparatus according to an embodiment of the present disclosure can include a plurality of display modules DM1 to DM4.

The plurality of display modules DM1 to DM4 can each display an individual image or can divisionally display one image. Each of the plurality of display modules DM1 to DM4 can include the display apparatus according to another embodiment of the present disclosure illustrated in FIGS. 22 and 23, and thus, its repetitive description is omitted or may be brief.

The plurality of display modules DM1 to DM4 can be tiled on a separate tiling frame to contact each other at a side surface thereof. For example, the plurality of display modules DM1 to DM4 can be tiled to have an N×M form (where N is a positive integer of 2 or more and M is a positive integer of 2 or more), thereby implementing a multi-screen display apparatus having a large screen.

Each of the plurality of display modules DM1 to DM4 may not include a bezel area (or a non-display area) surrounding all of a display area AA where an image is displayed, and can have an air-bezel structure where the display area AA is surrounded by air. For example, in each of the plurality of display modules DM1 to DM4, all of a first surface of a first substrate 100 can be implemented as the display area AA.

According to the present embodiment, in each of the plurality of display modules DM1 to DM4, a second interval D2 between a center portion CP of an outermost pixel Po and an outermost outer surface VL of the first substrate 100 can be implemented to be half or less of a first interval D1 between adjacent pixels. Accordingly, in two adjacent display modules connected to (or contacting) each other at side surfaces thereof in the first direction X and the second direction Y on the basis of a lateral coupling manner, an interval "D2+D2" between adjacent outermost pixels PAo can be equal to or less than the first interval D1 between two adjacent pixels.

Referring to FIG. 25, in first and third display modules DM1 and DM3 connected to (or contacting) each other at side surfaces thereof in the second direction Y, the interval "D2+D2" between a center portion CP of an outermost pixel Po of the first display module DM1 and a center portion CP of an outermost pixel Po of the third display module DM3 can be equal to or less than the first interval D1 between two adjacent pixels disposed in each of the first and third display modules DM1 and DM3.

Therefore, the interval "D2+D2" between center portions CP of outermost pixels Po of two adjacent display modules connected to (or contacting) each other at side surfaces thereof in the first direction X and the second direction Y can be equal to or less than the first interval D1 between two adjacent pixels disposed in each of the display modules DM1 to DM4, and thus, there can be no seam or boundary portion between two adjacent display modules, whereby there can be no dark area caused by a boundary portion provided between the display modules DM1 to DM4. As a result, in a case where the display area AA of the plurality of display modules DM1 to DM4 is one screen and displays one image, a multi-screen display apparatus according to the present disclosure can display an image which is not disconnected and is continuous at a boundary portion between the plurality of display modules DM1 to DM4.

In FIGS. 24 and 25, it is illustrated that the plurality of display modules DM1 to DM4 are tiled in a 2×2 form, but the present disclosure is not limited thereto and the plurality of display modules DM1 to DM4 can be tiled in an x×1 form, a 1×y form, or an x×y form. Here, x can be a natural number which is 2 or more, and y can be a natural number which is 2 or more.

As described above, in a case where the display area AA of the plurality of display modules DM1 to DM4 is one screen and displays one image, a multi-screen display apparatus according to the present disclosure can display an image which is not disconnected and is continuous at a boundary portion between the plurality of display modules DM1 to DM4, and thus, the immersion of a viewer watching an image displayed by the multi-screen display apparatus can be enhanced.

Alternatively, in the multi-screen display apparatus according to the present disclosure, each of the plurality of display modules DM1 to DM4 can include the display apparatus according to an embodiment of the present disclosure illustrated in FIGS. 1 to 21. In this case, in the display apparatus according to an embodiment of the present disclosure illustrated in FIG. 1, the flexible circuit film 31 can be bent to surround a side surface of the substrate 100, and the PCB 35 can be disposed on the rear surface of the substrate 100. The display apparatus illustrated in FIG. 1 can be substantially the same as the first substrate 100 illustrated in FIG. 22, and thus, a plurality of display apparatuses illustrated in FIG. 1 can be tiled in an x×1 form, a 1×y form, or an x×y form to implement a multi-screen display apparatus. Accordingly, the multi-screen display apparatus according to the present disclosure can display an image which is continuous at a boundary portion between the plurality of display modules DM1 to DM4 without a sense of discontinuity (or discontinuity) of the image.

A display apparatus and a multi-screen display apparatus including the same according to the present disclosure will be described below.

A display apparatus according to some embodiments of the present disclosure can include a substrate including a display portion, a plurality of pixels connected to a gate line and a data line disposed in the display portion, and a gate driving circuit disposed in the display portion to drive the gate line, wherein the gate driving circuit can include a stage circuit unit including a plurality of stage circuits respectively disposed in a plurality of division regions defined in the display portion, and a circuit repair portions configured to repair at least one of the plurality of stage circuits.

According to some embodiments of the present disclosure, each of the plurality of stage circuits can include a plurality of branch circuits disposed separately between the plurality of pixels, in the plurality of division regions of the display portion and a branch network connected to the gate line to electrically connect the plurality of branch circuits.

According to some embodiments of the present disclosure, each of the plurality of branch circuits can include at least one thin film transistor.

According to some embodiments of the present disclosure, the circuit repair portion can be disposed between the plurality of stage circuits and overlaps the branch network of an adjacent stage circuit.

According to some embodiments of the present disclosure, each of a plurality of branch circuits disposed in one of two adjacent stage circuits can be electrically disconnected from the branch network, and a branch network disposed in one of the two adjacent stage circuits can be electrically connected to a branch network disposed in the other stage circuit of the two adjacent stage circuits through the circuit repair portion.

According to some embodiments of the present disclosure, the display apparatus can further include a gate control line group disposed separately between the plurality of pixels in the display portion, wherein the branch network can include a plurality of control nodes disposed in parallel with the gate line and a network line connected between the plurality of branch circuits and selectively connected to lines of the gate control line group and the plurality of control nodes, and the circuit repair portion can be disposed between the plurality of stage circuits and can overlap each of a plurality of control nodes disposed in adjacent stage circuits.

According to some embodiments of the present disclosure, the circuit repair portion can include a plurality of node repair patterns electrically disconnected from one another to respectively overlap a plurality of control nodes disposed in adjacent stage circuits.

According to some embodiments of the present disclosure, the circuit repair portion can be electrically connected to at least one of the plurality of control nodes disposed in the adjacent stage circuits, and at least one of the plurality of branch circuits disposed in one of the adjacent stage circuits can be electrically disconnected from a corresponding control node connected to the circuit repair portion.

According to some embodiments of the present disclosure, each of the plurality of stage circuits can include a plurality of branch circuits disposed separately between the plurality of pixels, in the plurality of division regions of the display portion, a branch network connected to the gate line to electrically connect the plurality of branch circuits, and at least one spare branch circuit disposed separately between the plurality of pixels, in the plurality of division regions of the display portion, wherein the circuit repair portion can be disposed in the at least one spare branch circuit.

According to some embodiments of the present disclosure, the at least one spare branch circuit can replace an operation of at least one of the plurality of branch circuits.

According to some embodiments of the present disclosure, in each of the plurality of stage circuits, the at least one spare branch circuit and at least one of the plurality of branch circuits can be disposed between two adjacent pixels, and the at least one spare branch circuit can be apart from a branch circuit, which is to be replaced thereby, of the plurality of branch circuits.

According to some embodiments of the present disclosure, each of the plurality of branch circuits can include a branch thin film transistor including a gate electrode connected to the branch network, a first source/drain electrode, and a second source/drain electrode, the at least one spare branch circuit can include a spare thin film transistor implemented to be equal to the branch thin film transistor disposed in at least one of the plurality of branch circuits, and the circuit repair portion can include first to third repair patterns respectively overlapping the gate electrode, the first source/drain electrode, and the second source/drain electrode of the spare thin film transistor and overlapping the branch network.

According to some embodiments of the present disclosure, the branch thin film transistor can be electrically disconnected from the branch network, and the spare thin film transistor can be electrically connected to the branch network through the first to third repair patterns.

According to some embodiments of the present disclosure, the display apparatus can further include a gate control line group disposed separately between the plurality of pixels in the display portion and connected to each of the plurality of stage circuits, wherein the branch network can include a first control node, a second control node, and a third control node disposed in parallel with the gate line and a network line selectively connected to the gate control line group and selectively connected to the first to third control nodes, and each of the plurality of stage circuits can include a node control circuit controlling a voltage of each of the first to third control nodes, a first inverter circuit controlling the voltage of the second control node on the basis of the voltage of the first control node, a second inverter circuit controlling the voltage of the third control node on the basis of the voltage of the first control node, and an output buffer circuit outputting the scan signal on the basis of the voltage of each of the first to third control nodes.

According to some embodiments of the present disclosure, a plurality of thin film transistors, respectively included in the node control circuit, the first inverter circuit, the second inverter circuit, and the output buffer circuit, can be separately disposed in one horizontal line and configure each of the plurality of branch circuits.

According to some embodiments of the present disclosure, the display apparatus can further include a rear substrate coupled to a rear surface of the substrate by using a coupling member, a routing portion including a routing line disposed on an outer surface of the substrate and an outer surface of the rear substrate, and a driving circuit unit disposed on the rear substrate, wherein the substrate can further include a first pad part including a plurality of pads connected to the data line and the gate driving circuit and electrically connected to the routing line of the routing portion, and the rear substrate can include a second pad part electrically connected to the routing line of the routing portion to overlap the first pad part and a third pad part electrically connected to the second pad part and connected to the driving circuit unit.

According to some embodiments of the present disclosure, a side surface of the display portion is aligned on an outer surface of the substrate, or a size of the display portion is the same as a size of the substrate.

A multi-screen display apparatus according to some embodiments of the present disclosure can include a plurality of display modules arranged in at least one direction of a first direction and a second direction transverse to the first direction, wherein each of the plurality of display modules can include a substrate including a display portion, a plurality of pixels connected to a gate line and a data line disposed in the display portion, and a gate driving circuit disposed in the display portion to drive the gate line, wherein the gate driving circuit can include a stage circuit unit including a plurality of stage circuits respectively disposed in a plurality of division regions defined in the display portion, and a circuit repair portion configured to repair at least one of the plurality of stage circuits.

According to some embodiments of the present disclosure, each of the plurality of display modules can further include a rear substrate coupled to a rear surface of the substrate by using a coupling member, a routing portion including a routing line disposed on an outer surface of the substrate and an outer surface of the rear substrate, and a driving circuit unit disposed on the rear substrate, wherein the substrate can further include a first pad part including a plurality of pads connected to the data line and the gate driving circuit and electrically connected to the routing line of the routing portion, and the rear substrate can include a second pad part electrically connected to the routing line of the routing portion to overlap the first pad part and a third pad part electrically connected to the second pad part and connected to the driving circuit unit.

According to some embodiments of the present disclosure, an outermost pixel of the plurality of pixels can include the plurality of pads, or the plurality of pixels can be arranged on the substrate to have a pixel pitch in the first direction and the second direction intersecting with the first direction, and an interval between a center portion of the outermost pixel and the outer surface of the substrate can be equal to or less than half of the pixel pitch.

The display apparatus according to the present disclosure can be applied to all electronic devices including a display panel. For example, the display apparatus according to the present disclosure can be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation devices, automotive navigation devices, automotive display devices, TVs, wall paper display devices, signage devices, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a display portion;
   a plurality of pixels connected to a gate line and a data line disposed in the display portion; and
   a gate driving circuit disposed in the display portion to drive the gate line, wherein the gate driving circuit comprises:
      a stage circuit unit including a plurality of stage circuits respectively disposed in a plurality of division regions defined in the display portion; and
      a circuit repair portion configured to repair at least one of the plurality of stage circuits,
   wherein each of the plurality of stage circuits comprises:
      a plurality of branch circuits disposed separately between the plurality of pixels, in the plurality of division regions of the display portion; and
      a branch network connected to the gate line to electrically connect the plurality of branch circuits, and
   wherein the circuit repair portion is disposed between the plurality of stage circuits and overlaps the branch network of an adjacent stage circuit.

2. The display apparatus of claim 1, wherein each of the plurality of branch circuits comprises at least one thin film transistor.

3. The display apparatus of claim 2, further comprising a gate control line group disposed separately between the plurality of pixels in the display portion,
   wherein the branch network comprises:
      a plurality of control nodes disposed in parallel with the gate line; and
      a network line connected between the plurality of branch circuits and selectively connected to lines of the gate control line group and the plurality of control nodes, and
   wherein the circuit repair portion is disposed between the plurality of stage circuits and overlaps each of a plurality of control nodes disposed in adjacent stage circuits.

4. The display apparatus of claim 3, wherein the circuit repair portion comprises a plurality of node repair patterns electrically disconnected from one another to respectively overlap a plurality of control nodes disposed in adjacent stage circuits.

5. The display apparatus of claim 4, wherein the circuit repair portion is electrically connected to at least one of the plurality of control nodes disposed in the adjacent stage circuits, and
wherein at least one of the plurality of branch circuits disposed in one of the adjacent stage circuits is electrically disconnected from a corresponding control node connected to the circuit repair portion.

6. The display apparatus of claim 1, wherein each of a plurality of branch circuits disposed in one of two adjacent stage circuits is electrically disconnected from the branch network, and
wherein a branch network disposed in one of the two adjacent stage circuits is electrically connected to a branch network disposed in the other stage circuit of the two adjacent stage circuits through the circuit repair portion.

7. The display apparatus of claim 1, further comprising a gate control line group disposed separately between the plurality of pixels in the display portion and connected to each of the plurality of stage circuits,
wherein the branch network comprises:
a first control node, a second control node, and a third control node disposed in parallel with the gate line; and
a network line selectively connected to the gate control line group and selectively connected to the first to third control nodes, and
wherein each of the plurality of stage circuits comprises:
a node control circuit controlling a voltage of each of the first to third control nodes;
a first inverter circuit controlling the voltage of the second control node based on the voltage of the first control node;
a second inverter circuit controlling the voltage of the third control node based on the voltage of the first control node; and
an output buffer circuit outputting the scan signal based on the voltage of each of the first to third control nodes.

8. The display apparatus of claim 7, wherein a plurality of thin film transistors, respectively included in the node control circuit, the first inverter circuit, the second inverter circuit, and the output buffer circuit, are separately disposed in one horizontal line and configure each of the plurality of branch circuits.

9. The display apparatus of claim 1, further comprising:
a rear substrate coupled to a rear surface of the substrate by using a coupling member;
a routing portion including a routing line disposed on an outer surface of the substrate and an outer surface of the rear substrate; and
a driving circuit unit disposed on the rear substrate,
wherein the substrate further comprises a first pad part including a plurality of pads connected to the data line and the gate driving circuit and electrically connected to the routing line of the routing portion, and
wherein the rear substrate comprises:
a second pad part electrically connected to the routing line of the routing portion to overlap the first pad part; and
a third pad part electrically connected to the second pad part and connected to the driving circuit unit.

10. The display apparatus of claim 1, wherein a side surface of the display portion is aligned on an outer surface of the substrate, or a size of the display portion is the same as a size of the substrate.

11. A multi-screen display apparatus comprising:
a plurality of display modules arranged in at least one direction of a first direction and a second direction transverse to the first direction,
wherein each of the plurality of display modules comprises the display apparatus of claim 1.

12. The multi-screen display apparatus of claim 11, wherein each of the plurality of display modules further comprises:
a rear substrate coupled to a rear surface of the substrate by using a coupling member;
a routing portion including a routing line disposed on an outer surface of the substrate and an outer surface of the rear substrate; and
a driving circuit unit disposed on the rear substrate,
wherein the substrate further comprises a first pad part including a plurality of pads connected to the data line and the gate driving circuit and electrically connected to the routing line of the routing portion, and
wherein the rear substrate comprises:
a second pad part electrically connected to the routing line of the routing portion to overlap the first pad part; and
a third pad part electrically connected to the second pad part and connected to the driving circuit unit.

13. The multi-screen display apparatus of claim 12, wherein an outermost pixel of the plurality of pixels comprises the plurality of pads, or
wherein the plurality of pixels are arranged on the substrate to have a pixel pitch in the first direction and the second direction transverse to the first direction, and an interval between a center portion of the outermost pixel and the outer surface of the substrate is equal to or less than half of the pixel pitch.

14. A display apparatus comprising:
a substrate including a display portion;
a plurality of pixels connected to a gate line and a data line disposed in the display portion; and
a gate driving circuit disposed in the display portion to drive the gate line,
wherein the gate driving circuit comprises:
a stage circuit unit including a plurality of stage circuits respectively disposed in a plurality of division regions defined in the display portion; and
a circuit repair portion configured to repair at least one of the plurality of stage circuits,
wherein each of the plurality of stage circuits comprises:
a plurality of branch circuits disposed separately between the plurality of pixels, in the plurality of division regions of the display portion;
a branch network connected to the gate line to electrically connect the plurality of branch circuits; and
at least one spare branch circuit disposed separately between the plurality of pixels, in the plurality of division regions of the display portion, and
wherein the circuit repair portion is disposed in the at least one spare branch circuit.

15. The display apparatus of claim 14, wherein the at least one spare branch circuit replaces an operation of at least one of the plurality of branch circuits.

16. The display apparatus of claim 15, wherein in each of the plurality of stage circuits,
the at least one spare branch circuit and at least one of the plurality of branch circuits are disposed between two adjacent pixels, or the at least one spare branch circuit is apart from a branch circuit, which is to be replaced thereby, of the plurality of branch circuits.

17. The display apparatus of claim 14, wherein:

each of the plurality of branch circuits comprises a branch thin film transistor including a gate electrode connected to the branch network, a first source/drain electrode, and a second source/drain electrode, the at least one spare branch circuit comprises a spare thin film transistor implemented to be equal to the branch thin film transistor disposed in at least one of the plurality of branch circuits, and the circuit repair portion comprises first to third repair patterns respectively overlapping the gate electrode, the first source/drain electrode, and the second source/drain electrode of the spare thin film transistor and overlapping the branch network.

18. The display apparatus of claim 17, wherein the branch thin film transistor is electrically disconnected from the branch network, and wherein the spare thin film transistor is electrically connected to the branch network through the first to third repair patterns.

19. A multi-screen display apparatus comprising:

a plurality of display modules arranged in at least one direction of a first direction and a second direction transverse to the first direction, wherein each of the plurality of display modules comprises the display apparatus of claim 14.

20. The multi-screen display apparatus of claim 19, wherein the at least one spare branch circuit replaces an operation of at least one of the plurality of branch circuits.

21. The multi-screen display apparatus of claim 19, wherein each of the plurality of display modules further comprises:

a rear substrate coupled to a rear surface of the substrate by using a coupling member;

a routing portion including a routing line disposed on an outer surface of the substrate and an outer surface of the rear substrate; and a driving circuit unit disposed on the rear substrate, wherein the substrate further comprises a first pad part including a plurality of pads connected to the data line and the gate driving circuit and electrically connected to the routing line of the routing portion, and wherein the rear substrate comprises:

a second pad part electrically connected to the routing line of the routing portion to overlap the first pad part; and a third pad part electrically connected to the second pad part and connected to the driving circuit unit.

22. The multi-screen display apparatus of claim 19, wherein an outermost pixel of the plurality of pixels comprises the plurality of pads, or wherein the plurality of pixels are arranged on the substrate to have a pixel pitch in the first direction and the second direction transverse to the first direction, and an interval between a center portion of the outermost pixel and the outer surface of the substrate is equal to or less than half of the pixel pitch.

* * * * *